US012035621B2

(12) United States Patent
Kang et al.

(10) Patent No.: US 12,035,621 B2
(45) **Date of Patent: *Jul. 9, 2024**

(54) LIGHT-EMITTING DEVICE AND ELECTRONIC APPARATUS INCLUDING THE SAME

(71) Applicant: Samsung Display Co., Ltd., Yongin-si (KR)

(72) Inventors: Namsu Kang, Yongin-si (KR); Minkyung Kim, Yongin-si (KR); Minho Park, Yongin-si (KR); Huiju Park, Yongin-si (KR); Dongkyu Lee, Yongin-si (KR); Jongwon Lee, Yongin-si (KR); Hyunshik Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/988,899

(22) Filed: Nov. 17, 2022

(65) Prior Publication Data

US 2023/0116749 A1 Apr. 13, 2023

Related U.S. Application Data

(63) Continuation of application No. 17/391,613, filed on Aug. 2, 2021, now Pat. No. 11,527,722.

(30) Foreign Application Priority Data

Aug. 20, 2020 (KR) ........................ 10-2020-0104811

(51) Int. Cl.
*H10K 85/60* (2023.01)
*H10K 50/11* (2023.01)
(Continued)

(52) U.S. Cl.
CPC ......... *H10K 85/633* (2023.02); *H10K 85/342* (2023.02); *H10K 85/346* (2023.02);
(Continued)

(58) Field of Classification Search
None
See application file for complete search history.

(56) References Cited

U.S. PATENT DOCUMENTS 8,860,013 B2 10/2014 Okamoto
9,281,487 B2 3/2016 Kim et al.
(Continued)

FOREIGN PATENT DOCUMENTS

KR 10-2014-0034686 3/2014
KR 10-2015-0015647 2/2015
(Continued)

OTHER PUBLICATIONS

English Language Specification of U.S. Appl. No. 17/285,753.

*Primary Examiner* — Vu A Nguyen
(74) *Attorney, Agent, or Firm* — KILE PARK REED & HOUTTEMAN PLLC

(57) ABSTRACT

A light-emitting device includes a first electrode, a second electrode facing the first electrode, and an interlayer disposed between the first electrode and the second electrode. The emission layer includes a first emission layer and a second emission layer. The first emission layer includes a first compound, and the second emission layer includes a second compound. The first compound includes at least one deuterium (D), and the second compound does not include deuterium. An electronic apparatus including the light-emitting device is also provided.

20 Claims, 8 Drawing Sheets

(51) Int. Cl.

| | |
|---|---|
| ***H10K 50/12*** | (2023.01) |
| ***H10K 50/15*** | (2023.01) |
| ***H10K 85/30*** | (2023.01) |
| ***H10K 101/10*** | (2023.01) |
| ***H10K 101/40*** | (2023.01) |

(52) U.S. Cl.

CPC ......... *H10K 85/348* (2023.02); *H10K 85/622* (2023.02); *H10K 85/623* (2023.02); *H10K 85/624* (2023.02); *H10K 85/626* (2023.02); *H10K 85/636* (2023.02); *H10K 85/654* (2023.02); *H10K 85/6572* (2023.02); *H10K 85/6574* (2023.02); *H10K 85/6576* (2023.02); *H10K 50/11* (2023.02); *H10K 50/12* (2023.02); *H10K 50/15* (2023.02); *H10K 2101/10* (2023.02); *H10K 2101/40* (2023.02)

(56) References Cited

U.S. PATENT DOCUMENTS

| | | | | |
|---|---|---|---|---|
| 9,425,422 | B2 | 8/2016 | Kim et al. | |
| 10,680,195 | B2 | 6/2020 | Kim et al. | |
| 10,840,470 | B2 | 11/2020 | Takahashi et al. | |
| 11,527,722 | B2 * | 12/2022 | Kang | H10K 85/626 |
| 2016/0190500 | A1 | 6/2016 | Watabe et al. | |
| 2019/0305227 | A1 | 10/2019 | Yoon et al. | |

FOREIGN PATENT DOCUMENTS

| | | |
|---|---|---|
| KR | 10-2017-0106564 | 9/2017 |
| KR | 10-2019-0113498 | 10/2019 |
| KR | 10-2019-0114795 | 10/2019 |
| KR | 10-2019-0127272 | 11/2019 |
| KR | 10-2020-0010122 | 1/2020 |
| KR | 10-2066090 | 1/2020 |
| KR | 10-2020-0034649 | 3/2020 |
| KR | 10-2020-0081983 | 7/2020 |
| KR | 10-2020-0081984 | 7/2020 |
| KR | 10-2020-0081985 | 7/2020 |
| KR | 10-2020-0081986 | 7/2020 |
| KR | 10-2020-0095429 | 8/2020 |
| WO | 2013077405 | 5/2013 |
| WO | 2019206292 | 10/2019 |
| WO | 2020080417 | 4/2020 |

* cited by examiner

LIGHT-EMITTING DEVICE AND ELECTRONIC APPARATUS INCLUDING THE SAME

CROSS-REFERENCE TO RELATED APPLICATION(S)

This is a continuation application of U.S. patent application Ser. No. 17/391,613, filed Aug. 2, 2021 (now pending), the disclosure of which is incorporated herein by reference in its entirety. U.S. patent application Ser. No. 17/391,613 claims priority to and benefits of Korean Patent Application No. 10-2020-0104811 under 35 U.S.C. § 119, filed on Aug. 20, 2020 in the Korean Intellectual Property Office, the entire contents of which are incorporated herein by reference.

BACKGROUND

1. Technical Field

Embodiments relate to a light-emitting device and an electronic apparatus including the same.

2. Description of the Related Art

Light-emitting devices are self-emission devices that have a wide viewing angle, a high contrast ratio, and a short response time, and show excellent characteristics in terms of luminance, driving voltage, and response speed.

In a light-emitting device, a first electrode is disposed on a substrate, and a hole transport region, an emission layer, an electron transport region, and a second electrode are sequentially formed on the first electrode. Holes injected from the first electrode pass through the hole transport region to the emission layer, and electrons injected from the second electrode pass through the electron transport region to the emission layer. Carriers, such as holes and electrons, recombine in the emission layer to produce excitons. These excitons transition from an excited state to a ground state to thereby generate light.

SUMMARY

Embodiments include a light-emitting device having high efficiency and a long lifespan by using a double emission layer that includes a deuterium-substituted host and a deuterium-unsubstituted host.

Additional aspects will be set forth in part in the description which follows and, in part, will be apparent from the description, or may be learned by practice of the embodiments of the disclosure.

According to embodiments, a light-emitting device may include a first electrode, a second electrode facing the first electrode, and an interlayer disposed between the first electrode and the second electrode and including an emission layer, wherein the emission layer may include a first emission layer including a first compound, and a second emission layer including a second compound, the first compound includes at least one deuterium (D), and the second compound does not include deuterium.

In an embodiment, the second emission layer may be disposed between the first emission layer and the second electrode, or the second emission layer may be disposed between the first electrode and the first emission layer.

In an embodiment, at least one of the first emission layer and the second emission layer may further include at least one dopant.

In an embodiment, the first emission layer may include a first dopant, the second emission layer may include a second dopant, and the first dopant and the second dopant may be identical to or different from each other.

In an embodiment, the dopant may include a phosphorescent dopant, a fluorescent dopant, a delayed fluorescence material, or any combination thereof.

In an embodiment, at least one of the first emission layer and the second emission layer may emit blue light with a maximum luminescence wavelength in a range of about 440 nm to about 510 nm.

In an embodiment, the interlayer may further include a hole transport region disposed between the first electrode and the emission layer, and an electron transport region disposed between the emission layer and the second electrode. The hole transport region may include a hole injection layer, a hole transport layer, or any combination thereof. The electron transport region includes a buffer layer, a hole blocking layer, an electron transport layer, an electron injection layer, or any combination thereof.

In an embodiment, the hole transport region may include a hole transport layer that contacts the emission layer. A highest occupied molecular orbital (HOMO) energy level of the hole transport layer may be in a range of about −5.5 eV to about −5.25 eV.

In an embodiment, the light-emitting device may further include at least one of a first capping layer disposed outside the first electrode and a second capping layer disposed outside the second electrode. At least one of the first capping layer and the second capping layer may include a material having a refractive index greater than or equal to about 1.6 at a wavelength of 589 nm.

According to embodiments, a light-emitting device may include a first electrode, a second electrode facing the first electrode, m emitting units disposed between the first electrode and the second electrode, and m−1 charge generation layers disposed between two neighboring ones of the m emitting units and including an n-type charge generation layer and a p-type charge generation layer, wherein m may be an integer of 2 or more, the m emitting units may each include a hole transport region, an emission layer, and an electron transport region, at least one emission layer of the m emitting units may include a first emission layer including a first compound, and a second emission layer including a second compound, the first compound may include at least one deuterium (D), and the second compound may not include deuterium.

In an embodiment, m may be 3 or more.

In an embodiment, two or more emission layers of the m emitting units may each include a first emission layer and a second emission layer. The two or more emission layers may each independently include a first emission layer and a second emission layer disposed between the first emission layer and the second electrode, or a first emission layer and a second emission layer disposed between the first electrode and the first emission layer.

In an embodiment, a maximum luminescence wavelength of light emitted from at least one light-emitting unit of the m light-emitting units may be different from a maximum emission wavelength of light emitted from at least one light-emitting unit of the remaining light-emitting units.

In an embodiment, light emitter from each of them light emitting units may have a same maximum luminescence wavelength.

In an embodiment, the at least one emission layer of the m emitting units including the first emission layer and the second emission layer may emit blue light having a maximum luminescence wavelength in a range of about 440 nm to about 510 nm.

According to embodiments, an electronic apparatus may include the light-emitting device.

In an embodiment, the electronic apparatus may further include a sealing portion disposed on the light-emitting device, and a functional layer disposed on the sealing portion, the functional layer including a touch screen layer, a polarizing layer, a color filter, a color conversion layer, or any combination thereof.

In an embodiment, the electronic apparatus may further include a quantum dot or an optical member including the quantum dot. The quantum dot or the optical member including the quantum dot may be disposed on at least one traveling direction of light emitted from the light-emitting device.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
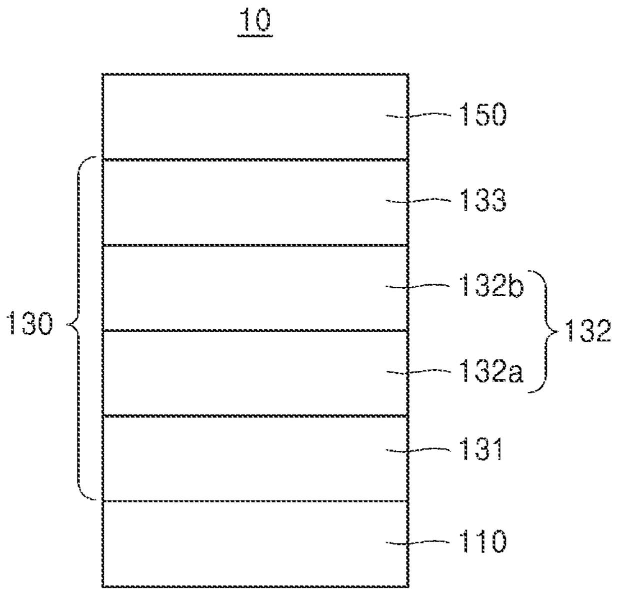
FIG. 1 shows a schematic cross-sectional view of a light-emitting device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

Sizes of elements in the drawings may be exaggerated for convenience of explanation. Therefore, as the sizes and thicknesses of components in the drawings may be arbitrarily illustrated for convenience of explanation, the following embodiments of the disclosure are not limited thereto.

As used herein, the expressions used in the singular such as “a,” “an,” and “the” are intended to include the plural forms as well, unless the context clearly indicates otherwise.

It should be understood that the terms “comprises,” “comprising,” “includes,” “including,” “have,” “having,” “contains,” “containing,” and the like are intended to specify the presence of stated features, integers, steps, operations, elements, components, or combinations thereof in the disclosure, but do not preclude the presence or addition of one or more other features, integers, steps, operations, elements, components, or combinations thereof.

In the description, it will be understood that when an element (a region, a layer, a section, or the like) is referred to as being “on”, “connected to” or “coupled to” another element, it can be directly on, connected or coupled to the other element, or one or more intervening elements may be disposed therebetween.

As used herein, the term “and/or” includes any and all combinations of one or more of the associated listed items. For example, “A and/or B” may be understood to mean “A, B, or A and B.” The terms “and” and “or” may be used in the conjunctive or disjunctive sense and may be understood to be equivalent to “and/or”.

The term “at least one of” is intended to include the meaning of “at least one selected from” for the purpose of its meaning and interpretation. For example, “at least one of A and B” may be understood to mean “A, B, or A and B.” When preceding a list of elements, the term, “at least one of,” modifies the entire list of elements and does not modify the individual elements of the list.

It will be understood that, although the terms “first”, “second”, etc. may be used herein to describe various elements, these elements should not be limited by these terms. These terms are only used to distinguish one element from another. For example, a first element could be termed a second element, and, similarly, a second element could be termed a first element, without departing from the scope of the embodiments of the inventive concept.

The terms “below,” “lower,” “above,” “upper,” and the like are used to describe the relationship of the configurations shown in the drawings. The terms are used as a relative concept and are described with reference to the direction indicated in the drawings.

The terms “about” or “approximately” as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, “about” may mean within one or more standard deviations, or within ±20%, 10%, or 5% of the stated value.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

According to an aspect of the disclosure, a light-emitting device may include a first electrode, a second electrode facing the first electrode, and an interlayer disposed between the first electrode and the second electrode. The emission layer may include a first emission layer and a second emission layer. The first emission layer may include a first compound, and the second emission layer may include a second compound. The first compound may include at least one deuterium (D), and the second compound may not include deuterium.

In the specification, a method of measuring the highest occupied molecular orbital (HOMO) energy level may refer to a description below, but is not limited thereto.

The HOMO energy level is measured using cyclic voltammetry, and a cyclic voltammetry apparatus used herein is the model name ZIVE SP2 available from Wonatech. In this regard, respective sample solutions and electrolytic solutions used herein are as follows, and ferrocene was used as the reference material, and $(Bu)_4NPF_6$ was used as the electrolyte:

Sample solution of the compound to be measured: $5\times10^{-3}$ M dichloromethane solution Ferrocene sample solution: $5\times10^{-3}$ M dichloromethane solution $(Bu)_4NPF_6$ electrolytic solution: 0.1 M acetonitrile solution An $E_{we}$-I relationship graph of compounds to be measured and a reference material is obtained, and, at the point where the current rapidly increases in the graph, the voltage at the point where the tangent lines meet the x-axis is recorded. The HOMO energy level of ferrocene is set to −4.8 eV and the HOMO energy level of a compound to be measured is calculated.

Figure 2:
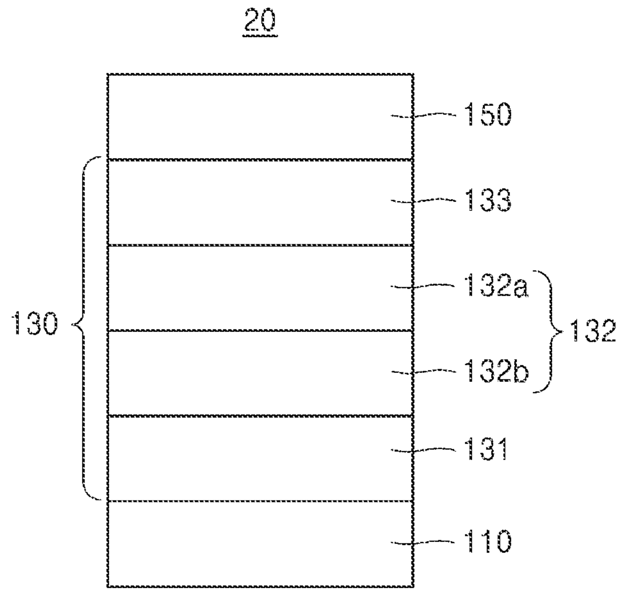
FIGS. 2 to 6 each show a schematic cross-sectional view of a light-emitting device according to an embodiment.

FIGS. 1 and 2 are each a schematic cross-sectional view of a light-emitting device 10 or 20 according to an embodiment. Referring to FIGS. 1 and 2, the light-emitting device 10 or 20 according to an embodiment includes a first electrode 110, a second electrode 150 facing the first electrode 110, and an interlayer 130 disposed between the first electrode 110 and the second electrode 150 and including an emission layer 132, wherein the emission layer 132 includes a first emission layer 132*a* and a second emission layer 132*b*, the first emission layer 132*a* includes a first compound, the second emission layer 132*b* includes a second compound, the first compound includes at least one deuterium (D), and the second compound does not include deuterium.

In this regard, as illustrated in FIG. 1, the first emission layer 132*a* may be located near the first electrode 110, and the second emission layer 132*b* may be located near the second electrode 150, or as illustrated in FIG. 2, the second emission layer 132*b* may be located near the first electrode 110, and the first emission layer 132*a* may be located near the second electrode 150.

In an embodiment, the first emission layer 132*a* may be located between the first electrode 110 and the second electrode 150, and the second emission layer 132*b* may be located between the first emission layer 132*a* and the second electrode 150 (FIG. 1), or the first emission layer 132*a* may be located between the first electrode 110 and the second electrode 150, and the second emission layer 132*b* may be located between the first electrode 110 and the first emission layer 132*a* (FIG. 2).

In an embodiment, at least one of the first emission layer 132*a* and the second emission layer 132*b* may further include one or more dopants.

In an embodiment, the first emission layer 132*a* includes a first dopant, the second emission layer 132*b* includes a second dopant, and the first dopant and the second dopant may be identical to or different from each other.

In an embodiment, the first dopant and second dopant may be identical to each other, but are not limited thereto.

In this regard, the dopant may include a phosphorescent dopant, a fluorescent dopant, a delayed fluorescence material, or any combination thereof.

In an embodiment, the first dopant and the second dopant may each be a fluorescent dopant, but are not limited thereto. In an embodiment, the first dopant may be a phosphorescent dopant and the second dopant may be a phosphorescent dopant, the first dopant may be a phosphorescent dopant and the second dopant may be a fluorescent dopant, the first dopant may be a phosphorescent dopant and the second dopant may be a delayed fluorescence material, the first dopant may be a fluorescent dopant and the second dopant may be a phosphorescent dopant, the first dopant may be a fluorescent dopant and the second dopant may be a delayed fluorescence material, the first dopant may be a delayed fluorescence material and the second dopant may be a phosphorescent dopant, the first dopant may be a delayed fluorescence material and the second dopant may be a fluorescent dopant, and the first dopant may be a delayed fluorescence material, and the second dopant may be a delayed fluorescence material.

In an embodiment, at least one of the first emission layer 132*a* and the second emission layer 132*b* may emit blue light having a maximum luminescence wavelength in a range of about 440 nm to about 510 nm.

In an embodiment, the first compound may be represented by Formula 1:

$$[Ar_1]_{b1}\text{-}[(L_1)_{a1}\text{-}R_1]_{c1} \quad \text{[Formula 1]}$$

wherein, in Formula 1, $Ar_1$ and $L_1$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, b1 may be 1, 2, or 3, a1 may be an integer from 0 to 5, $R_1$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, c1 may be an integer from 1 to 5, $R_{10a}$ may be deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, and Formula 1 may include at least one deuterium.

For example, at least one of $Ar_1$, $L_1$, and $R_1$ of Formula 1 may be a $C_3$-$C_{60}$ carbocyclic group, and at least one $C_3$-$C_{60}$ carbocyclic group may be substituted with deuterium.

For example, at least one of $Ar_1$, $L_1$, and $R_1$ of Formula 1 may be a benzene group, a naphthalene group, a phenanthrene group, or an anthracene group, and at least one of a benzene group, a naphthalene group, a phenanthrene group, and an anthracene group may be substituted with at least one deuterium.

In an embodiment, the first compound may include two or more deuterium. For example, the first compound may include three or more deuterium. For example, the first compound may include four or more deuterium.

For example, the first compound may be selected from Compounds 1 to 10, but embodiments of the disclosure are not limited thereto:

1

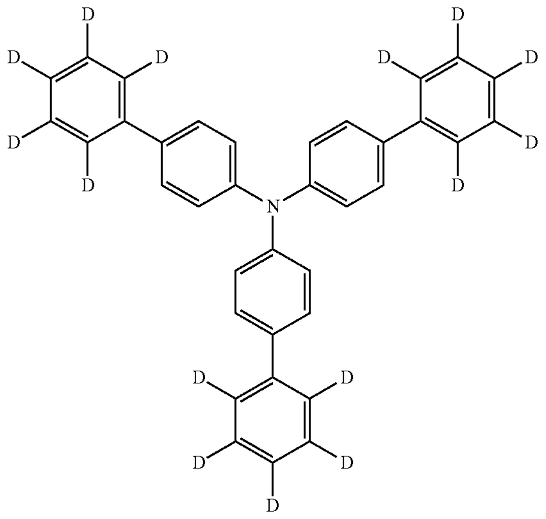

-continued

2

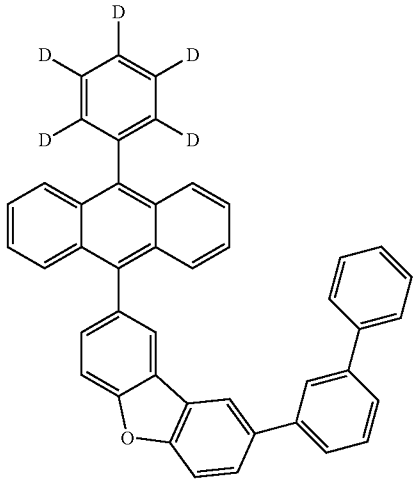

3

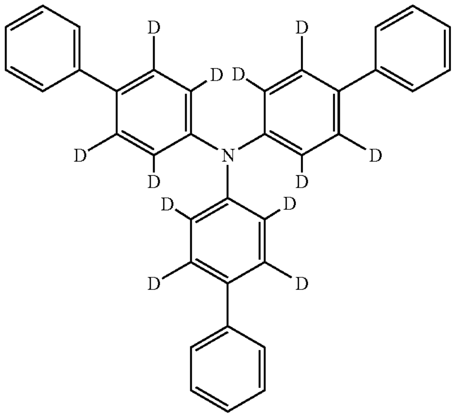

4

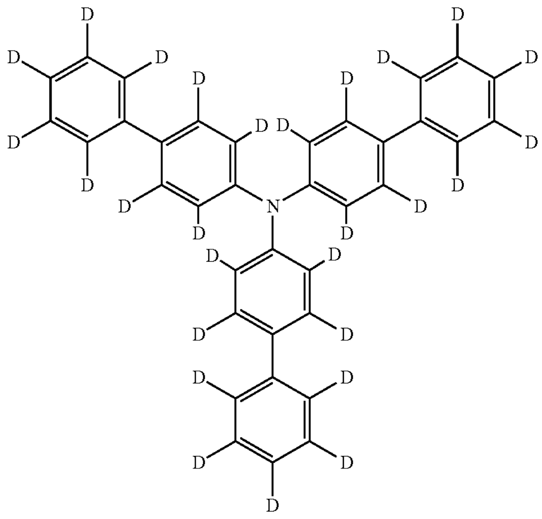

-continued

5

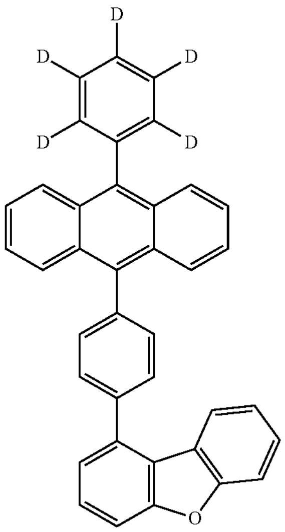

6

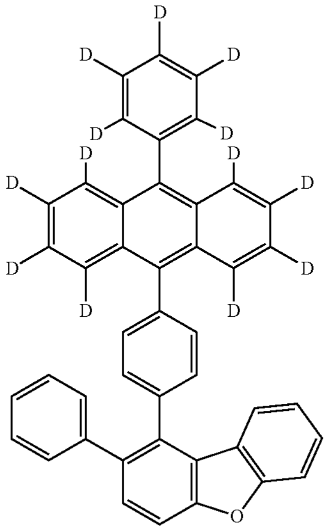

7

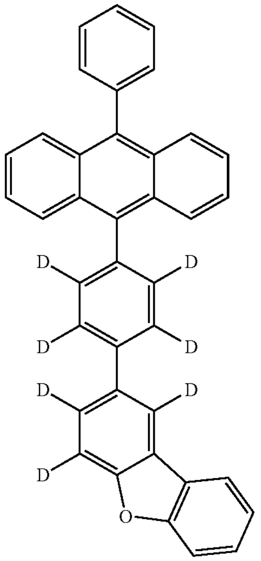

-continued

8

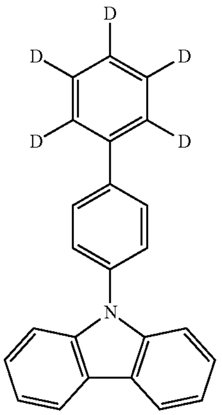

9

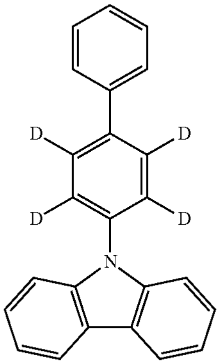

10

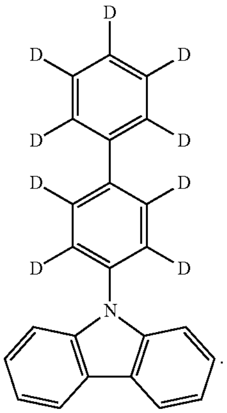

In an embodiment, the second compound may be represented by Formula 2:

$[Ar_2]_{b2}$-$[(L_2)_{a2}$-$R_2]_{c2}$ [Formula 2]

wherein, in Formula 2, $Ar_2$ and $L_2$ may each independently be a $C_3$-$C_{60}$ carbocyclic group unsubstituted or substituted with at least one $R_{20a}$ or a $C_1$-$C_{60}$ heterocyclic group unsubstituted or substituted with at least one $R_{20a}$, b2 may be 1, 2, or 3, a2 may be an integer from 0 to 5, $R_2$ may be hydrogen, —F, —Cl, —Br, —I, a hydroxyl group, a cyano group, a nitro group, a $C_1$-$C_{60}$ alkyl group unsubstituted or substituted with at least one $R_{20a}$, a $C_2$-$C_{60}$ alkenyl group unsubstituted or substituted with at least one $R_{20a}$, a $C_2$-$C_{60}$ alkynyl group unsubstituted or substituted with at least one $R_{20a}$, a $C_1$-$C_{60}$ alkoxy group unsubstituted or substituted with at least one $R_{20a}$, a $C_3$-$C_{60}$ carbocyclic group unsubstituted or substituted with at least one $R_{20a}$, a $C_1$-$C_{60}$ heterocyclic group unsubstituted or substituted with at least one $R_{20a}$, —$Si(Q_{41})(Q_{42})(Q_{43})$, —$N(Q_{41})(Q_{42})$, —$B(Q_{41})(Q_{42})$, —$C(=O)(Q_{41})$, —$S(=O)_2(Q_{41})$, or —$P(=O)(Q_{41})(Q_{42})$, c2 may be an integer from 1 to 5, $R_{20a}$ may be —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or $C_1$-$C_{60}$ alkoxy group, each unsubstituted or substituted with —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{51})(Q_{52})(Q_{53})$, —$N(Q_{51})(Q_{52})$, —$B(Q_{51})(Q_{52})$, —$C(=O)(Q_{51})$, —$S(=O)_2(Q_{51})$, —$P(=O)(Q_{51})(Q_{52})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{61})(Q_{62})(Q_{63})$, —$N(Q_{61})(Q_{62})$, —$B(Q_{61})(Q_{62})$, —$C(=O)(Q_{61})$, —$S(=O)_2(Q_{61})$, —$P(=O)(Q_{61})(Q_{62})$, or any combination thereof; or —$Si(Q_{71})(Q_{72})(Q_{73})$, —$N(Q_{71})(Q_{72})$, —$B(Q_{71})(Q_{72})$, —$C(=O)(Q_{71})$, —$S(=O)_2(Q_{71})$, or —$P(=O)(Q_{71})(Q_{72})$, wherein $Q_{41}$ to $Q_{43}$, $Q_{51}$ to $Q_{53}$, $Q_{61}$ to $Q_{63}$, and $Q_{71}$ to $Q_{73}$ may each independently be: hydrogen; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, unsubstituted or substituted with —F, a cyano group, a $C_1$-$C_{60}$ alkyl group, a $C_1$-$C_{60}$ alkoxy group, a phenyl group, a biphenyl group, or any combination thereof, and Formula 2 does not include deuterium.

For example, the second compound may be selected from Compound A to Compound C, but embodiments of the disclosure are not limited thereto:

A

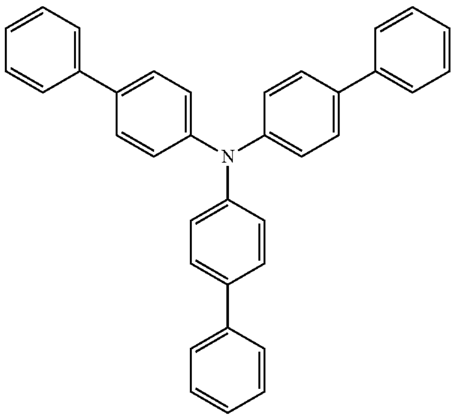

-continued

B

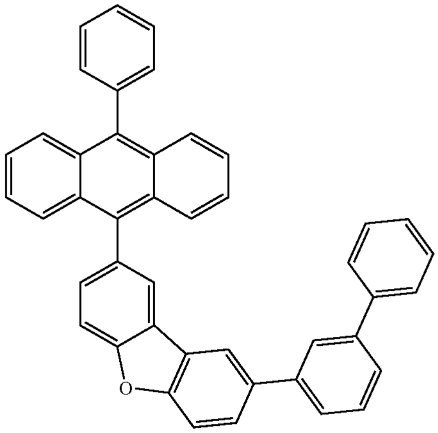

C

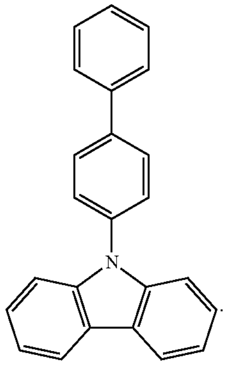

In an embodiment, the first compound may have a structure in which one or more deuterium are substituted in the second compound.

According to another embodiment, the first compound may differ from the structure in which one or more deuterium are substituted in the second compound.

In an embodiment, the interlayer 130 may further include a hole transport region 131 disposed between the first electrode 110 and the emission layer 132 and an electron transport region 133 located between the emission layer 132 and the second electrode 150, the hole transport region 131 may include a hole injection layer, a hole transport layer, or any combination thereof, and the electron transport region 133 may include a buffer layer, a hole blocking layer, an electron transport layer, an electron injection layer, or any combination thereof.

The hole transport region 131 may include a hole transport layer (not shown) that contacts the emission layer 132, and a highest occupied molecular orbital (HOMO) energy level of the hole transport layer may be in a range of about −5.5 eV to about −5.25 eV.

The hole transport region 131 may not include a separate layer between the emission layer 132 and the hole transport layer, and may not include an electron blocking layer.

The hole transport region 131 may include a hole transport layer and a hole injection layer located between the hole transport layer and the first electrode 110.

In an embodiment, the light-emitting device 10 or 20 may further include at least one of a first capping layer (not shown) disposed outside the first electrode 110 and a second capping layer (not shown) disposed outside the second electrode 150, At least one of the first capping layer and the second capping layer may include a material having a refractive index equal to or greater than about 1.6 at a wavelength of 589 nm.

In relation to the detailed descriptions of the hole transport region 131, the electron transport region 133, the first capping layer, and the second capping layer, those described later in this specification will be referred to.

According to another aspect, a light-emitting device may include a first electrode, a second electrode facing the first electrode, m emitting units disposed between the first electrode and the second electrode, and m−1 charge generation layers located between two neighboring ones of the m emitting units and including an n-type charge generation layer and a p-type charge generation layer, wherein m is an integer of 2 or more. The m emitting units may each include a hole transport region, an emission layer, and an electron transport region, at least one emission layer of the m emitting units may include a first emission layer and a second emission layer, the first emission layer may include a first compound, the second emission layer may include a second compound, the first compound may include at least one deuterium, and the second compound may not include deuterium. In an embodiment, the m emitting units may each include the hole transport region, the emission layer, and the electron transport region disposed in the stated order.

FIGS. 3 to 6 each respectively illustrate a schematic cross-sectional view of light-emitting devices 30, 40, 50, and 60 according to an embodiment. Referring to FIGS. 3 to 6, each of the light-emitting devices 30, 40, 50, and 60 according to an embodiment includes: a first electrode 110, a second electrode 150 facing the first electrode, m emitting units 130-1, 130-2, and 130-*m* located between the first electrode 110 and the second electrode 150, and m−1 charge generation layers 134-1 . . . 134-*m*−1 located between two neighboring emitting units from among m emitting units 130-1, 130-2, . . . 130-*m*, and each including n-type charge generation layers 134*a*-1 . . . 134*a*-*m*−1 and p-type charge generation layers 134*b*-1 . . . 134*b*-*m*−1.

An emitting unit herein is not particularly limited as long as the emitting unit has a function capable of emitting light. In an embodiment, an emitting unit may include one or more emission layers. When needed, the emitting unit may further include an organic layer other than the emission layer.

Each of the light-emitting devices 30, 40, 50, and 60 may include m stacked emitting units 130-1, 130-2, . . . 130-*m*, and m may be an integer of 2 or more. For example, m may be 3 or more. The number of the emitting units, m, may vary according to the purpose, and the upper limit of the number is not particularly limited. In an embodiment, the light-emitting device may include 2, 3, 4, 5, or 6 emitting units.

Each of the light-emitting devices 30, 40, 50, and 60 includes charge generation layers 134-1 . . . 134-*m*−1 between two neighboring emitting units from among m emitting units 130-1, 130-2, . . . 130-*m*, and the "neighboring" refers to the location relationship of the closest layers from among the layers described as being "neighboring". In an embodiment, the "two neighboring emitting units" refers to the location relationship of two emitting units located closest to each other from among emitting units. The term "neighboring" may refer to a case where two layers physically contact each other, and a case where another layer, not mentioned, may be located between the two layers. For example, the "emitting unit neighboring to a second electrode" refers to an emitting unit located closest to the second electrode. Also, the second electrode and the emitting unit may physically contact each other. In an embodiment, however, layers other than the emitting unit may be located between the second electrode and the emitting unit. In an embodiment, an electron transport layer may be located between the second electrode and the emitting unit. However, a charge generation layer may be located between two neighboring emitting units.

The "charge generation layer" may generate electrons with respect to one emitting unit of two neighboring emitting units and thus acts as a cathode, and may generate holes with respect to the other emitting unit and thus acts as an anode. The charge generation layer is not directly connected to an electrode, and may separate neighboring emitting units. A light-emitting device including m emitting units may include m−1 charge generation layers.

Each of the charge generation layers 134-1 . . . 134-*m*−1 may include n-type charge generation layers 134*a*-1 . . . 134*a*-*m*−1 and p-type charge generation layers 134*b*-1 . . . 134*b*-*m*−1. In this regard, the n-type charge generation layers 134*a*-1 . . . 134*a*-*m*−1 may directly contact p-type charge generation layers 134*b*-1 . . . 134*b*-*m*−1 to form an NP junction. Due to the NP junction, electrons and holes may simultaneously be generated between n-type charge generation layers 134*a*-1 . . . 134*a*-*m*−1 and p-type charge generation layers 134*b*-1 . . . 134*b*-*m*−1. The generated electrons may be delivered to one of two neighboring emitting units through n-type charge generation layers 134*a*-1 . . . 134*a*-*m*−1. The generated holes may be delivered to the other one of two neighboring emitting units through p-type charge generation layers 134*b*-1 . . . 134*b*-*m*−1. Each of the charge generation layers 134-1 . . . 134-*m*−1 may include one of n-type charge generation layers 134*a*-1 . . . 134*a*-*m*−1 and one of p-type charge generation layers 134*b*-1 . . . 134*b*-*m*−1, so that the light-emitting devices 30, 40, 50, and 60 including m−1 charge generation layers 134-1 . . . 134-*m*−1 may each include m−1 n-type charge generation layers 134*a*-1 . . . 134*a*-*m*−1 and m−1 p-type charge generation layers 134*b*-1 . . . 134*b*-*m*−1.

The n-type refers to n-type semiconductor characteristics, for example, the characteristics of injecting or transporting electrons. The p-type refers to p-type semiconductor characteristics, that is, the characteristics of injecting or transporting holes.

A n-type charge-generation material included in the n-type charge generation layers 134*a*-1 . . . 134*a*-*m*−1 may be understood with reference to the description of the electron transport region 133 in the specification, and a p-type charge-generation material included in the p-type charge generation layers 134*b*-1 . . . 134*b*-*m*−1 may be understood with reference to the description of the hole transport region 131 in the specification.

The m emitting units 130-1, 130-2, . . . 130-*m* may each include hole transport regions 131-1, 131-2, . . . 131-*m*, emission layers 132-1, 132-2, . . . 132-*m*, and electron transport regions 133-1, 133-2, . . . 133-*m*, and m hole transport regions 131-1, 131-2, . . . 131-*m* included in them emitting units 130-1, 130-2, . . . 130-*m* may each include a hole transport material, and m electron transport regions 133-1, 133-2, . . . 133-*m* included in the m emitting units 130-1, 130-2, . . . 130-*m* may each include an electron transport material.

In this regard, hole transport materials included in the m hole transport regions 131-1, 131-2, . . . 131-*m* may be identical to or different from each other. In this regard, electron transport materials included in the m electron transport regions 133-1, 133-2, . . . 133-*m* may be identical to or different from each other.

At least one of m emission layers 132-1, 132-2, . . . 132-*m* of them emitting units may include first emission layers 132*a*-1, 132*a*-2, . . . 132*a*-*m* and second emission layers 132*b*-1, 132*b*-2, . . . 132*b*-*m*. The first emission layers 132*a*-1, 132*a*-2, . . . 132*a*-*m* may each include a first compound, and the second emission layers 132*b*-1, 132*b*-2, . . . 132*b*-*m* may each include a second compound. The first compound may include at least one deuterium (D), and the second compound may not include deuterium.

The first emission layers 132*a*-1, 132*a*-2, . . . 132*a*-*m*, the second emission layers 132*b*-1, 132*b*-2, . . . 132*b*-*m*, the first compound, and the second compound may be the same as described above.

Although not illustrated in FIGS. 3 to 6, the stack order of the first emission layers 132*a*-1, 132*a*-2, . . . 132*a*-*m* and second emission layers 132*b*-1, 132*b*-2, . . . 132*b*-*m* may be changed. In an embodiment, the second emission layers 132*b*-1, 132*b*-2, . . . 132*b*-*m* may be located near the first electrode 110, and the first emission layers 132*a*-1, 132*a*-2, . . . 132*a*-*m* may be located near the second electrode 150.

In an embodiment, at least one of the emission layers 132-1, 132-2, . . . 132-*m*, of them emitting units may include a first emission layer 132*a*-1, 132*a*-2, . . . 132*a*-*m* and a second emission layer 132*b*-1, 132*b*-2, . . . 132*b*-*m*. The first emission layers 132*a*-1, 132*a*-2, . . . 132*a*-*m* may be located between the first electrode 110 and the second electrode 150, and the second emission layers 132*b*-1, 132*b*-2, . . . 132*b*-*m* may be located between the first emission layers 132*a*-1, 132*a*-2, . . . 132*a*-*m* and the second electrode 150 (FIGS. 3 to 6), or a first emission layer may be located between the first electrode 110 and the second electrode 150 and a second emission layer may be located between the first electrode and the first emission layer (not shown).

In one embodiment, m may be an integer from 3 or more.

In one embodiment, two or more of them emission layers 132-1, 132-2, . . . 132-*m* of the m emitting units may each include the first emission layers 132*a*-1, 132*a*-2, . . . 132*a*-*m* and the second emission layers 132*b*-1, 132*b*-2, . . . 132*b*-*m*, and the two or more emission layers may each independently include the first emission layers 132*a*-1, 132*a*-2, . . . 132*a*-*m* located between the first electrode 110 and the second electrode 150 and the second emission layers 132*b*-1, 132*b*-2, . . . 132*b*-*m* located between the first emission layers 132*a*-1, 132*a*-2, . . . 132*a*-*m* and the second electrode 150, or a first emission layer located between the first electrode 110 and the second electrode 150 and a second emission layer located between the first electrode and the first emission layer (not shown).

Figure 3:
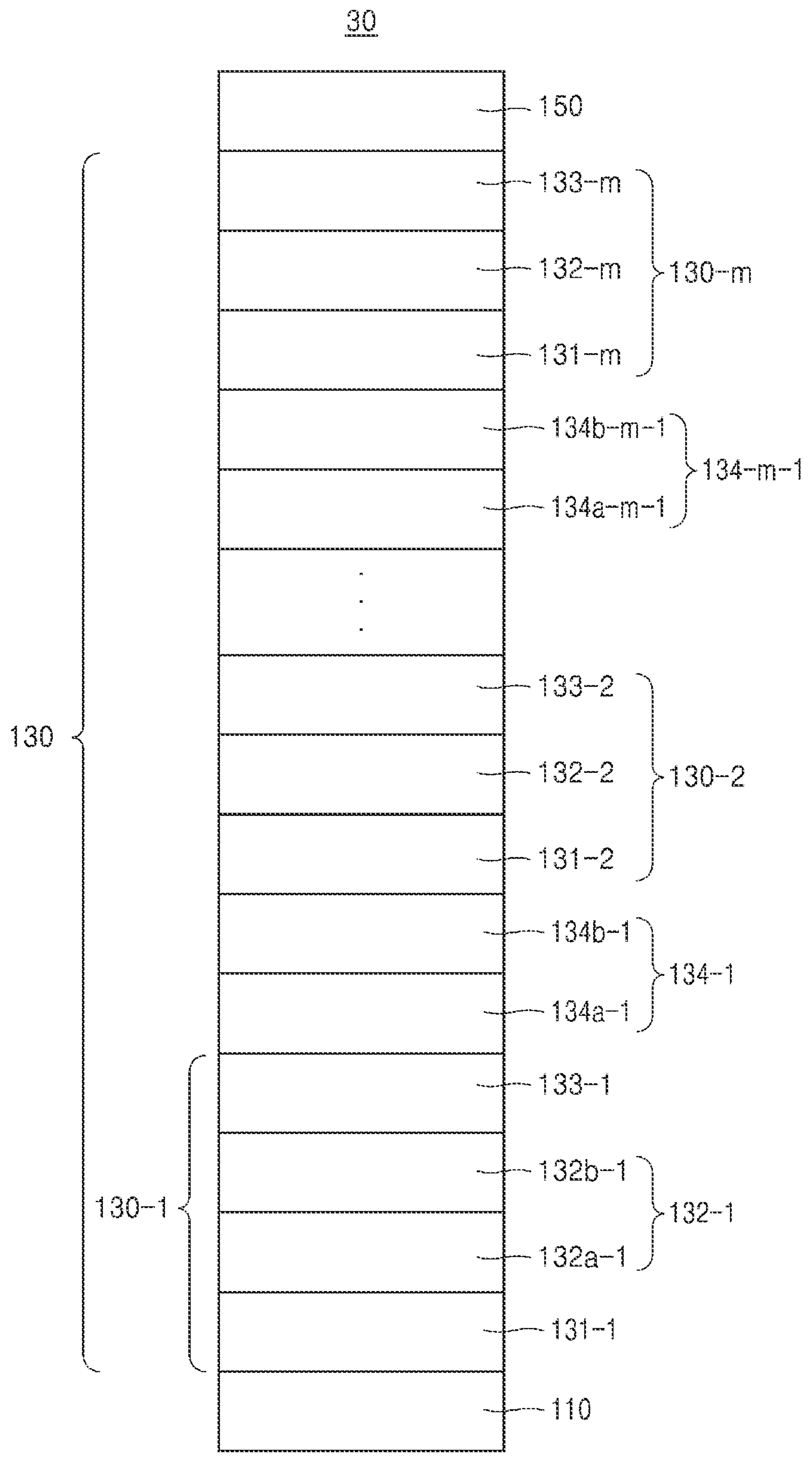
Figure 4:
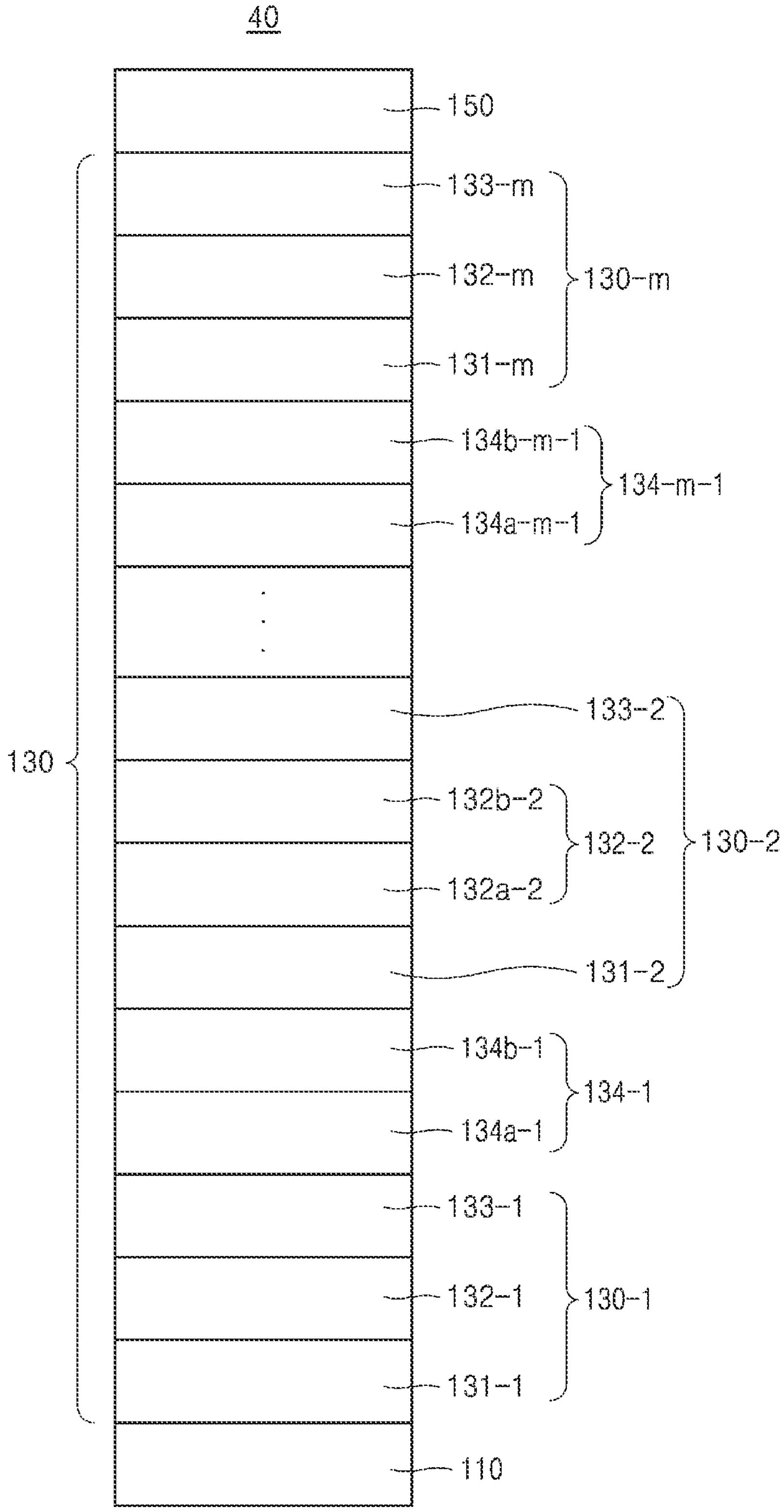
Figure 5:
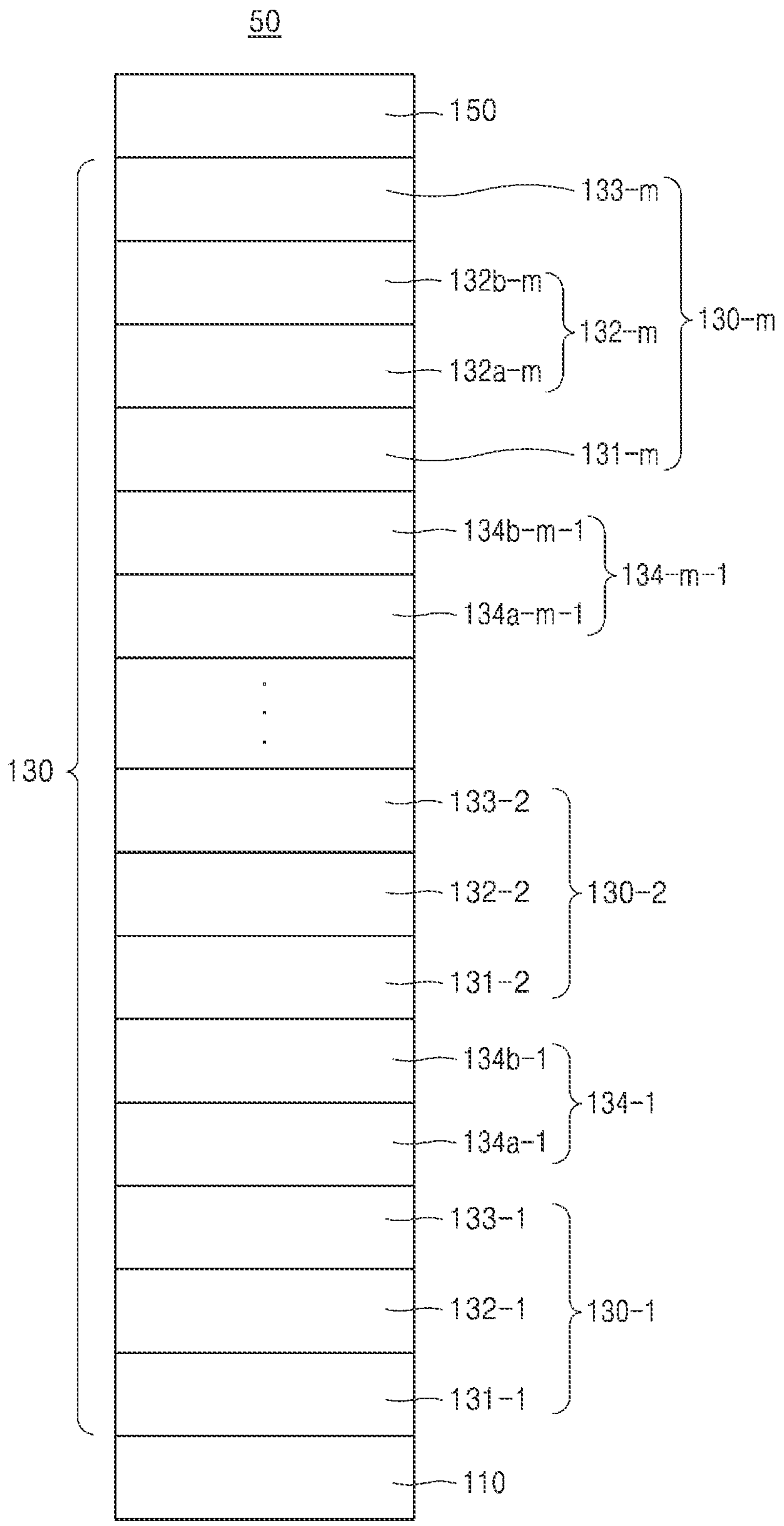

Referring to FIGS. 3 to 5, only one emission layer of m emitting units 130-1, 130-2, . . . 130-*m* of the light-emitting devices 30, 40, and 50 may include a first emission layer 132*a*-1, 132*a*-2, . . . 132*a*-*m* and a second emission layer 132*b*-1, 132*b*-2, . . . 132*b*-*m*.

In an embodiment, as illustrated in FIG. 3, the emission layer 132-1 of the emitting unit 130-1 neighboring the first electrode 110 may include the first emission layer 132*a*-1 and the second emission layer 132*b*-1.

In an embodiment, as illustrated in FIG. 4, the emission layer 132-2 of the emitting unit 130-2 not neighboring the first electrode 110 and the second electrode 150 may include the first emission layer 132*a*-2 and the second emission layer 132*b*-2.

In an embodiment, as illustrated in FIG. 5, the emission layer 132-*m* of the emitting unit 130-*m* neighboring the second electrode 150 may include the first emission layer 132*a*-*m* and the second emission layer 132*b*-*m*.

Figure 6:
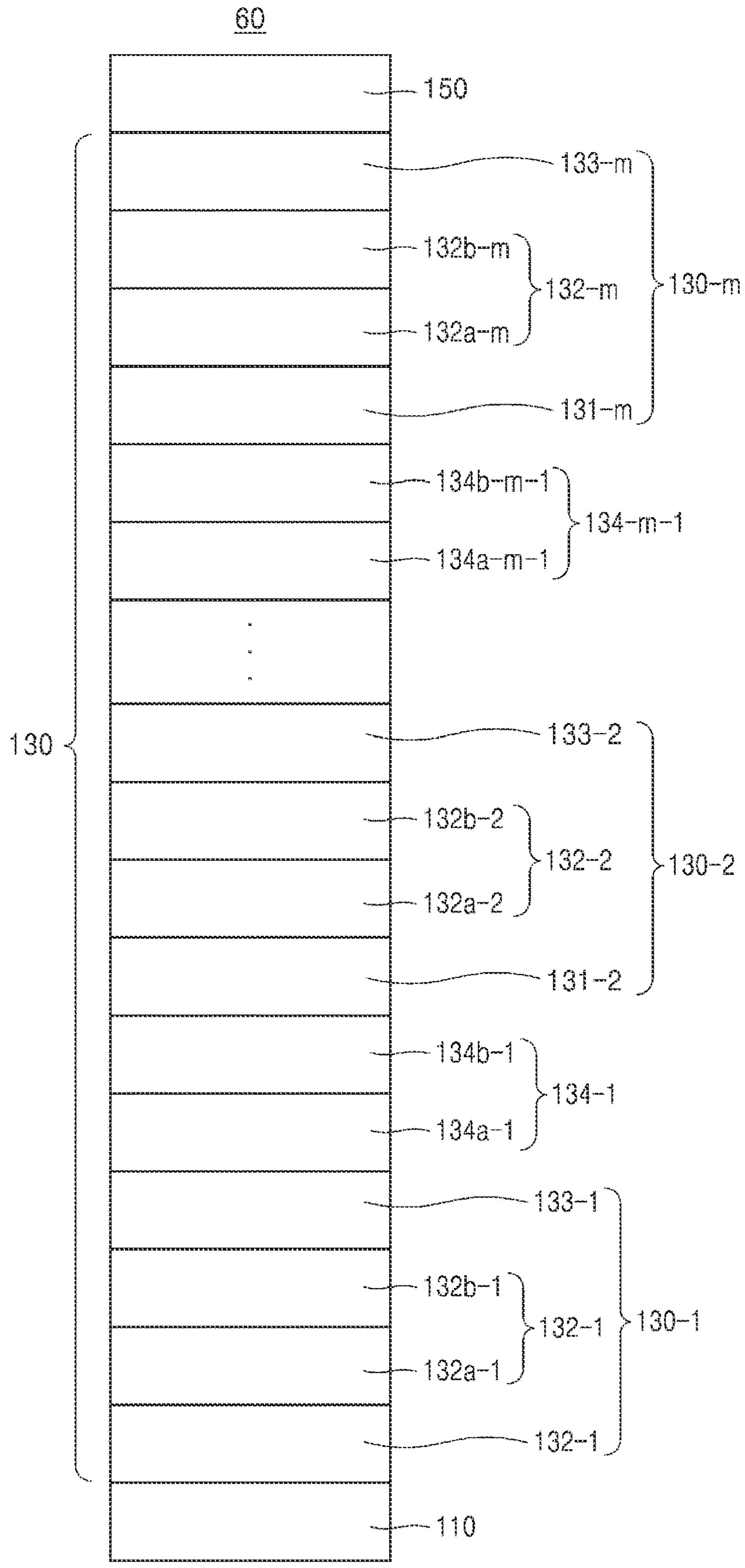

Referring to FIG. 6, the m emitting units 130-1, 130-2, . . . 130-*m* of the light-emitting device 60 may all include first emission layers 132*a*-1, 132*a*-2, . . . 132*a*-*m* and second emission layers 132*b*-1, 132*b*-2, . . . 132*b*-*m*.

Regarding the light-emitting devices 30, 40, 50, and 60, m may be 3 or 4.

In an embodiment, the first electrode 110 may be an anode and the second electrode 150 may be a cathode.

In an embodiment, the maximum luminescence wavelength of light emitted from each of them emitting units 130-1, 130-2, . . . 130-*m* may be identical to each other.

In an embodiment, the m emitting units 130-1, 130-2, . . . 130-*m* may emit blue light having a maximum luminescence wavelength in a range of about 440 nm to about 510 nm based on a front peak wavelength.

In an embodiment, from among them emitting units 130-1, 130-2, . . . 130-*m*, an emitting unit including the emission layers 132-1, 132-2, . . . 132-*m* including the first emission layers 132*a*-1, 132*a*-2, . . . 132*a*-*m* and the second emission layers 132*b*-1, 132*b*-2, . . . 132*b*-*m* may emit blue light having a maximum luminescence wavelength in a range of about 440 nm to about 510 nm.

In an embodiment, the maximum luminescence wavelength of light emitted from at least one emitting unit of the m emitting units 130-1, 130-2, . . . 130-*m* may be different from the maximum luminescence wavelength of light emitted from at least one emitting unit of the other emitting units. In an embodiment, in a light-emitting device in which the first emitting unit and the second emitting unit are stacked, a maximum luminescence wavelength of light emitted from the first emitting unit may be different from a maximum luminescence wavelength of light emitted from the second emitting unit. An emission layer of the first emitting unit and an emission layer of the second emitting unit may each independently have i) a single-layered structure consisting of a single layer consisting of a single material, ii) a single-layer structure consisting of a single layer consisting of different materials, and iii) a multi-layered structure having multiple layers consisting of different materials. Accordingly, the light emitted from the first light-emitting unit or the second light-emitting unit may be a single-color light or a mixed-color light. In an embodiment, in a light-emitting device in which a first light-emitting unit, a second light-emitting unit, and a third light-emitting unit are stacked, the maximum luminescence wavelength of light emitted from the first light-emitting unit may be the same as the maximum luminescence wavelength of light emitted from the second light-emitting unit but different from the maximum luminescence wavelength of light emitted from the third light-emitting unit. In an embodiment, the maximum luminescence wavelength of light emitted from the first light-emitting unit, the maximum luminescence wavelength of light emitted from the second light-emitting unit, and the maximum luminescence wavelength of light emitted from the third light-emitting unit may be different from one another.

In an embodiment, m emission layers 132-1, 132-2, . . . 132-*m* included in the m emitting units 130-1, 130-2, . . . 130-*m* may each independently include a phosphorescent dopant, a fluorescent dopant, a delayed fluorescence material, or any combination thereof.

In an embodiment, m emission layers 132-1, 132-2, . . . 132-*m* may all include a phosphorescent dopant, a fluorescent dopant, or a delayed fluorescence material.

In an embodiment, at least one of them emission layers 132-1, 132-2, . . . 132-*m* may include a phosphorescent dopant and the remaining emission layers may include a fluorescent dopant, or at least one of the m emission layers 132-1, 132-2, . . . 132-*m* may include a phosphorescent dopant and the remaining emission layers may include a delayed fluorescence material, or at least one of the m emission layers 132-1, 132-2, . . . 132-*m* may include a fluorescent dopant and the remaining emission layer may include a delayed fluorescence material.

In an embodiment, at least one of them emission layers 132-1, 132-2, . . . 132-*m* may include a phosphorescent dopant, another of the m emission layers may include a fluorescent dopant, and the remaining emission layers may include a delayed fluorescence material.

In a device of the related art, a single type of host material is used. In the case of a host of the related art, electron transport characteristics are stronger than hole transport characteristics. Accordingly, a recombination zone where holes and electrons meet together is generated at the interface between an electron blocking layer and an emission layer. Accordingly, the electron blocking layer is deteriorated due to excitons formed by holes and electrons.

Regarding this issue, a light-emitting device according to the disclosure includes a double-layered emission layer in which one emission layer includes a deuterium-substituted host and the other emission layer includes a deuterium-unsubstituted host, and thus, the recombination zone is shifted to the interface between the two emission layers, thereby preventing deterioration of the device.

A narrow triplet-triplet fusion (TTF) zone is formed at the interface between the two emission layers, resulting in a highly efficient luminance and a long lifespan.

Due to the use of deuterium-substituted host in one of the emission layers, a long lifespan may be embodied.

A light-emitting device according to the disclosure uses a deuterium-substituted host only in one of the two emission layers, so that, compared to a structure in which both emission layers use a deuterium-substituted host, stable hole injection characteristics may be obtained by a first emission layer and thus a charge balance improvement may be expected, and, by a second emission layer, which is a major emission zone, stable exciton formation and luminance may be obtained, leading to higher efficiency and longer lifespan.

A light-emitting device according to the disclosure does not include an electron blocking layer between an emission layer and a hole transport layer, although conventionally, the electron blocking layer is located between the emission layer and the hole transport layer, and the HOMO energy level of the hole transport layer is set in a range of about −5.25 eV to about −5.5 eV, and at the same time, a double-layered emission layer is used to shift the emission zone from a zone between the electron blocking layer (EBL) and the emission layer to the interface of emission layers constituting the double-layered emission layer in a direction toward a buffer layer. Accordingly, effective fluorescent emission may be obtained only by controlling hole injection without a layer having electron blocking characteristics.

According to embodiments, an electronic apparatus may include the light-emitting device.

In an embodiment, the electronic apparatus may include a sealing portion disposed on the light-emitting device; and a functional layer disposed on the sealing portion, the functional layer including a touch screen layer, a polarizing layer, a color filter, a color conversion layer, or any combination thereof.

In an embodiment, the electronic apparatus may include a quantum dot or an optical member including the quantum dot, and the quantum dot or the optical member including the quantum dot may be disposed on at least one traveling direction of light emitted from the light-emitting device.

The term "interlayer" as used herein refers to a single layer and/or all layers between a first electrode and a second electrode of a light-emitting device. A material included in the "interlayer" is not limited to an organic material.

Hereinafter, the structure of the light-emitting device 10 according to an embodiment and a method of manufacturing the light-emitting device 10 will be described in connection with FIG. 1.

[First Electrode 110]

In FIG. 1, a substrate may be additionally located under the first electrode 110 or above the second electrode 150. The substrate may be a glass substrate or a plastic substrate. The substrate may be a flexible substrate. In embodiments, the substrate may include plastics with excellent heat resistance and durability, such as polyimide, polyethylene terephthalate (PET), polycarbonate, polyethylene naphthalate, polyarylate (PAR), polyetherimide, or a combination thereof.

The first electrode 110 may be formed by, for example, depositing or sputtering a material for forming the first electrode 110 on the substrate. When the first electrode 110 is an anode, a high work function material that can easily inject holes may be used as a material for a first electrode.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or any combinations thereof. In embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combinations thereof may be used as a material for forming the first electrode 110.

The first electrode 110 may have a single-layered structure consisting of a single layer or a multi-layered structure including multiple layers. In an embodiment, the first electrode 110 may have a three-layered structure of ITO/Ag/ITO.

[Interlayer 130]

The interlayer 130 may be located on the first electrode 110. The interlayer 130 may include an emission layer 132.

The interlayer 130 may further include a hole transport region 131 located between the first electrode 110 and the emission layer 132 and an electron transport region 133 located between the emission layer 132 and the second electrode 150.

The interlayer 130 may further include metal-containing compounds such as organometallic compounds, inorganic materials such as quantum dots, and the like, in addition to various organic materials.

In embodiments, as described above, the interlayer 130 may include, i) two or more emitting units sequentially stacked between the first electrode 110 and the second electrode 150 and ii) a charge generation layer located between the two emitting units. When the interlayer 130 includes the emitting units and the charge generation layer as described above, the light-emitting device 10 may be a tandem light-emitting device. (see FIGS. 3 to 6)

[Hole Transport Region 131 in Interlayer 130]

The hole transport region 131 may have: i) a single-layered structure consisting of a single layer consisting of a single material, ii) a single-layered structure consisting of a single layer consisting of different materials, or iii) a multi-layered structure including multiple layers including different materials.

The hole transport region 131 may include a hole injection layer (HIL), a hole transport layer (HTL), or any combination thereof.

In an embodiment, the hole transport region 131 may have a multi-layered structure of a hole injection layer/hole transport layer sequentially stacked from the first electrode 110.

The hole transport region 131 may include a compound represented by Formula 201, a compound represented by Formula 202, or any combination thereof:

[Formula 201]

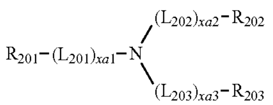

[Formula 202]

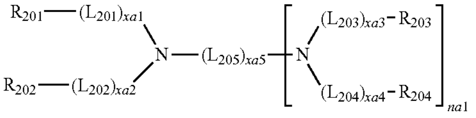

Wherein in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 are each independently an integer from 0 to 5, xa5 is an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$ (for example, a carbazole group or the like) (for example, refer to the following compound HT16), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In an embodiment, Formulae 201 and 202 may each include at least one of the groups represented by Formulae CY201 to CY217:

CY201

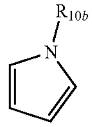

CY202

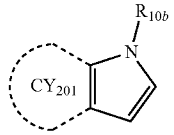

CY203

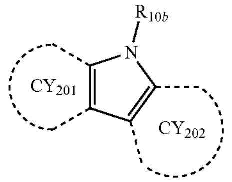

CY204

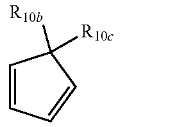

CY205

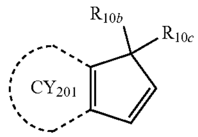

CY206

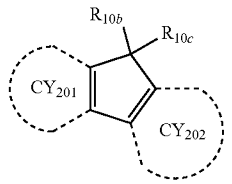

-continued

CY207

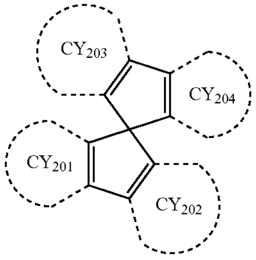

CY208

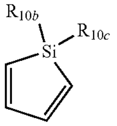

CY209

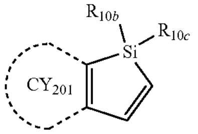

CY210

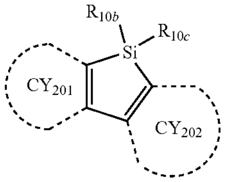

CY211

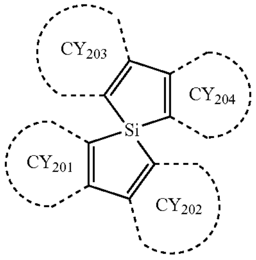

CY212

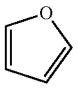

CY213

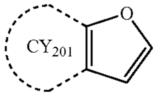

CY214

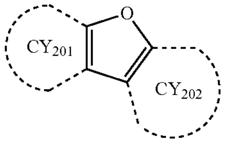

-continued

CY215

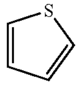

CY216

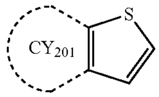

CY217

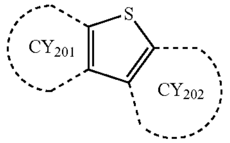

Regarding Formulae CY201 to CY217, $R_{10b}$ and $R_{10c}$ are the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formula CY201 to CY217 may be unsubstituted or substituted with at least one $R_{10a}$ described herein.

In an embodiment, ring $CY_{201}$ to ring $CY_{204}$ in Formulae CY201 to CY217 may each independently be a benzene group, a naphthalene group, a phenanthrene group, or an anthracene group.

In an embodiment, Formulae 201 and 202 may each include at least one of the groups represented by Formulae CY201 to CY203:

In embodiments, Formula 201 may include at least one of the groups represented by Formulae CY201 to CY203 and at least one of the groups represented by Formulae CY204 to CY217.

In embodiments, in Formula 201, xa1 is 1, $R_{201}$ is a group represented by one of Formulae CY201 to CY203, xa2 is 0, and $R_{202}$ is a group represented by one of Formulae CY204 to CY207.

In embodiments, each of Formulae 201 and 202 may not include a group represented by one of Formulae CY201 to CY203.

In embodiments, each of Formulae 201 and 202 may not include a group represented by one of Formulae CY201 to CY203 and may include at least one of the groups represented by Formulae CY204 to CY217.

In an embodiment, each of Formulae 201 and 202 may not include a group represented by one of Formulae CY201 to CY217.

In an embodiment, the hole transport region 131 may include one of Compounds HT1 to HT46, m-MTDATA, TDATA, 2-TNATA, NPB(NPD), β-NPB, TPD, Spiro-TPD, Spiro-NPB, methylated-NPB, TAPC, HMTPD, 4,4',4"-tris (N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1
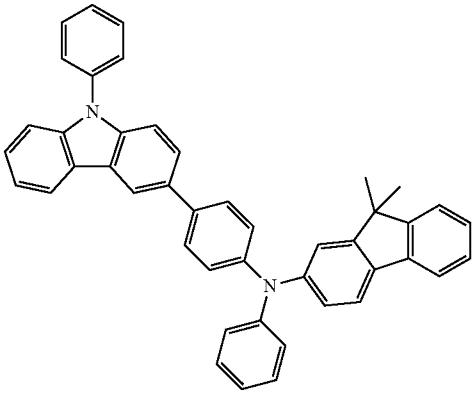
HT2
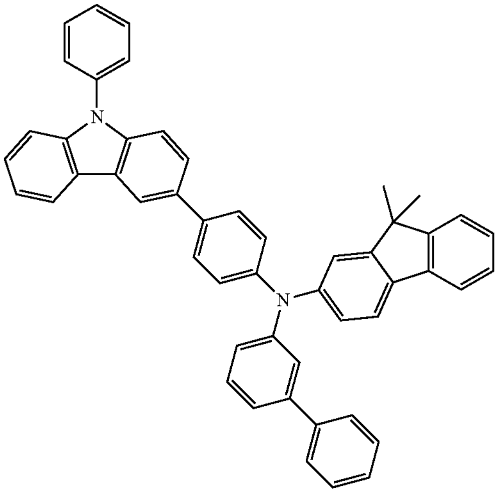
HT3
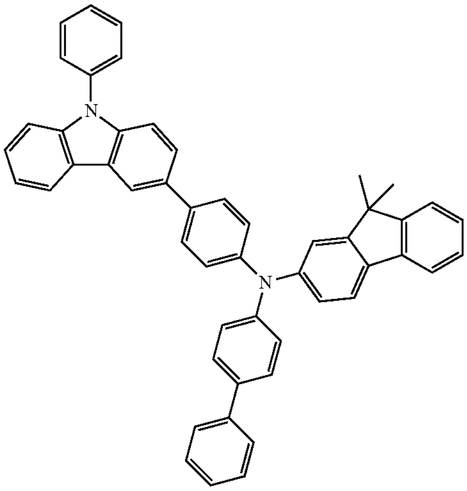
HT4
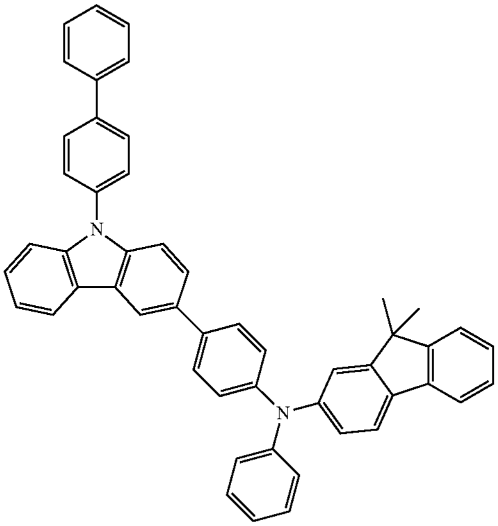
HT5
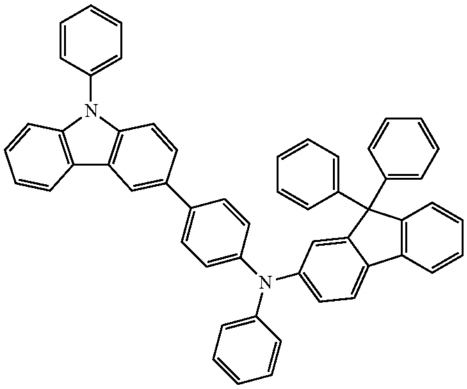
HT6
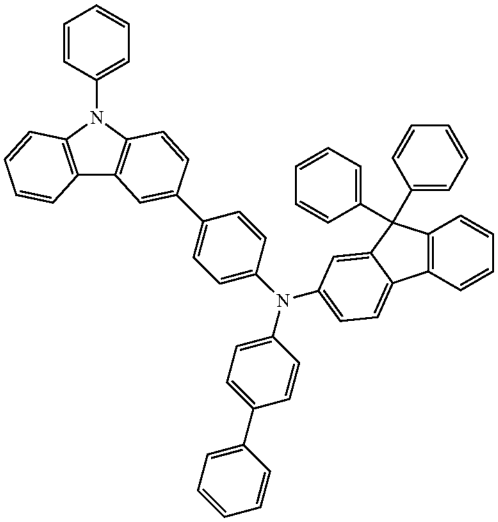

-continued
HT7
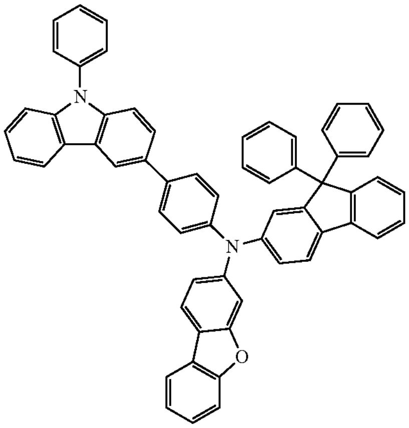
HT8
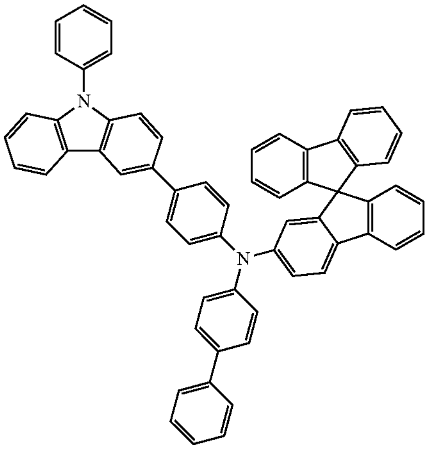
HT9
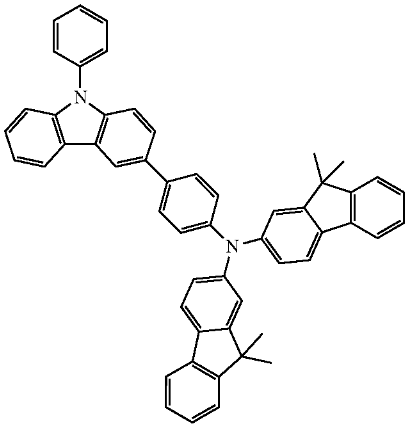
HT10
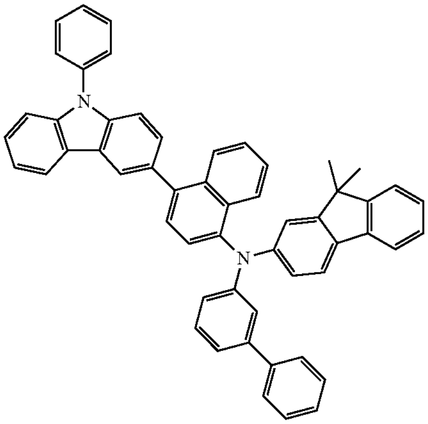
HT11
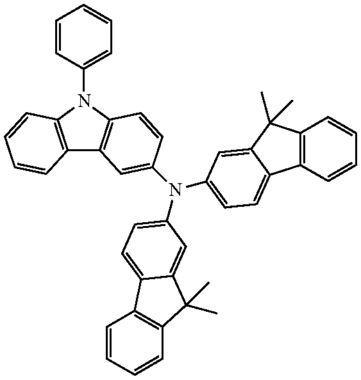
HT12
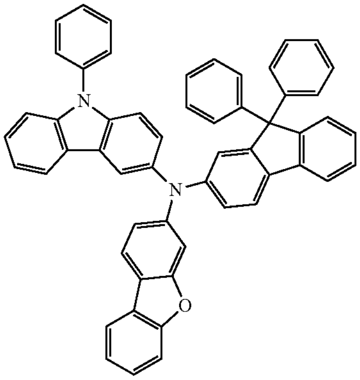

-continued
HT13
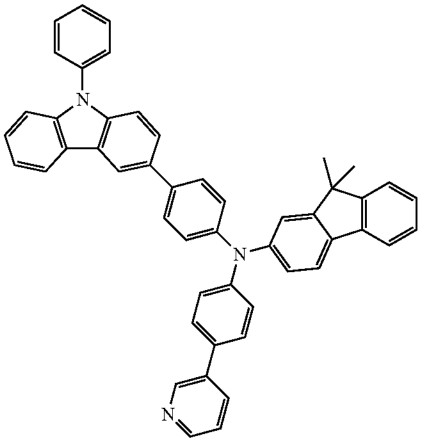
HT14
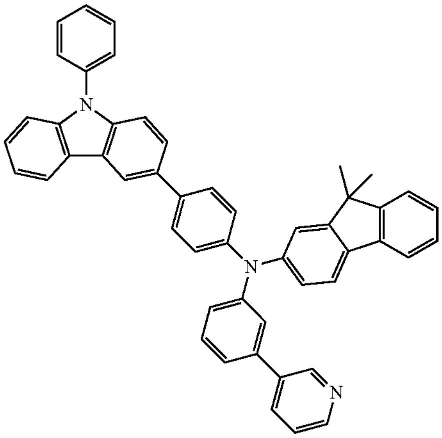
HT15
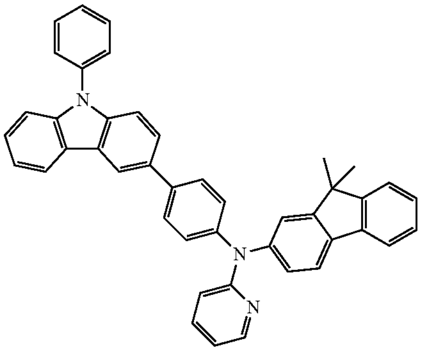
HT16
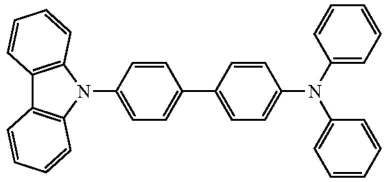
HT17
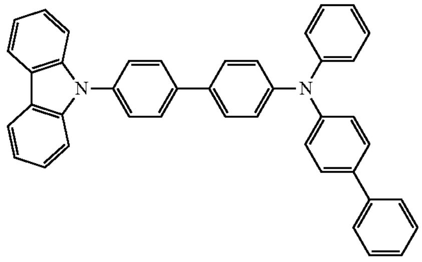
HT18
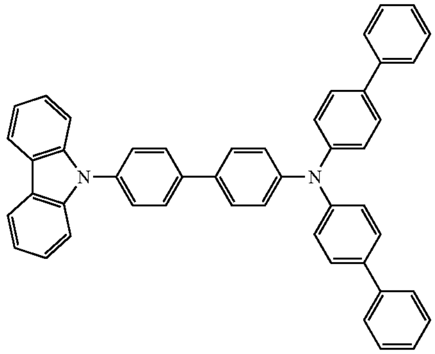
HT19
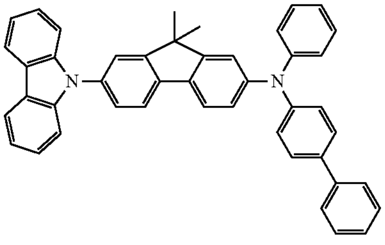
HT20
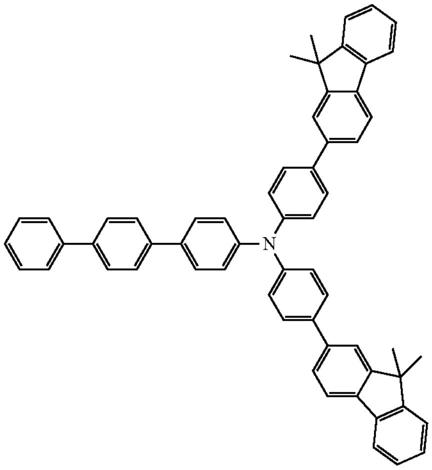

-continued
HT21
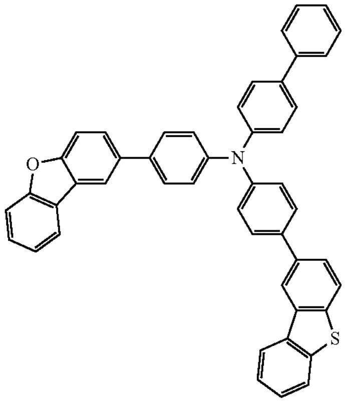
HT22
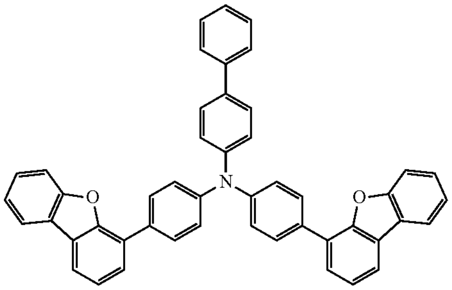
HT23
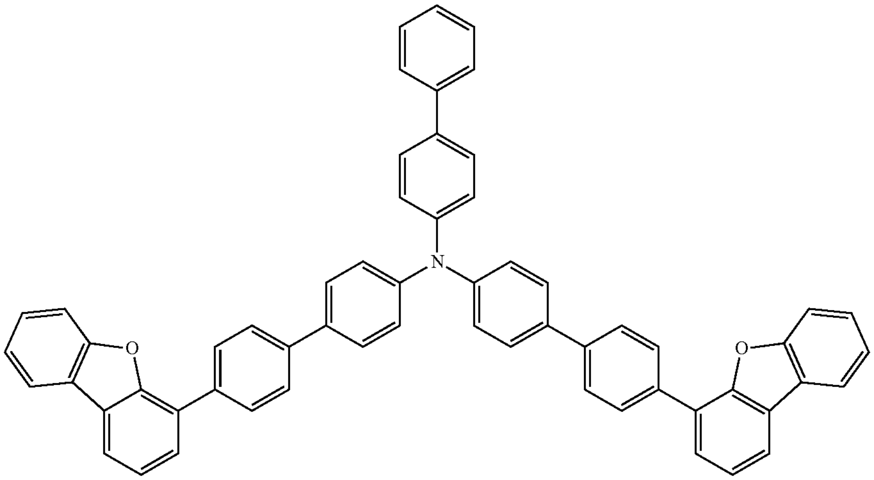
HT24
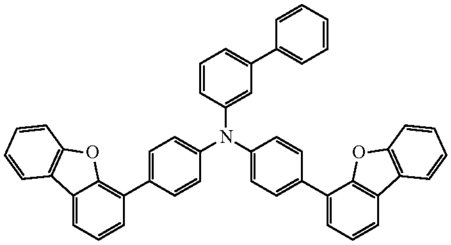
HT25
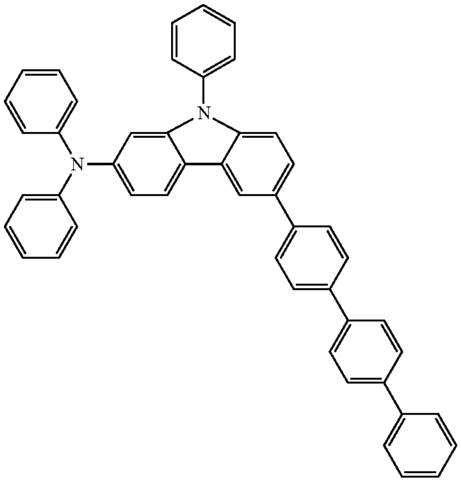

-continued
HT26
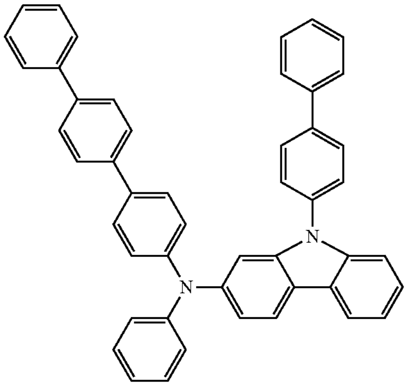
HT27
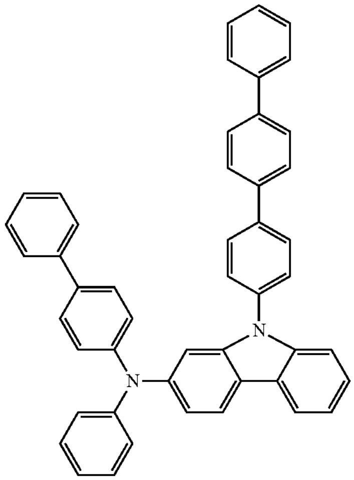
HT28
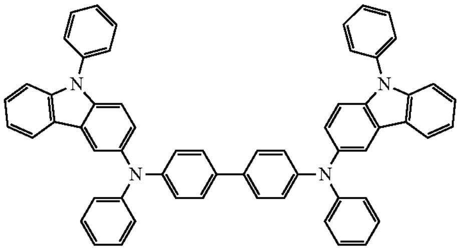
HT29
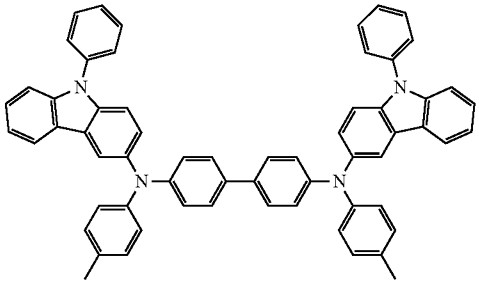
HT30
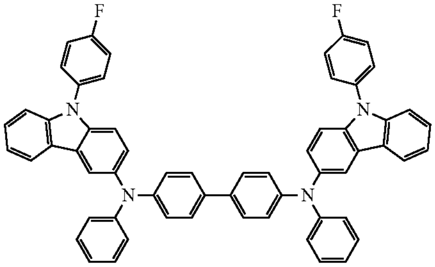
HT31
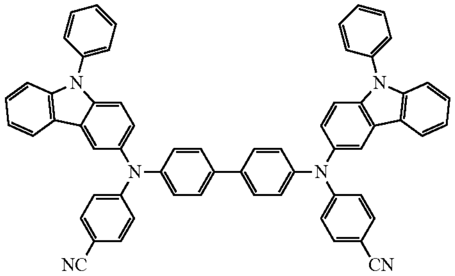
HT32
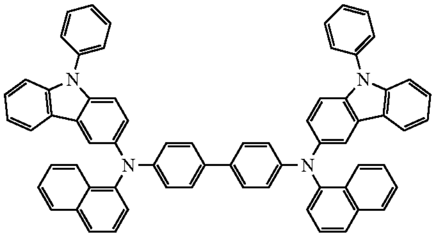
HT33
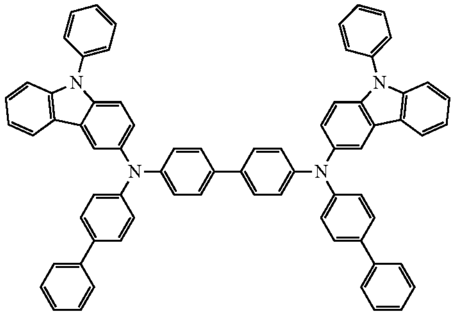

-continued
HT34
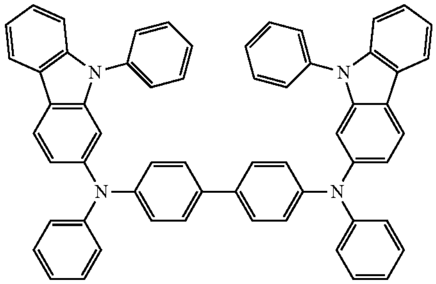
HT35
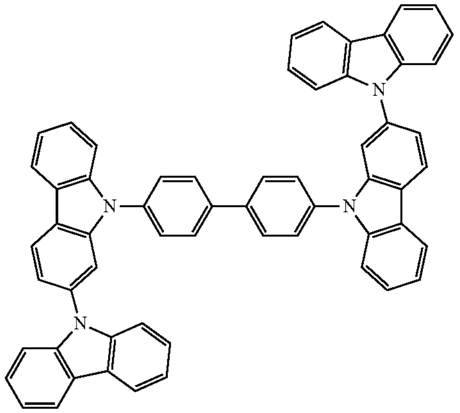
HT36
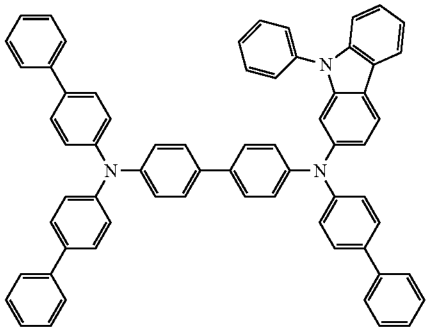
HT37
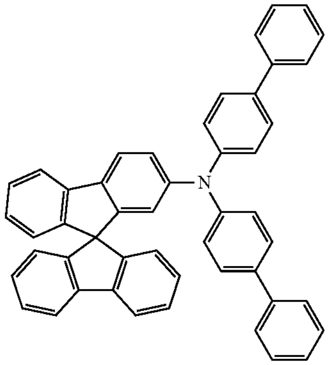
HT38
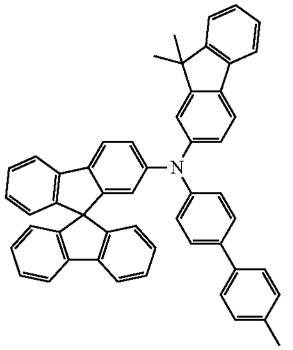
HT39
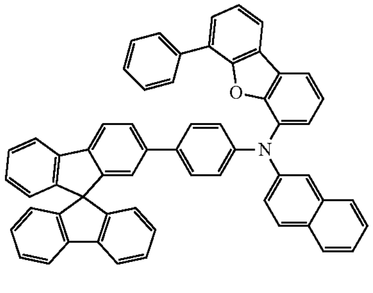
HT40
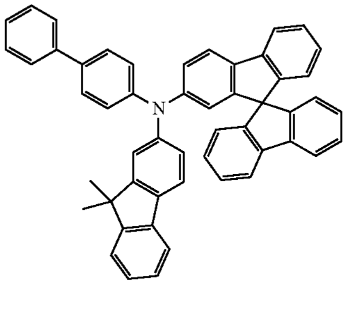
HT41
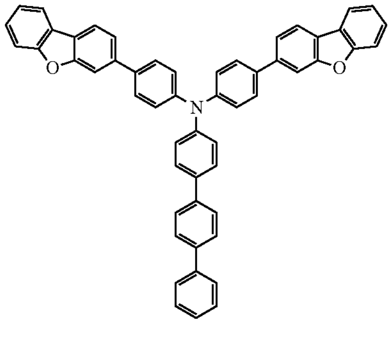

-continued
HT42
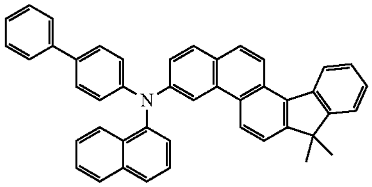
HT43
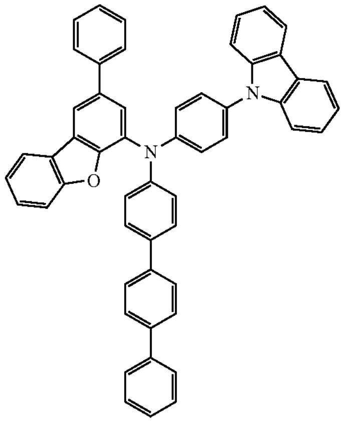
HT44
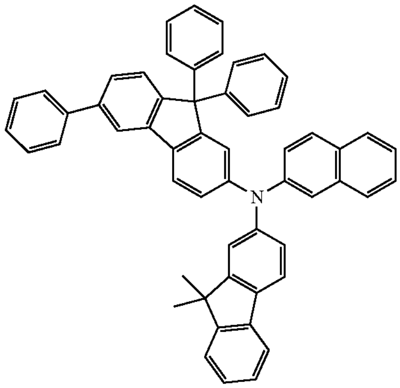
HT45
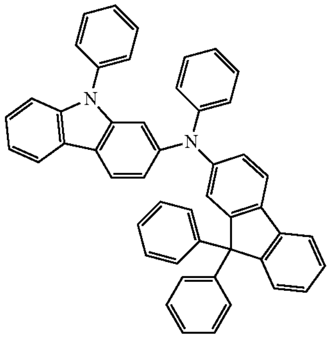
HT46
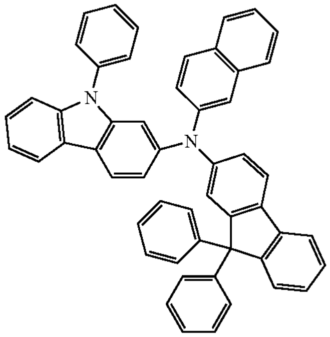
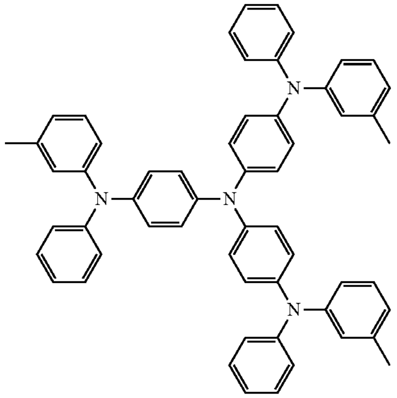
m-MTDATA -continued

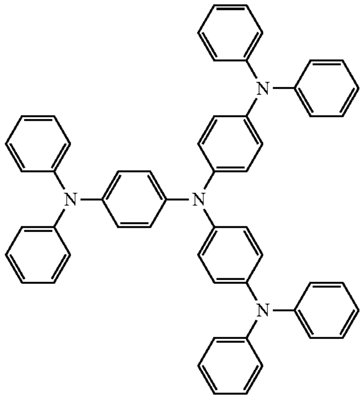

TDATA

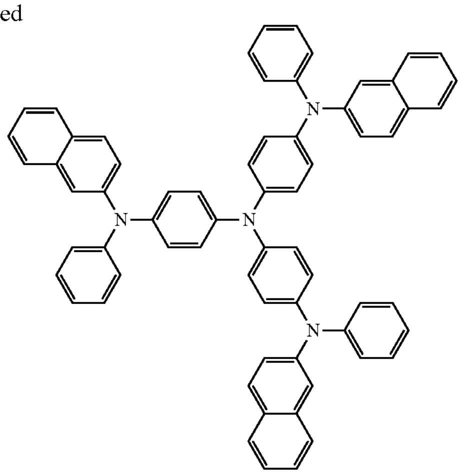

2-TNATA

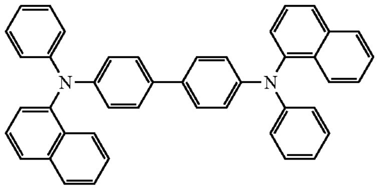

NPB

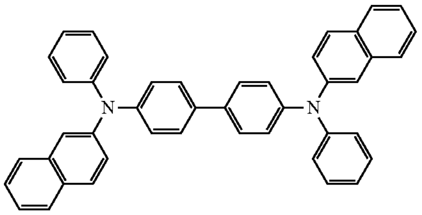

β-NPB

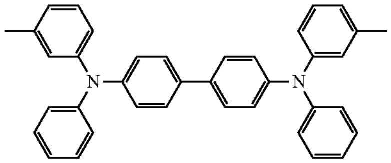

TPD

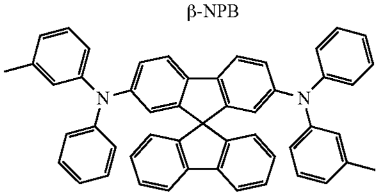

Spiro-TPD

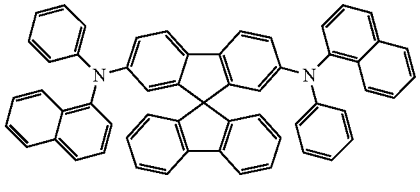

Spiro-NPB

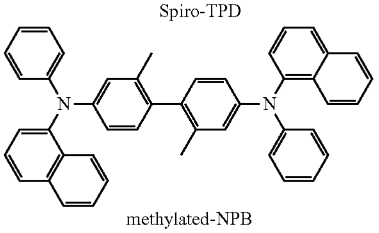

methylated-NPB

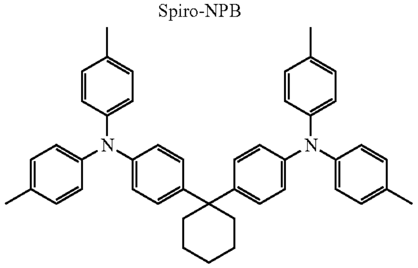

TAPC

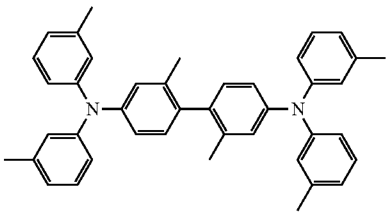

HMTPD

A thickness of the hole transport region 131 may be in a range of about 50 Å to about 10,000 Å. For example, the thickness of the hole transport region 131 may be in a range of about 100 Å to about 4,000 Å. When the hole transport region 131 includes a hole injection layer, a hole transport layer, or any combination thereof, a thickness of the hole injection layer may be in a range of about 100 Å to about 9,000 Å, and a thickness of the hole transport layer may be in a range of about 50 Å to about 2,000 Å. For example, the thickness of the hole injection layer may be in a range of about 100 Å to about 1,000 Å. For example, the thickness of the hole transport layer may be in a range of about 100 Å to about 1,500 Å. When the thicknesses of the hole transport region, the hole injection layer and the hole transport layer are within these ranges, satisfactory hole transporting characteristics may be obtained without a substantial increase in driving voltage.

[P-Dopant]

The hole transport region 131 may further include, in addition to these materials, a charge-generation material for the improvement of conductive properties. The charge-generation material may be uniformly or non-uniformly dispersed in the hole transport region 131 (for example, in the form of a single layer consisting of a charge-generation material).

The charge-generation material may be, for example, a p-dopant.

In an embodiment, the lowest unoccupied molecular orbital (LUMO) energy level of the p-dopant may be equal to or less than about −3.5 eV.

In an embodiment, the p-dopant may include a quinone derivative, a cyano group-containing compound, a compound containing element EL1 and element EL2, or any combination thereof.

Examples of the quinone derivative are TCNQ and F4-TCNQ.

Examples of the cyano group-containing compound are HAT-CN and a compound represented by Formula 221 below.

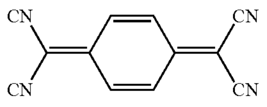

TCNQ

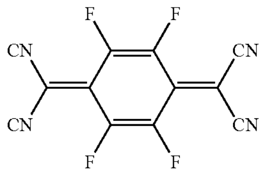

F4-TCNQ

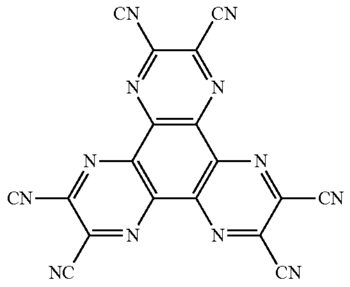

HAT-CN

[Formula 221]

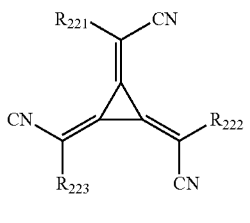

wherein, in Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

Regarding the compound containing element EL1 and element EL2, element EL1 may be metal, metalloid, or a combination thereof, and element EL2 may be a non-metal, metalloid, or a combination thereof.

Examples of the metal are: an alkali metal (for example, lithium (Li), sodium (Na), potassium (K), rubidium (Rb), cesium (Cs), or the like); alkaline earth metal (for example, beryllium (Be), magnesium (Mg), calcium (Ca), strontium (Sr), barium (Ba), or the like); transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), or the like); post-transition metals (for example, zinc (Zn), indium (In), tin (Sn), or the like); and lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or the like).

Examples of the metalloid are silicon (Si), antimony (Sb), and tellurium (Te).

Examples of the non-metal are oxygen (O) and halogen (for example, F, Cl, Br, I, etc.).

In an embodiment, examples of the compound containing element EL1 and element EL2 are metal oxide, metal halide (for example, metal fluoride, metal chloride, metal bromide, or metal iodide), metalloid halide (for example, metalloid fluoride, metalloid chloride, metalloid bromide, or metalloid iodide), metal telluride, and any combination thereof.

Examples of the metal oxide are tungsten oxide (for example, WO, $W_2O_3$, $WO_2$, $WO_3$, or $W_2O_5$), vanadium oxide (for example, VO, $V_2O_3$, $VO_2$, or $V_2O_5$), molybdenum oxide (MoO, $Mo_2O_3$, $MoO_2$, $MoO_3$, or $Mo_2O_5$), and rhenium oxide (for example, $ReO_3$).

Examples of the metal halide are alkali metal halide, alkaline earth metal halide, transition metal halide, post-transition metal halide, and lanthanide metal halide.

Examples of the alkali metal halide are LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide are $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide are titanium halide (for example, $TiF_4$, $TiCl_4$, $TiBr_4$, or $TiI_4$), zirconium halide (for example, $ZrF_4$, $ZrCl_4$, $ZrBr_4$, or $ZrI_4$), hafnium halide (for example, $HfF_4$, $HfCl_4$, $HfBr_4$, or $HfI_4$), vanadium halide (for example, $VF_3$, $VCl_3$, $VBr_3$, or $VI_3$), niobium halide (for example, $NbF_3$, $NbCl_3$, $NbBr_3$, or $NbI_3$), tantalum halide (for example, $TaF_3$, $TaCl_3$, $TaBr_3$, or $TaI_3$), chromium halide (for example, $CrF_3$, $CrCl_3$, $CrBr_3$, or $CrI_3$), molybdenum halide (for example, $MoF_3$, $MoCl_3$, $MoBr_3$, or $MoI_3$), tungsten halide (for example, $WF_3$, $WCl_3$, $WBr_3$, or $WI_3$), manganese halide (for example, $MnF_2$, $MnCl_2$, $MnBr_2$, or $MnI_2$), technetium halide (for example, $TcF_2$, $TcCl_2$, $TcBr_2$, or $TcI_2$), rhenium halide (for example, $ReF_2$, $ReCl_2$, $ReBr_2$, or $ReI_2$), iron halide (for example, $FeF_2$, $FeCl_2$, $FeBr_2$, or $FeI_2$), ruthenium halide (for example, $RuF_2$, $RuCl_2$, $RuBr_2$, or $RuI_2$), osmium halide (for example, $OsF_2$, $OsCl_2$, $OsBr_2$, or $OsI_2$), cobalt halide (for example, $CoF_2$, $CoCl_2$, $CoBr_2$, or $CoI_2$), rhodium halide (for example, $RhF_2$, $RhCl_2$, $RhBr_2$, or $RhI_2$), iridium halide (for example, $IrF_2$, $IrCl_2$, $IrBr_2$, or $IrI_2$), nickel halide (for example, $NiF_2$, $NiCl_2$, $NiBr_2$, or $NiI_2$), palladium halide (for example, $PdF_2$, $PdCl_2$, $PdBr_2$, or $PdI_2$), platinum halide (for example, $PtF_2$, $PtCl_2$, $PtBr_2$, or $PtI_2$), copper halide (for example, CuF, CuCl, CuBr, or CuI), silver halide (for example, AgF, AgCl, AgBr, or AgI), and gold halide (for example, AuF, AuCl, AuBr, or AuI).

Examples of the post-transition metal halide are zinc halide (for example, $ZnF_2$, $ZnCl_2$, $ZnBr_2$, or $ZnI_2$), indium halide (for example, $InI_3$), and tin halide (for example, $SnI_2$).

Examples of the lanthanide metal halide are YbF, $YbF_2$, $YbF_3$, $SmF_3$, YbCl, $YbCl_2$, $YbCl_3$ $SmCl_3$, YbBr, $YbBr_2$, $YbBr_3$ $SmBr_3$, YbI, $YbI_2$, $YbI_3$, and $SmI_3$.

Examples of the metalloid halide are antimony halide (for example, $SbCl_5$).

Examples of the metal telluride are an alkali metal telluride (for example, $Li_2Te$, $Na_2Te$, $K_2Te$, $Rb_2Te$, or $Cs_2Te$), alkaline earth metal telluride (for example, BeTe, MgTe, CaTe, SrTe, or BaTe), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, or $Au_2Te$), post-transition metal telluride (for example, or ZnTe), and lanthanide metal telluride (for example, LaTe, CeTe, PrTe, NdTe, PmTe, EuTe, GdTe, TbTe, DyTe, HoTe, ErTe, TmTe, YbTe, or LuTe).

[Emission Layer 132 in Interlayer 130]

When the light-emitting device 10 is a full-color light-emitting device, the emission layer 132 may be patterned into a red emission layer, a green emission layer, and/or a blue emission layer, according to a subpixel. In embodiments, the emission layer 132 may have a stacked structure of two or more layers of a red emission layer, a green emission layer, and a blue emission layer, in which the two or more layers contact each other or are separated from each other. In embodiments, the emission layer may include two or more materials of a red light-emitting material, a green light-emitting material, and a blue light-emitting material, in which the two or more materials are mixed with each other in a single layer to emit white light.

The emission layer 132 may be the same as described above.

The amount of the dopant in the emission layer 132 may be in a range of about 0.01 to about 15 parts by weight based on 100 parts by weight of the host.

In embodiments, the emission layer 132 may include a quantum dot.

The emission layer 132 may include a delayed fluorescence material. The delayed fluorescence material may act as a host or a dopant in the emission layer 132.

A thickness of the emission layer 132 may be in a range of about 100 Å to about 1,000 Å. For example, the thickness of the emission layer 132 may be in a range of about 200 Å to about 600 Å. When the thickness of the emission layer 132 is within these ranges, excellent luminescence characteristics may be obtained without a substantial increase in driving voltage.

[Host]

The host is the same as described in connection with the first compound and second compound described above.

The host may further include a compound represented by Formula 301 below within a range in which the host satisfies the conditions described in connection with the first emission layer and the second emission layer:

$$[Ar_{301}]_{xb11}\text{-}[(L_{301})_{xb1}\text{-}R_{301}]_{xb21} \quad \text{[Formula 301]}$$

wherein, in Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(═O)($Q_{301}$), —S(═O)$_2$($Q_{301}$), or —P(═O)($Q_{301}$)($Q_{302}$), xb21 may be an integer from 1 to 5, and $Q_{301}$ to $Q_{303}$ are the same as described in connection with $Q_1$.

In embodiments, when xb11 in Formula 301 is 2 or more, two or more of $Ar_{301}$(s) may be linked to each other via a single bond.

In an embodiment, the host may include a compound represented by Formula 301-1, a compound represented by Formula 301-2, or any combination embodiment:

[Formula 301-1]

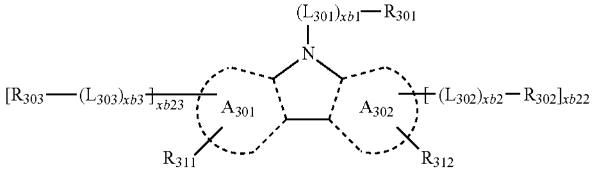

-continued

[Formula 301-2]

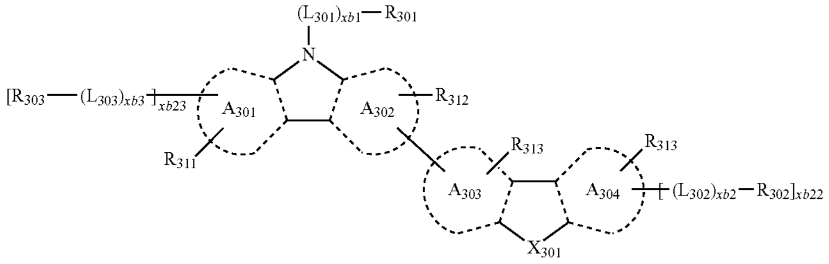

wherein, in Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[$(L_{304})_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ are the same as described above, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ are the same as described in connection with $R_{301}$.

In embodiments, the host may include an alkaline earth metal complex. In an embodiment, the host may be a Be complex (for example, Compound H55), a Mg complex, a Zn complex, or any combination thereof.

In an embodiment, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), 2,2',2''-(1,3,5-benzinetriyl)-tris(1-phenyl-1-H-benzimidazole) (TPBi), or any combination thereof, but embodiments of the disclosure are not limited thereto:

H1

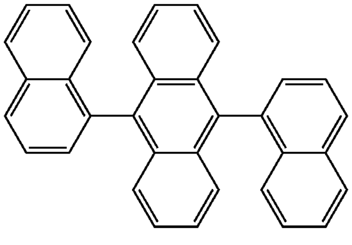

H2

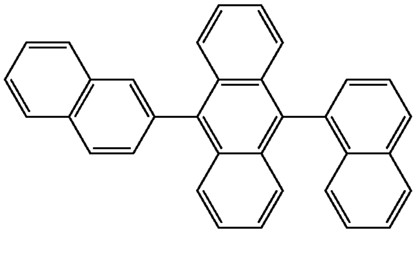

-continued

H3

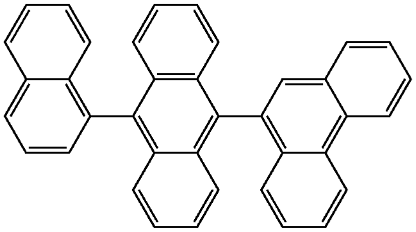

H4

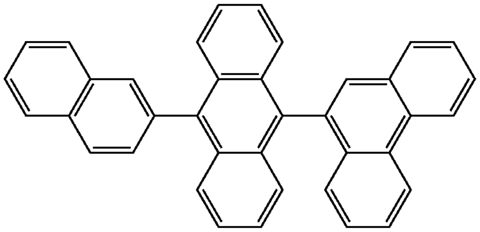

H5

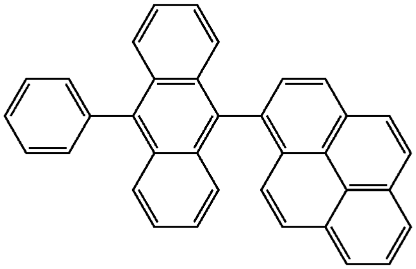

H6

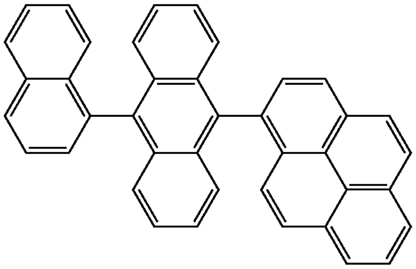

H7

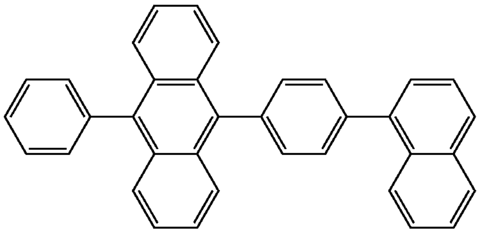

-continued
H8
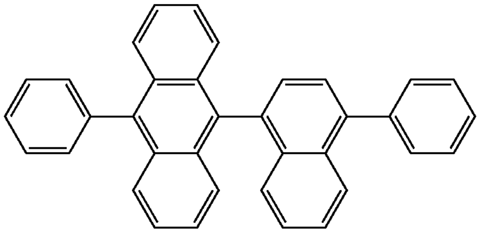
H9
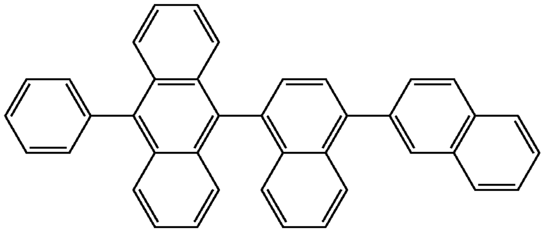
H10
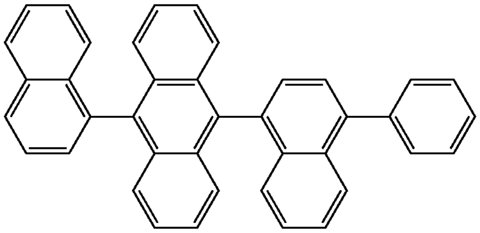
H11
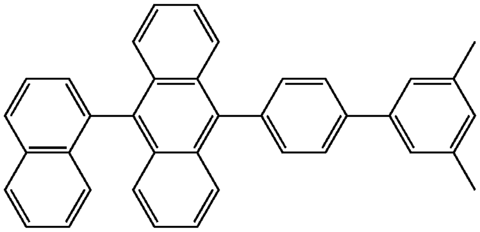
H12
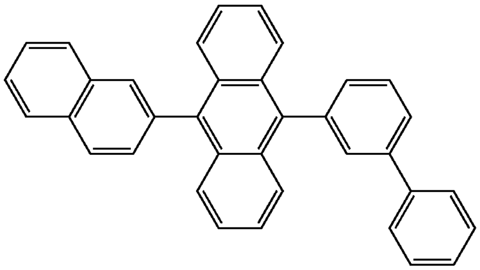
H13
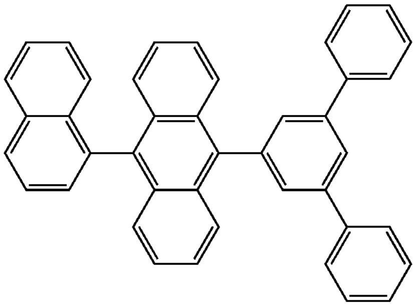
-continued
H14
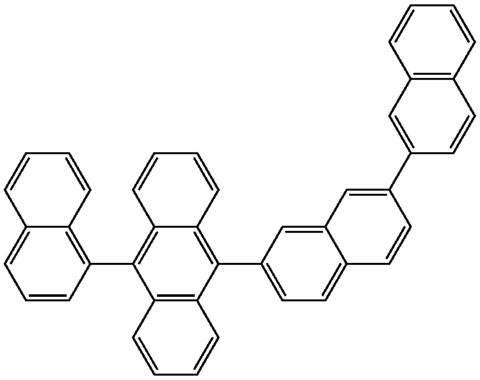
H15
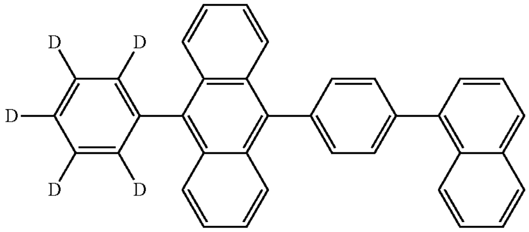
H16
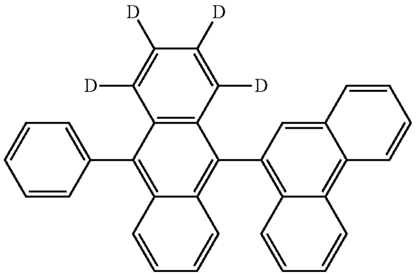
H17
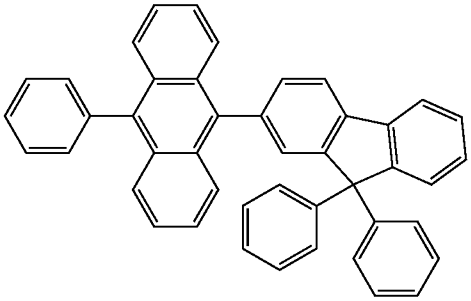
H18
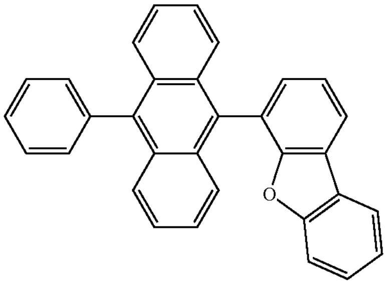

-continued
H19
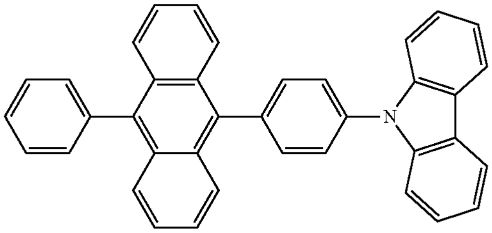
H20
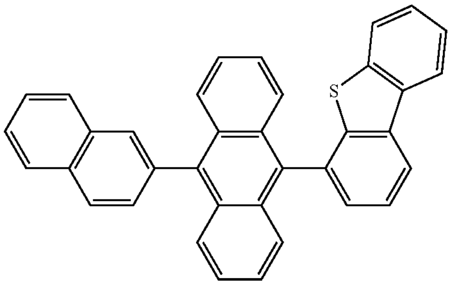
H21
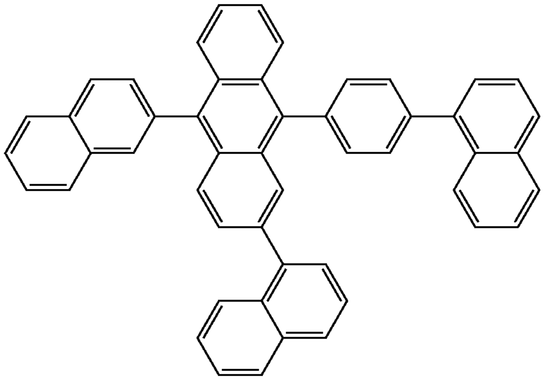
H22
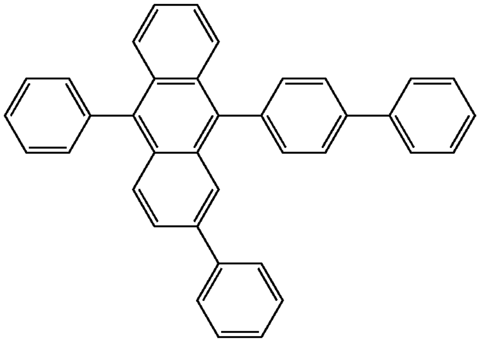
-continued
H23
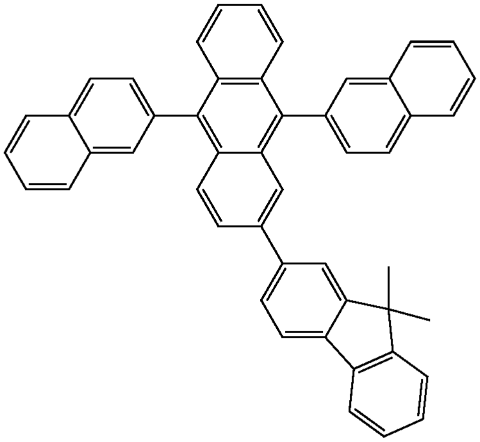
H24
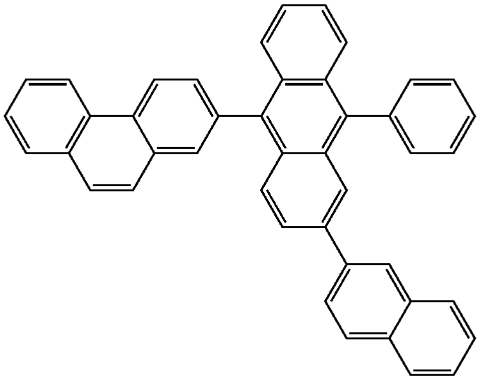
H25
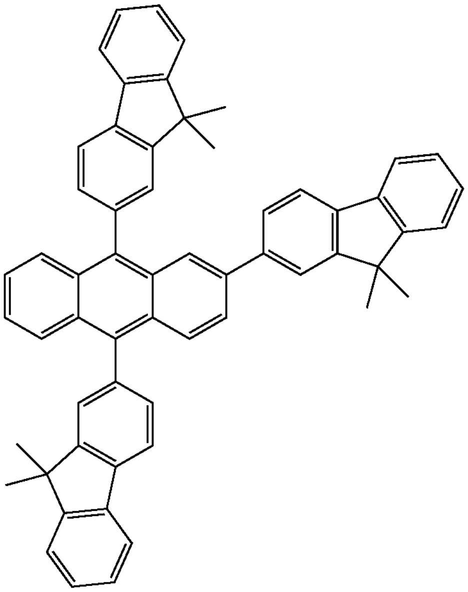

-continued
H26
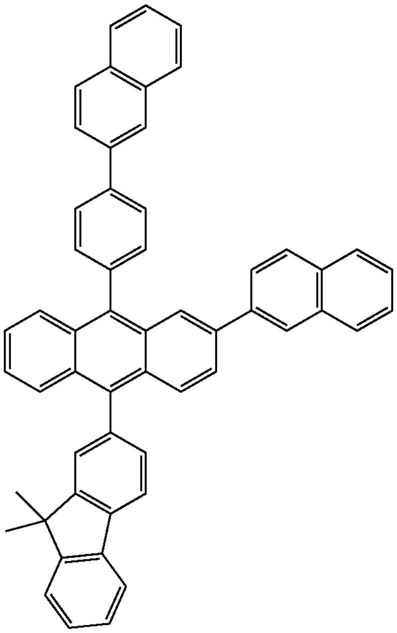
H27
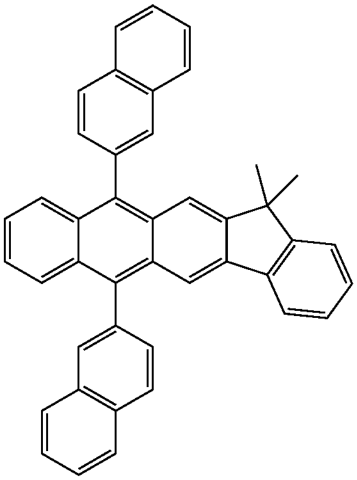
H28
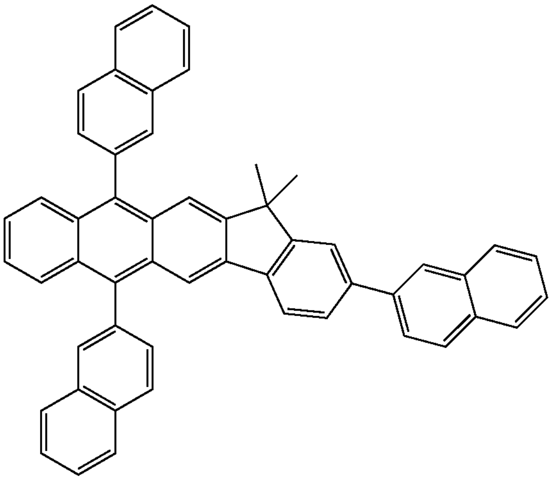
-continued
H29
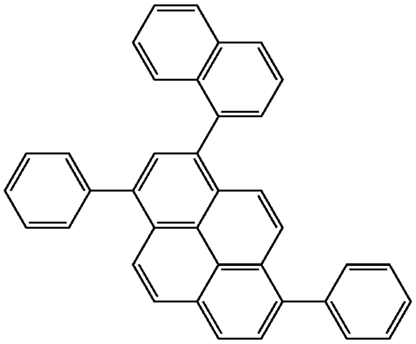
H30
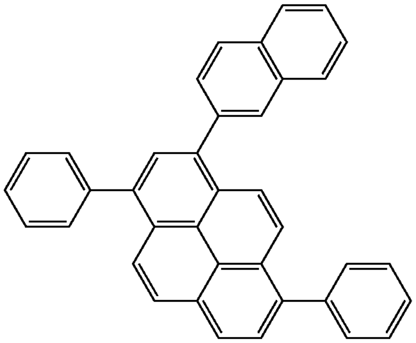
H31
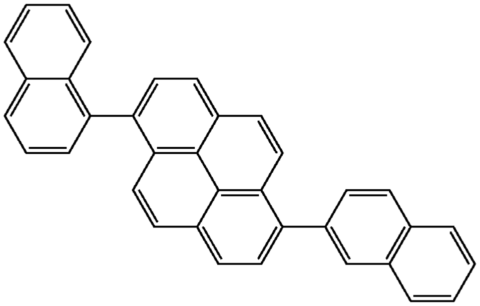
H32
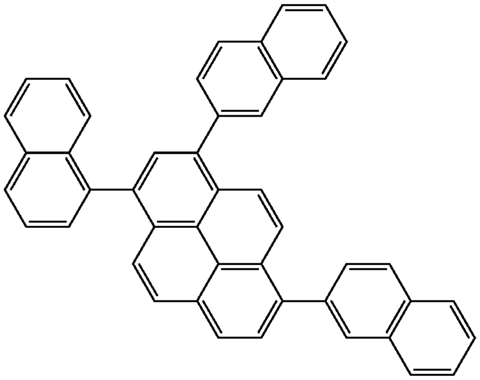
H33
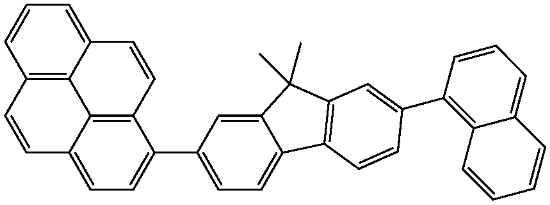

-continued
H34
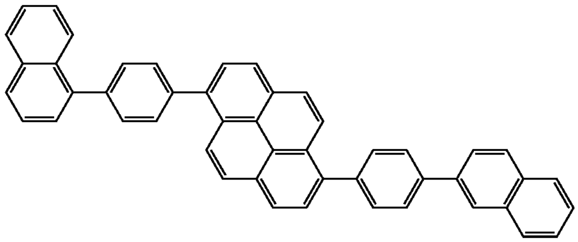
H35
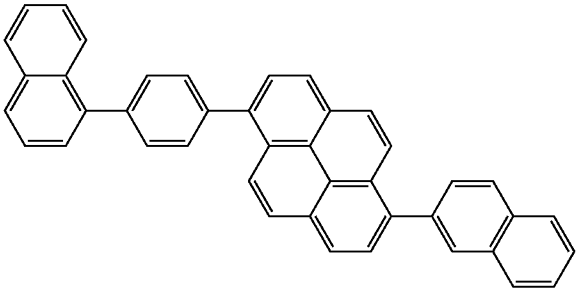
H36
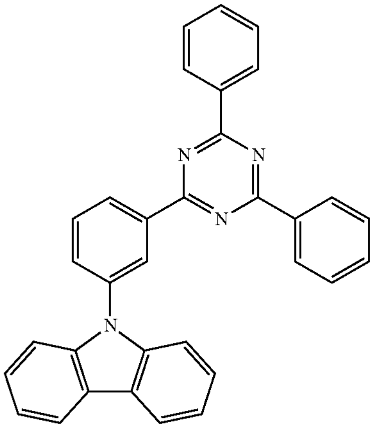
H37
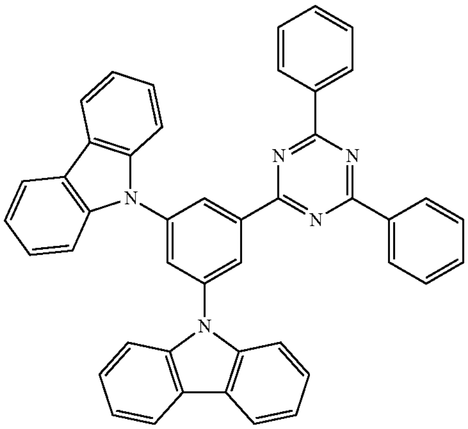
-continued
H38
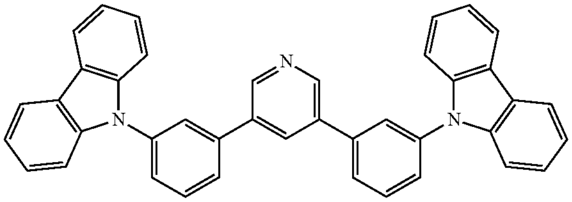
H39
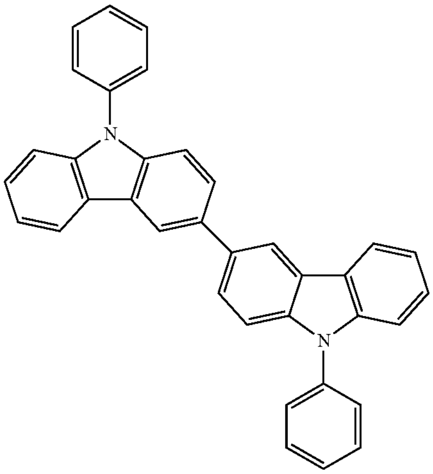
H40
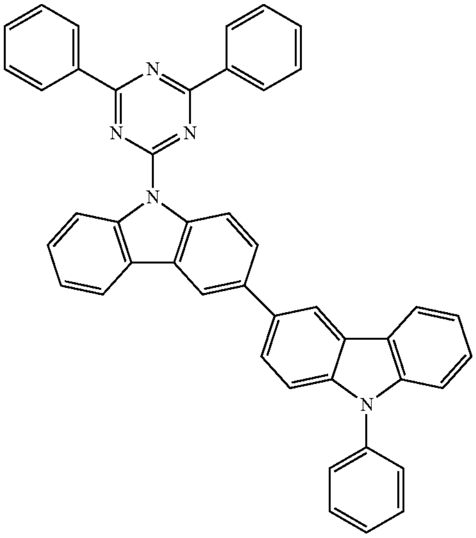

-continued
H41
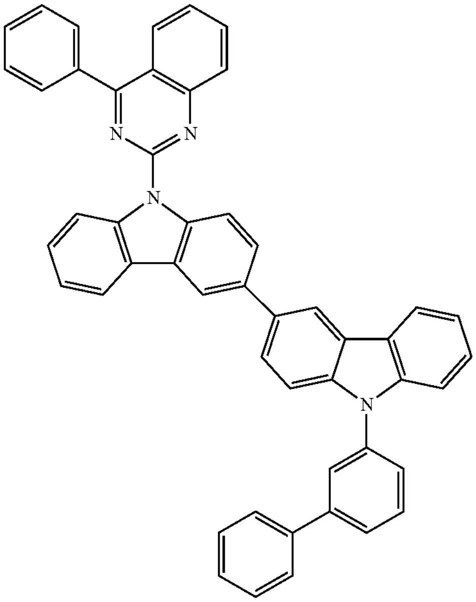
H42
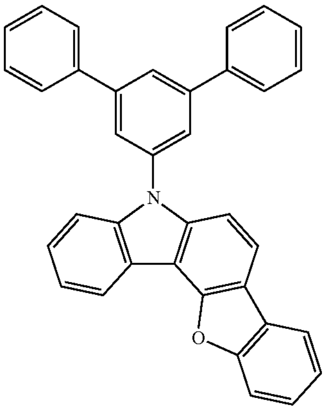
H43
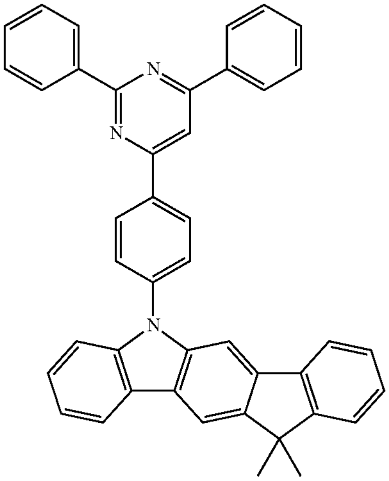
-continued
H44
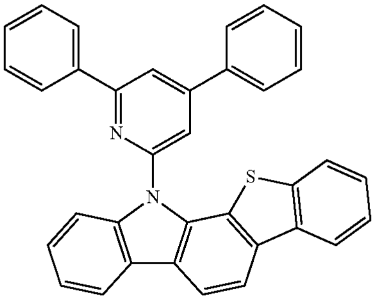
H45
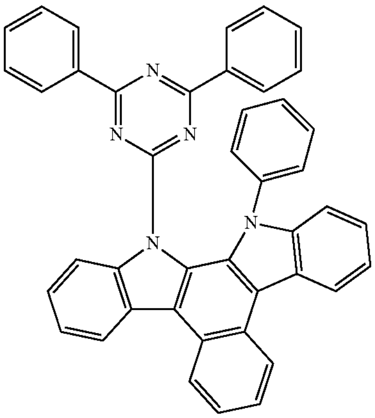
H46
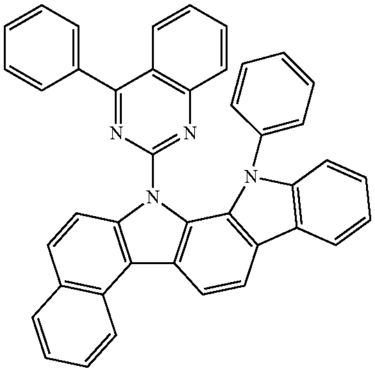
H47
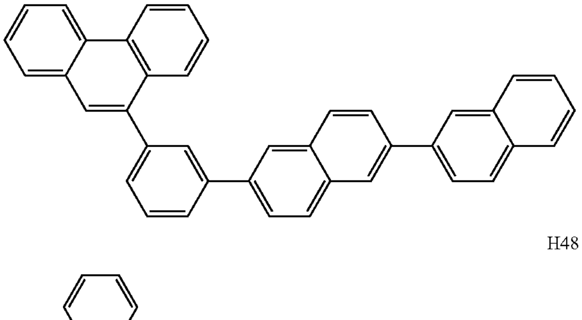
H48
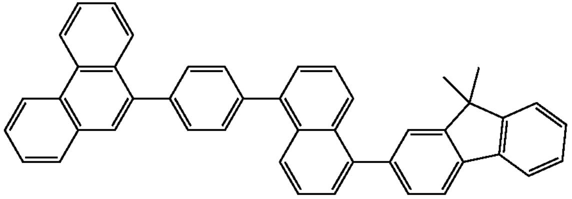

-continued
H49
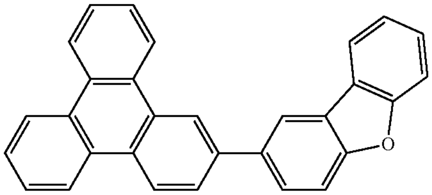
H50
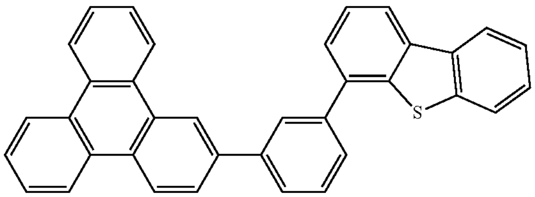
H51
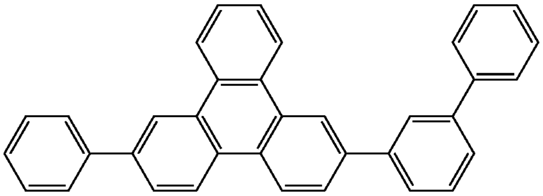
H52
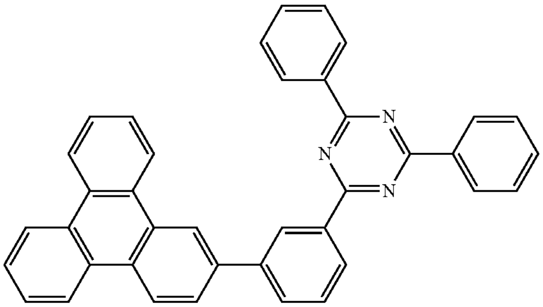
H53
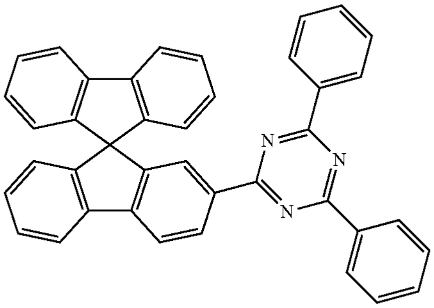
-continued
H54
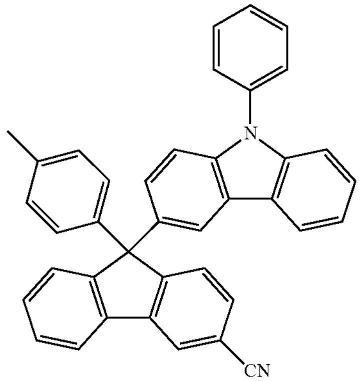
H55
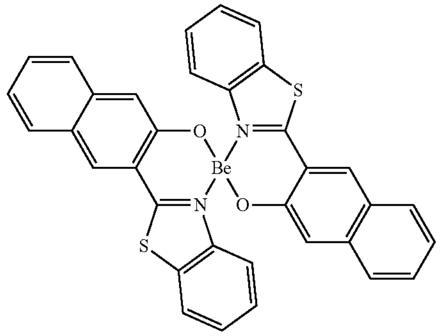
H56
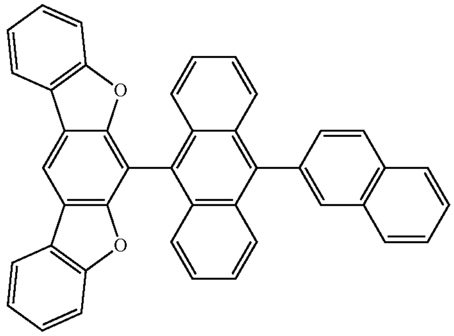
H57
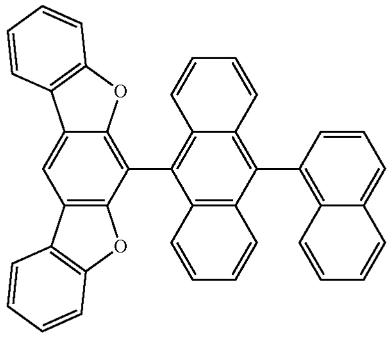

-continued
H58
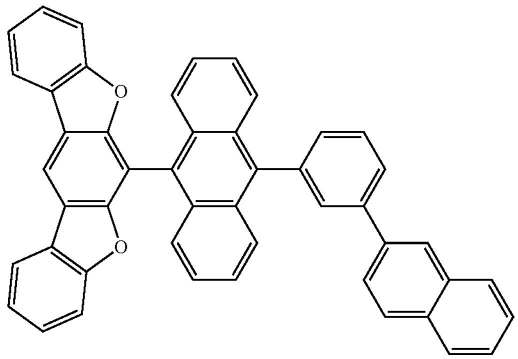
H59
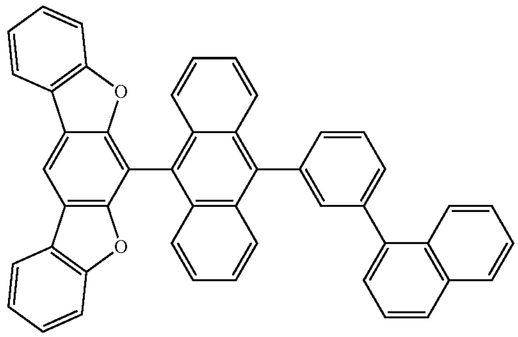
H60
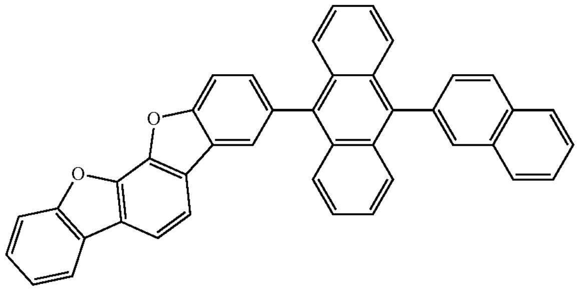
H61
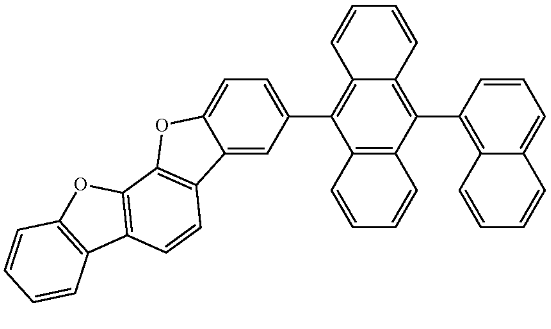
-continued
H62
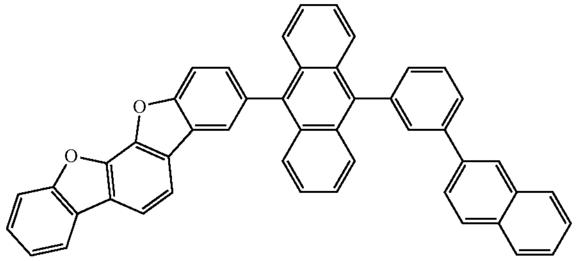
H63
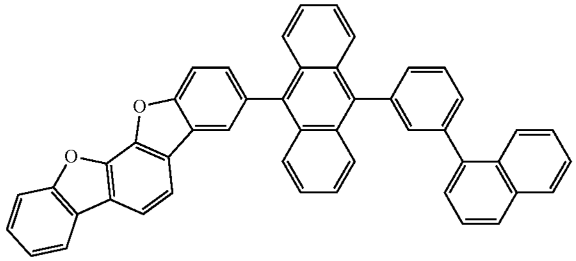
H64
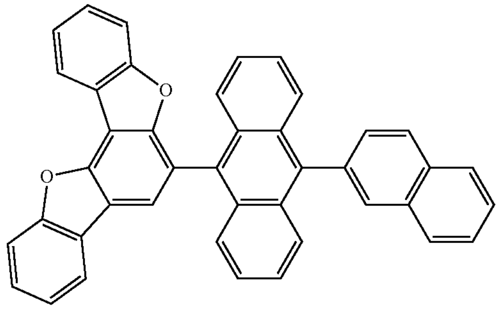
H65
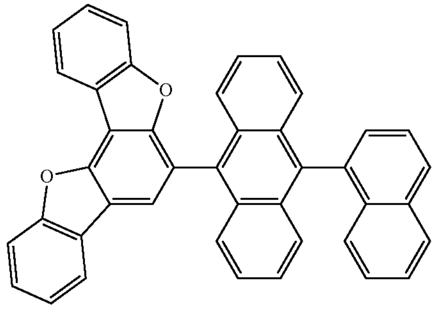
H66
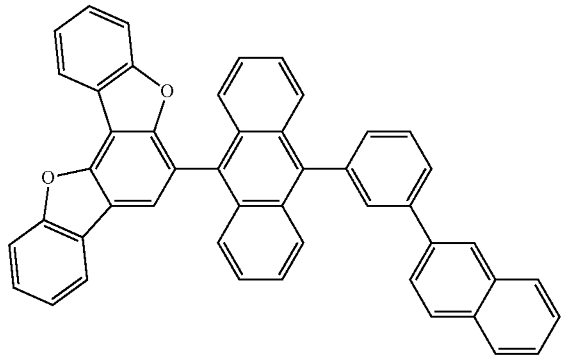

-continued
H67
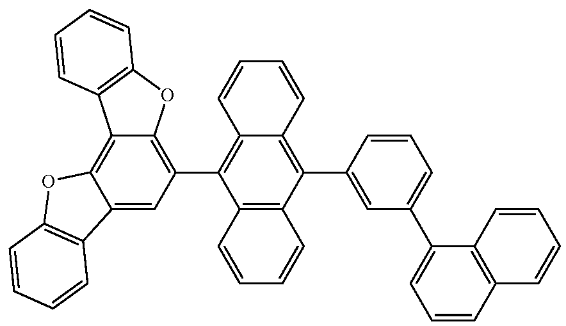
H68
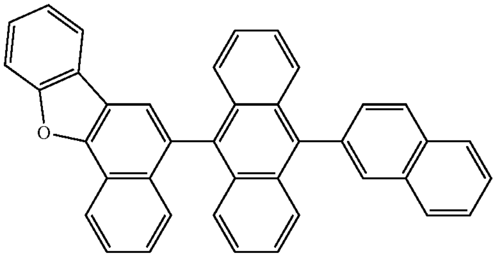
H69
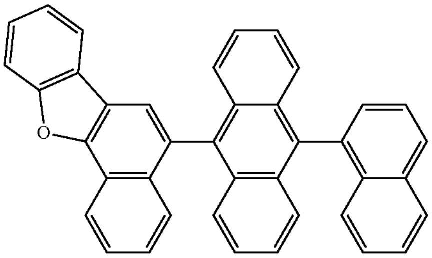
H70
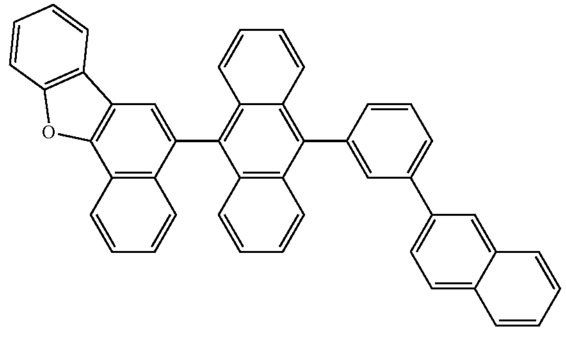
H71
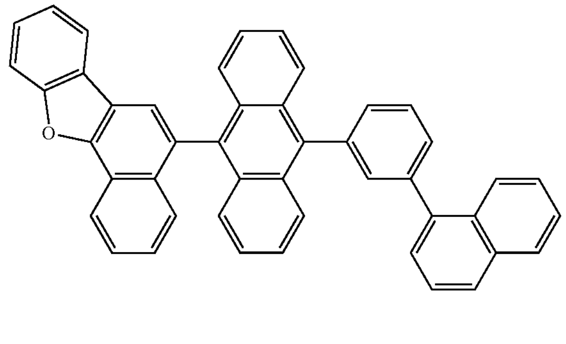
-continued
H72
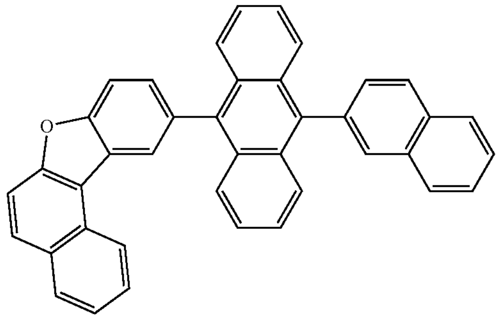
H73
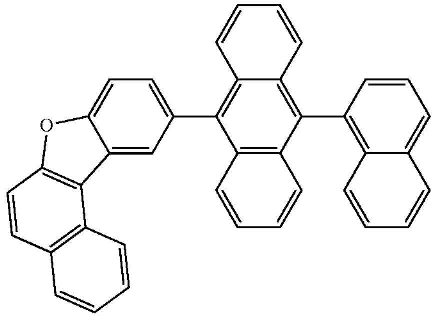
H74
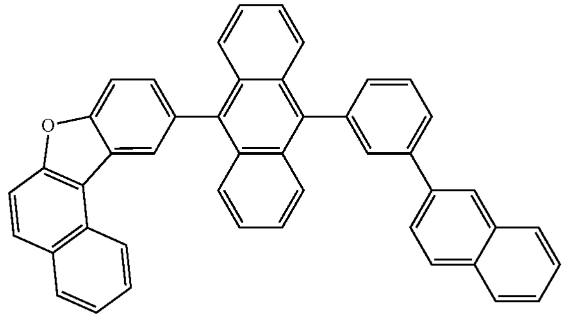
H75
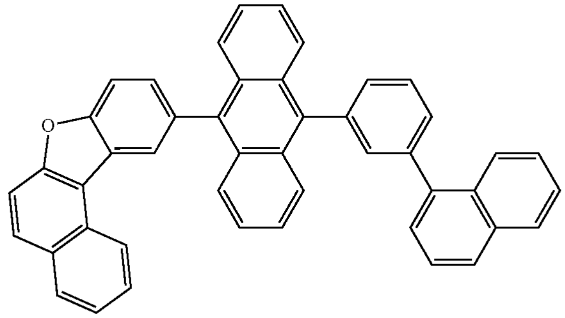
H76
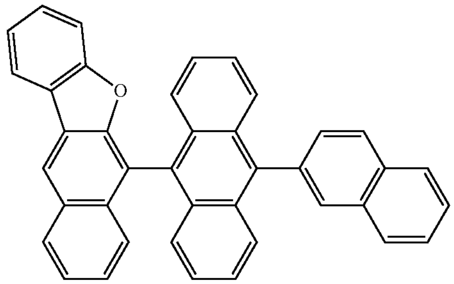

-continued
H77
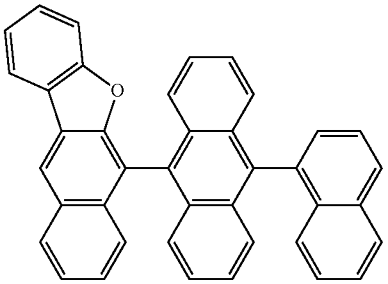
H78
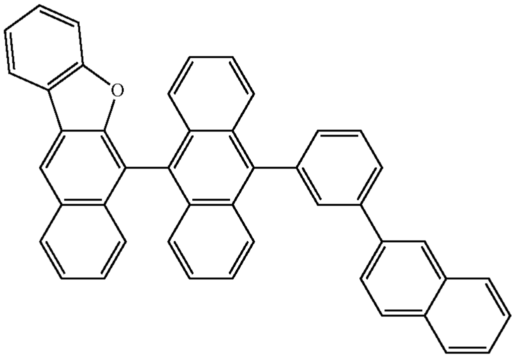
H79
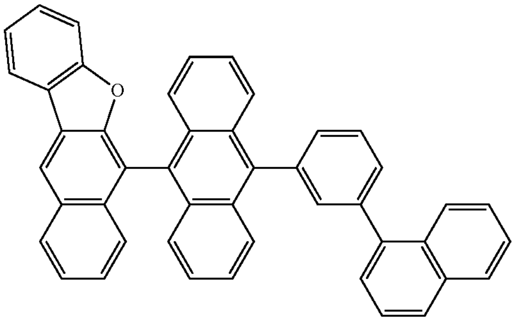
H80
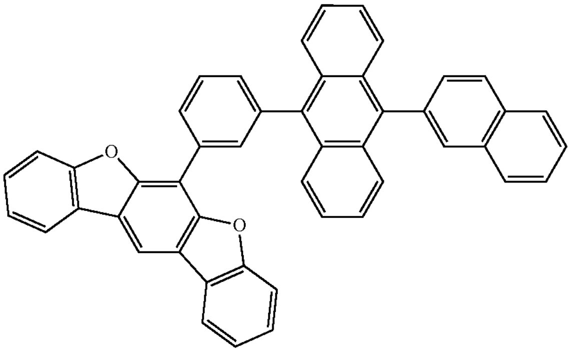
-continued
H81
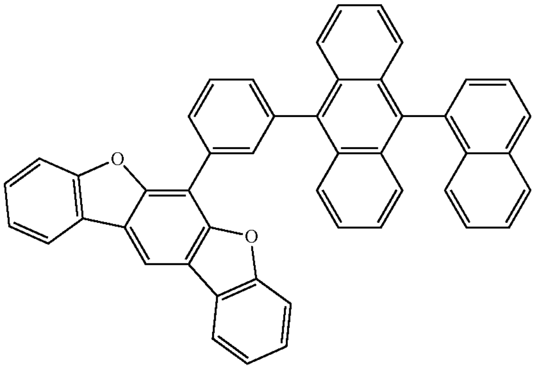
H82
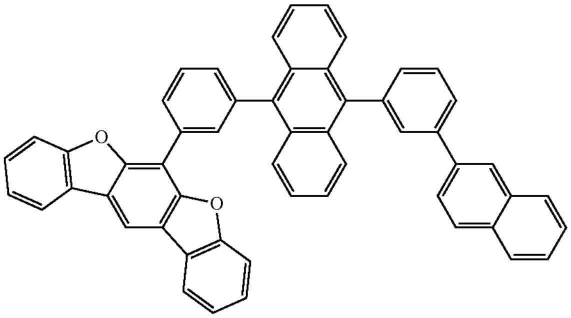
H83
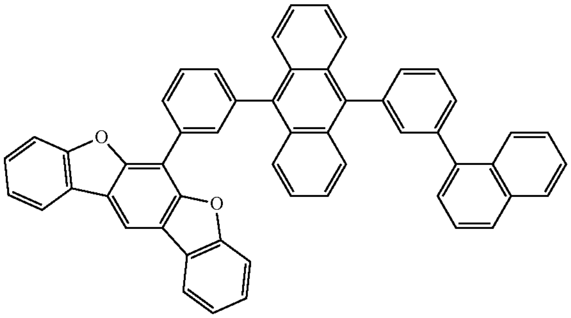
H84
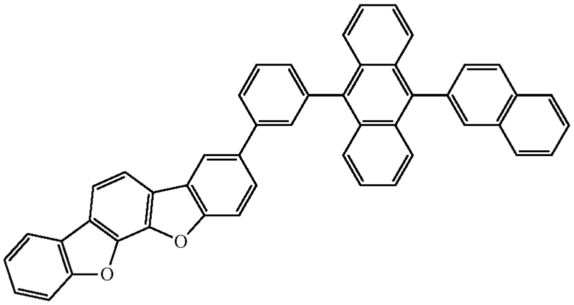

-continued
H85
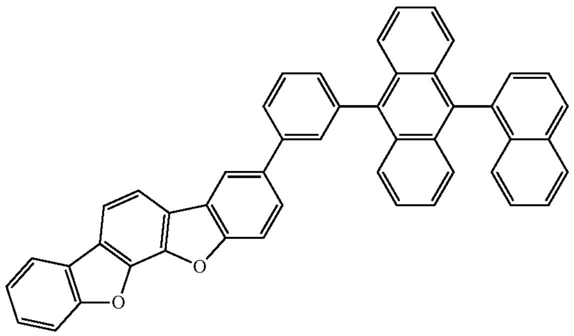
H86
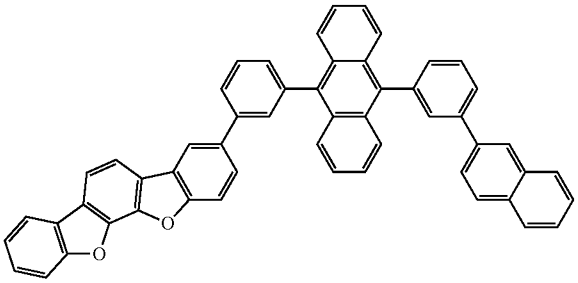
H87
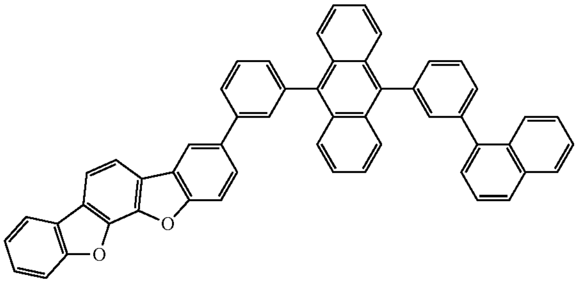
H88
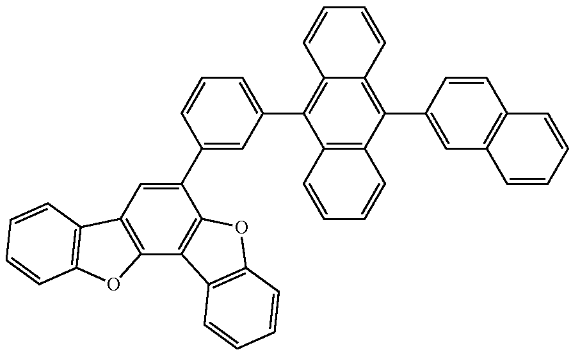
-continued
H89
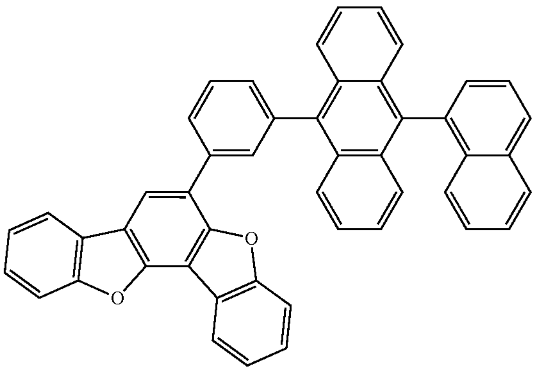
H90
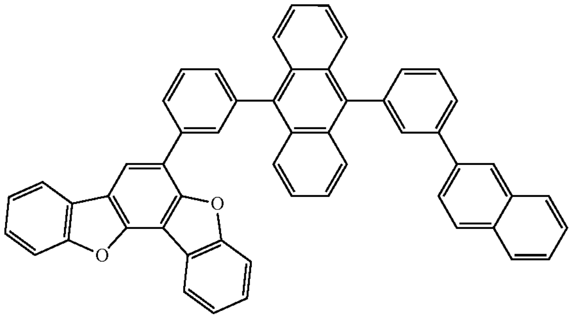
H91
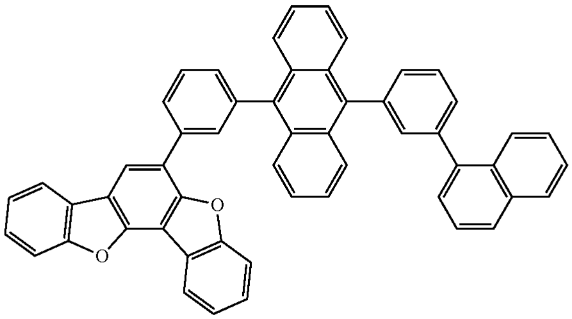
H92
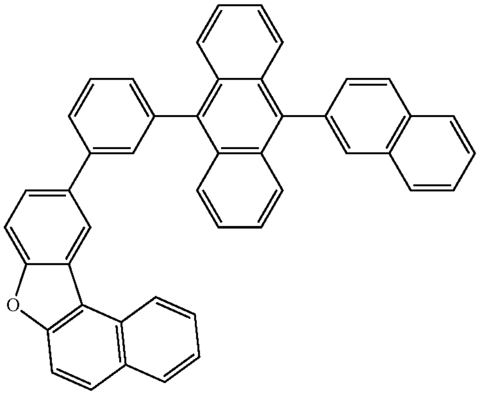

-continued
H93
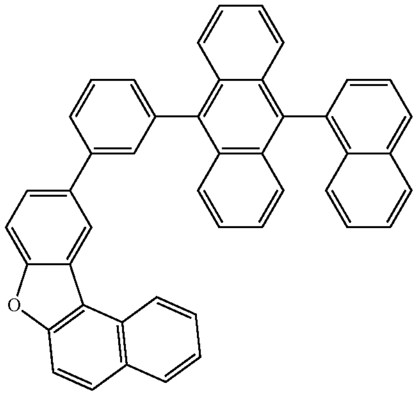
H94
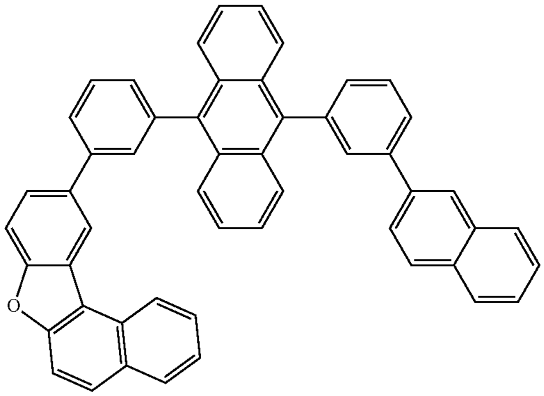
H95
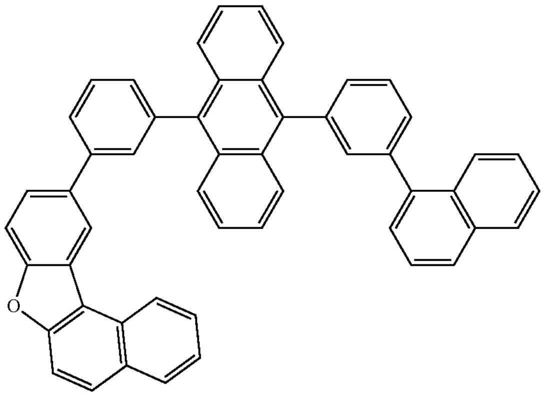
H96
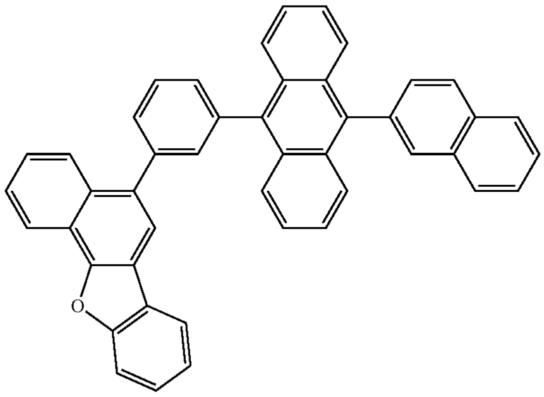
-continued
H97
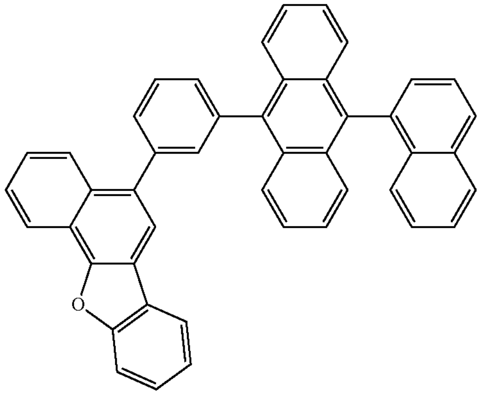
H98
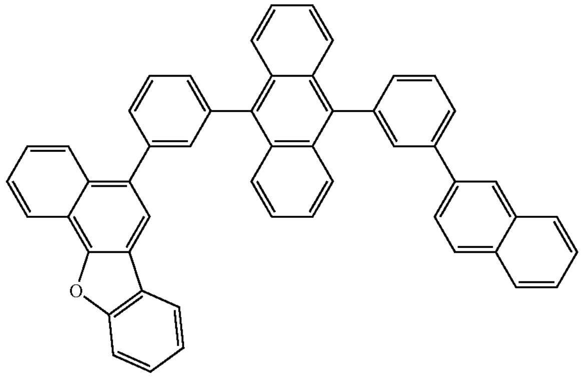
H99
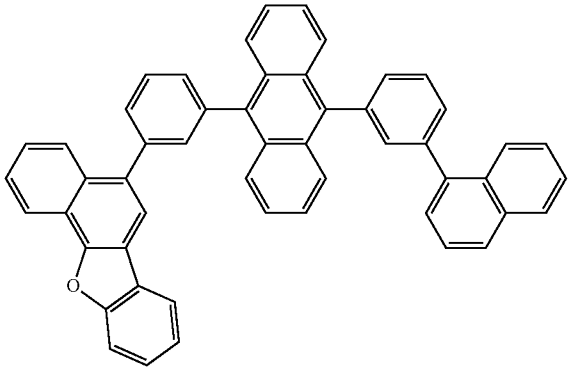
H100
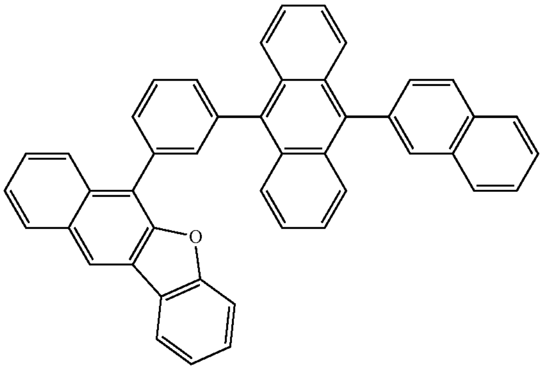

-continued
H101
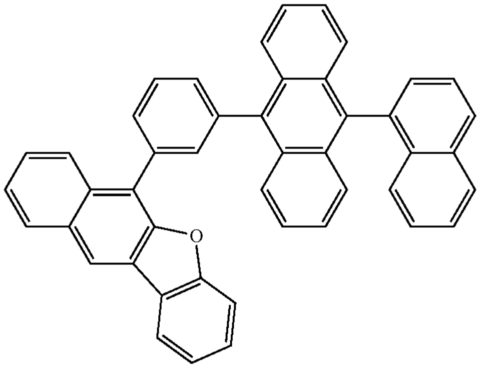
H102
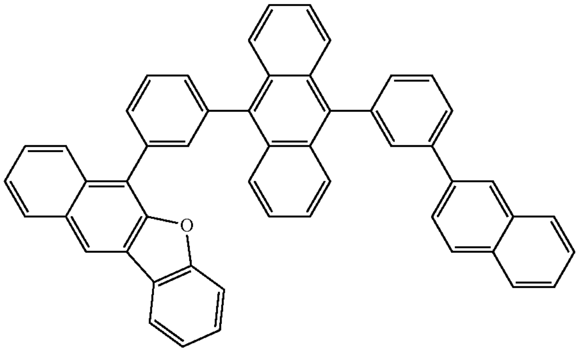
H103
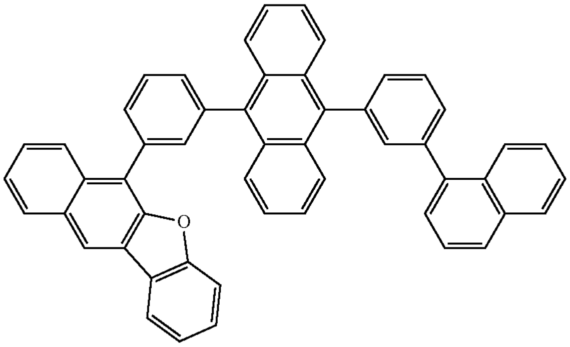
H104
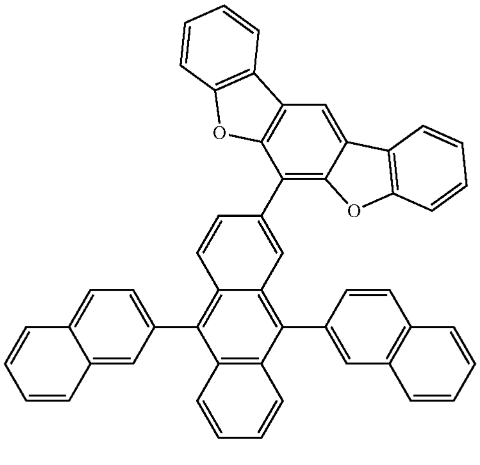
-continued
H105
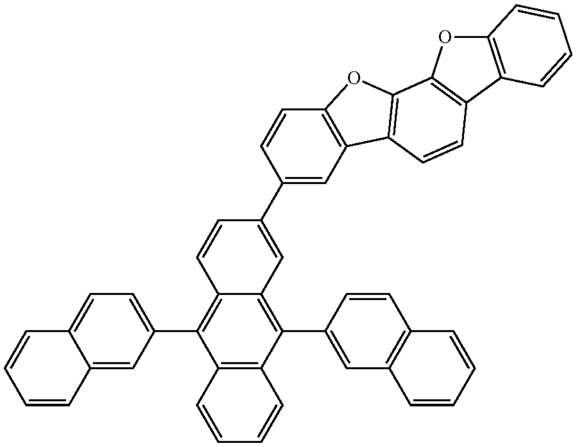
H106
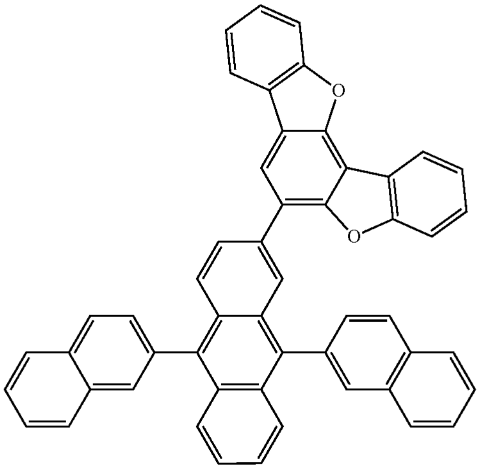
H107
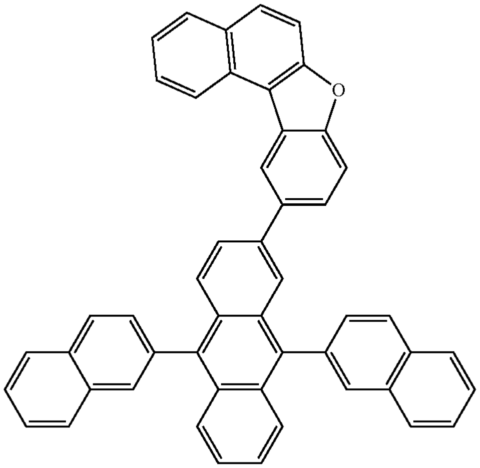

-continued
H108
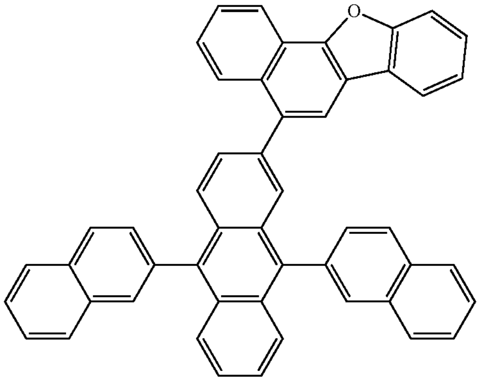
H109
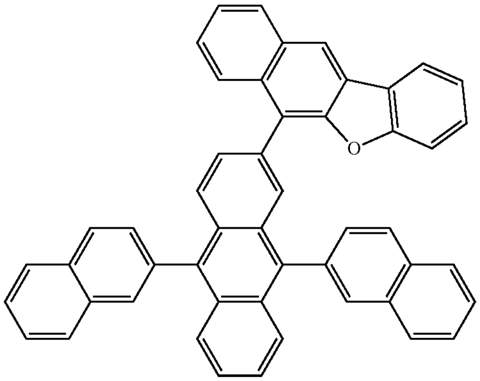
H110
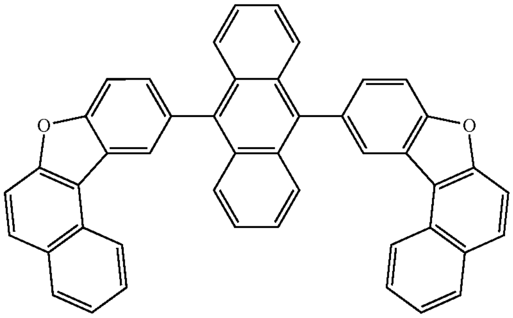
H111
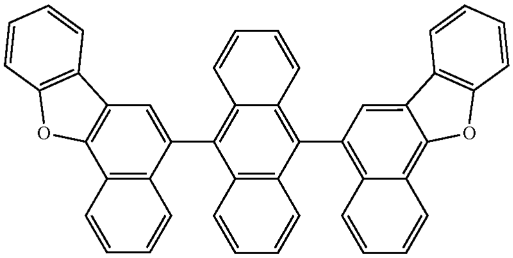
-continued
H112
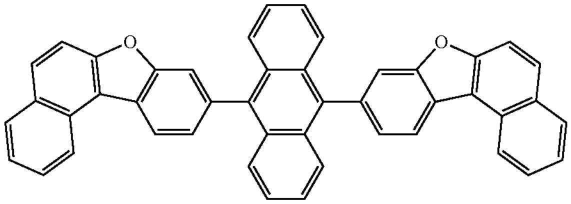
H113
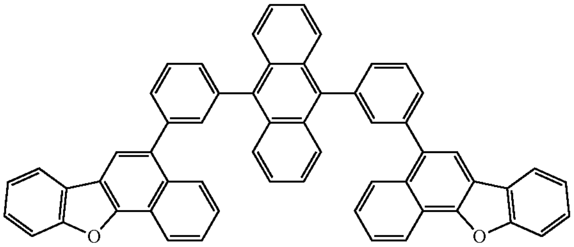
H114
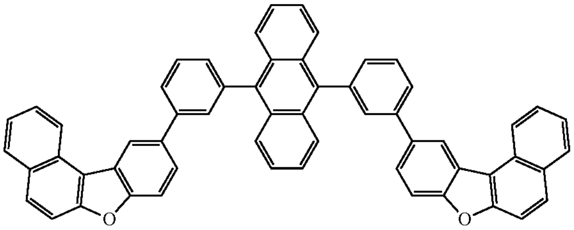
H115
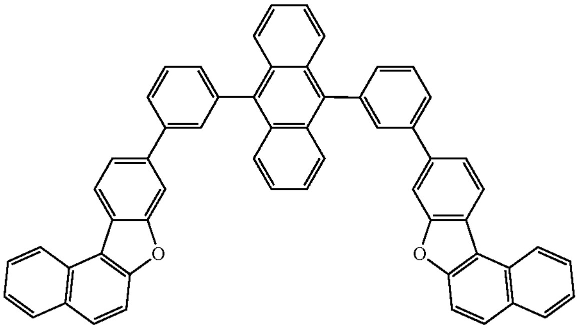
H116
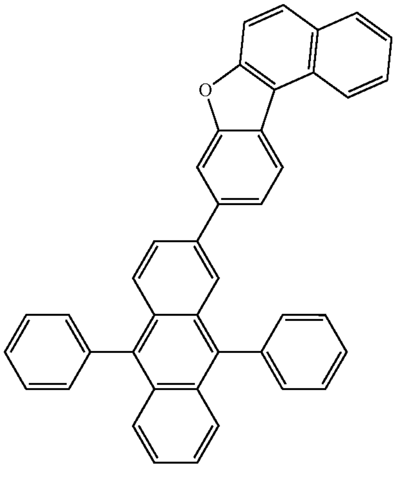

-continued
H117
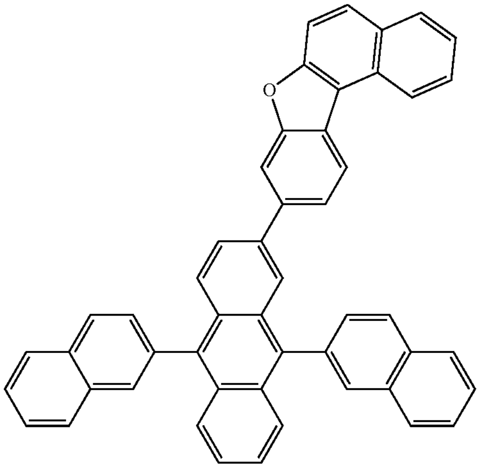
H118
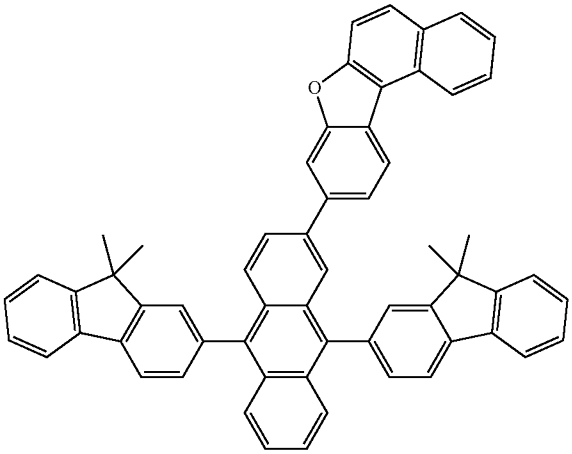
H119
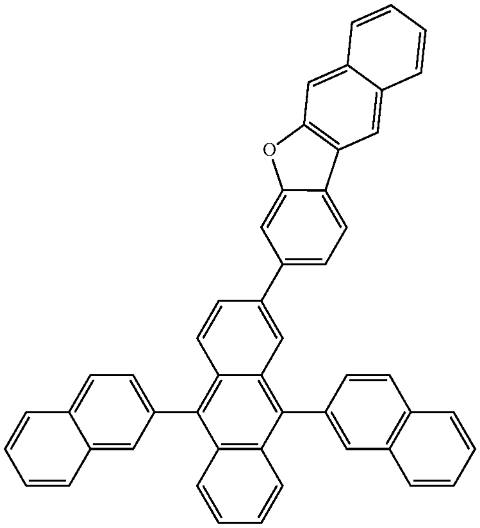
-continued
H120
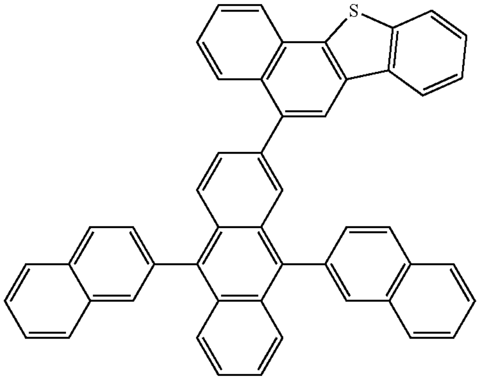
H121
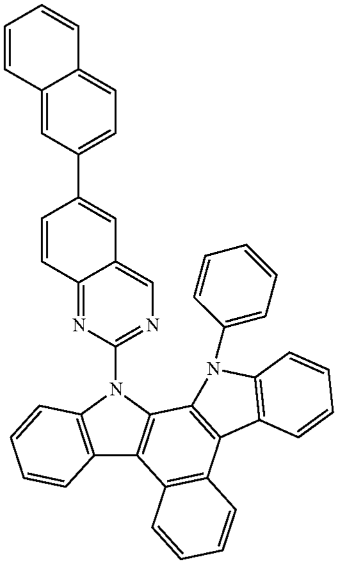
H122
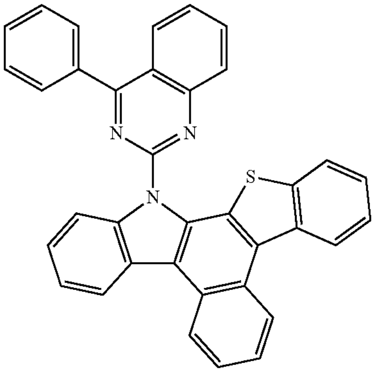

-continued

H123

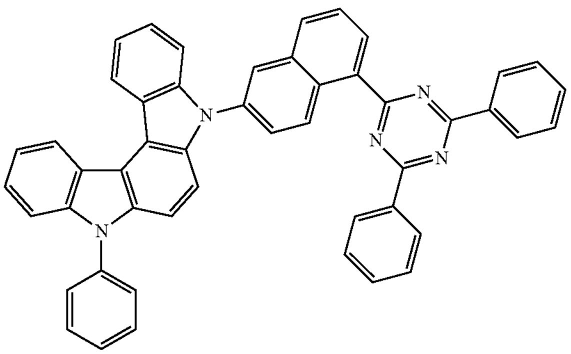

H124

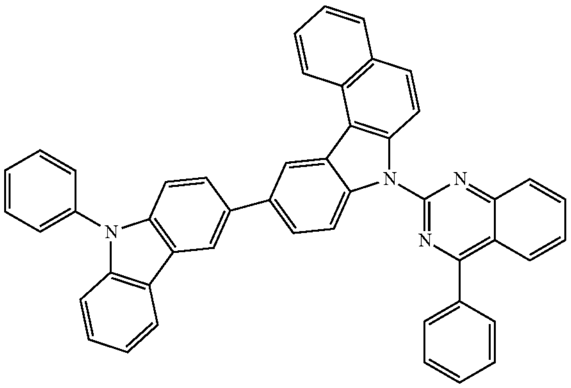

[Phosphorescent Dopant]

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In an embodiment, the phosphorescent dopant may include an organometallic compound represented by Formula 401:

[Formula 401]

$$M(L_{401})_{xc1}(L_{402})_{xc2}$$

[Formula 402]

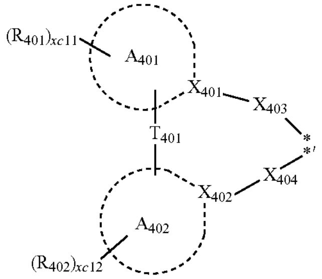

wherein, in Formulae 401 and 402,

M may be transition metal (for example, iridium (Ir), platinum (Pt), palladium (Pd), osmium (Os), titanium (Ti), gold (Au)hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein, when xc1 is 2 or more, two or more of $L_{401}$(s) may be identical to or different from each other, $L_{402}$ may be an organic ligand, xc2 may be 0, 1, 2, 3, or 4, and when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C($Q_{411}$)=*', $X_{403}$ and $X_{404}$ may each independently be a chemical bond (for example, a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ are the same as described in connection with $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ are the same as described in connection with xc11 and xc12 may each independently be an integer from 0 to 10, and and *' in Formula 402 each indicate a binding site to M in Formula 401.

In embodiments, in Formula 402, i) $X_{401}$ may be nitrogen, and $X_{402}$ may be carbon, or ii) each of $X_{401}$ and $X_{402}$ may be nitrogen.

In embodiments, when xc1 in Formula 402 is 2 or more, two ring $A_{401}$(s) in two or more $L_{401}$(s) may optionally be linked to each other via $T_{402}$, which is a linking group, or two ring $A_{402}$(s) in two or more $L_{401}$(s) may optionally be linked to each other via $T_{403}$, which is a linking group (see Compounds PD1 to PD4 and PD7). $T_{402}$ and $T_{403}$ are the same as described in connection with $T_{401}$.

$L_{402}$ in Formula 401 may be an organic ligand. In an embodiment, $L_{402}$ may be a halogen group, a diketone group (for example, an acetylacetonate group), a carboxylic acid group (for example, a picolinate group), —C(=O), an isonitril group, a —CN group, a phosphorus group (for example, a phosphine group or a phosphite group), or any combination thereof.

The phosphorescent dopant may include, for example, one of the following Compounds PD1 to PD25, or any combination:
PD1
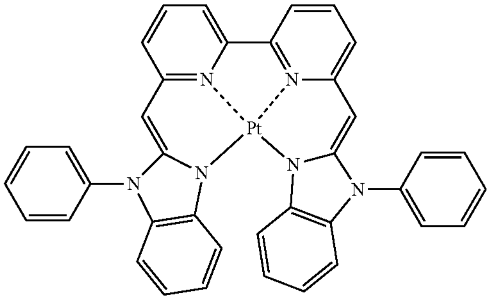
PD2
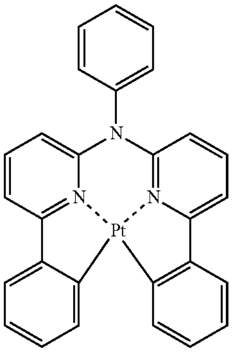
PD3
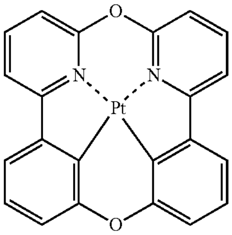
PD4
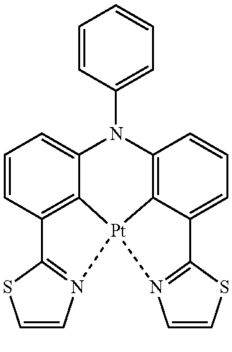
PD5
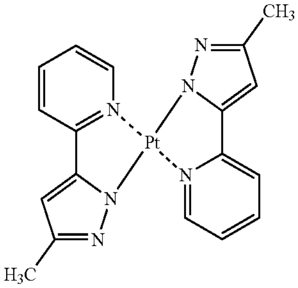
-continued
PD6
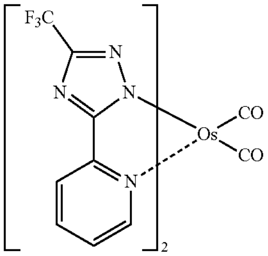
PD7
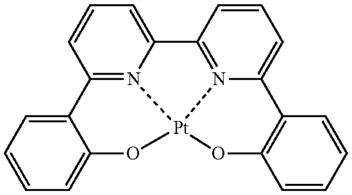
PD8
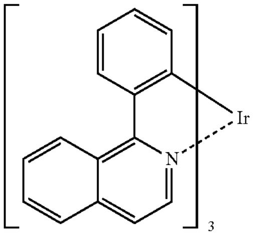
PD9
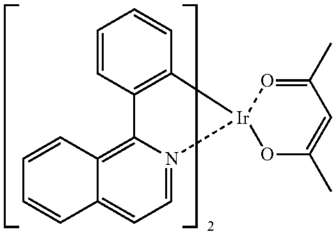
PD10
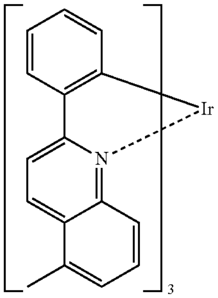
PD11
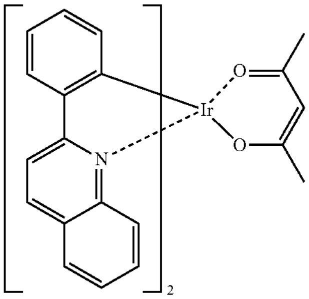

-continued
PD12
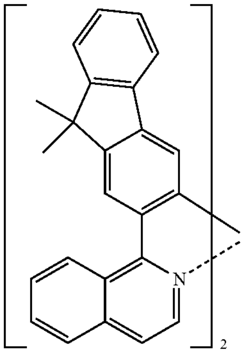
PD13
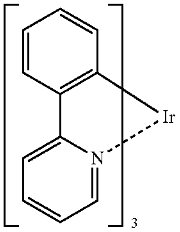
PD14
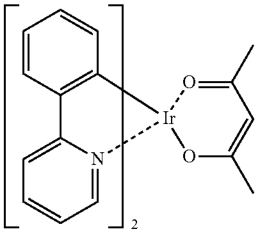
PD15
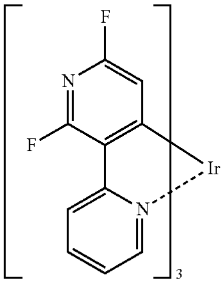
PD16
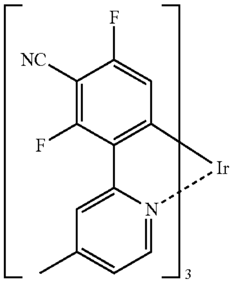
-continued
PD17
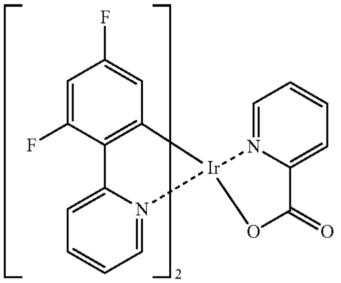
PD18
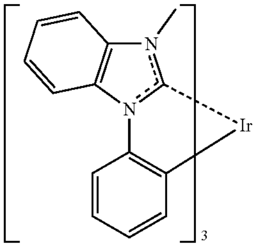
PD19
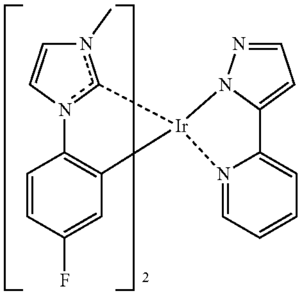
PD20
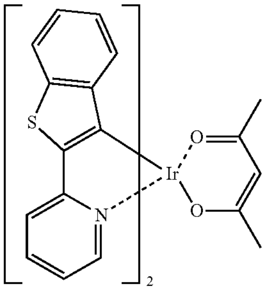
PD21
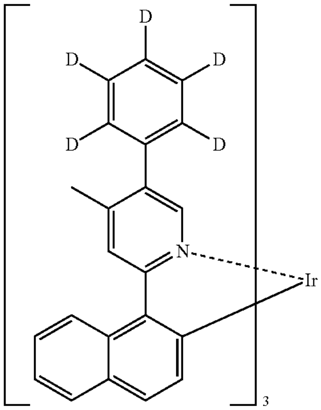

-continued

PD22

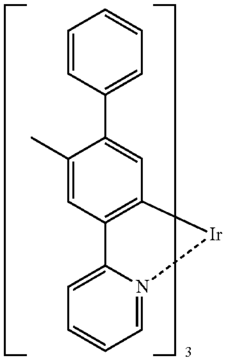

PD23

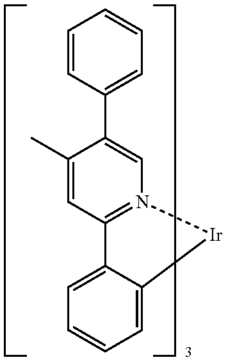

PD24

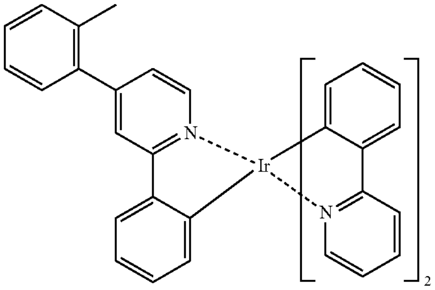

-continued

PD25

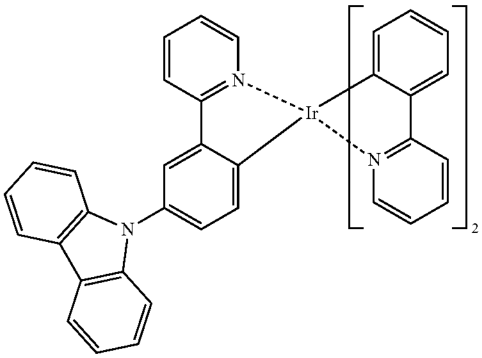

[Fluorescent Dopant]

The fluorescent dopant may include an amine group-containing compound, a styryl group-containing compound, or any combination thereof.

In an embodiment, the fluorescent dopant may include a compound represented by Formula 501:

[Formula 501]

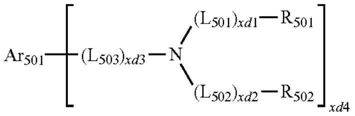

wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, xd4 may be 1, 2, 3, 4, 5, or 6.

In an embodiment, $Ar_{501}$ in Formula 501 may be a condensed cyclic group (for example, an anthracene group, a chrysene group, or a pyrene group) in which three or more monocyclic groups are condensed together.

In embodiments, xd4 in Formula 501 may be 2.

In an embodiment, the fluorescent dopant may include: one of Compounds FD1 to FD37; DPVBi; DPAVBi; or any combination thereof:

FD1
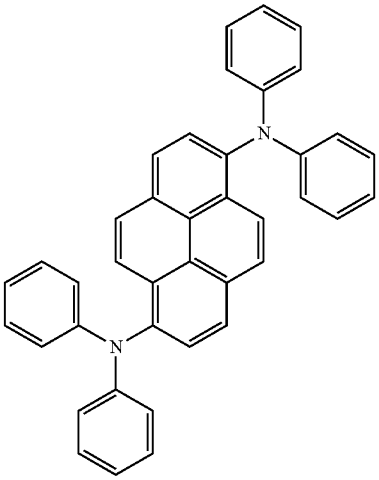
FD2
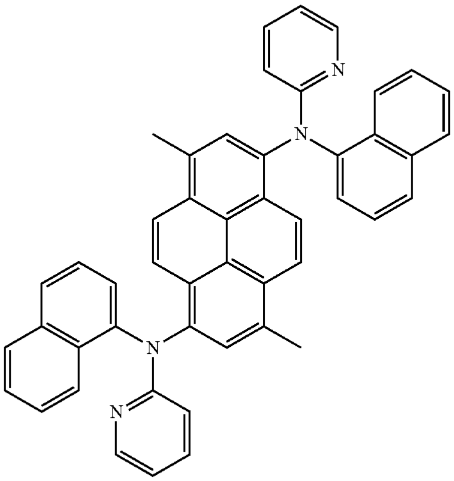
FD3
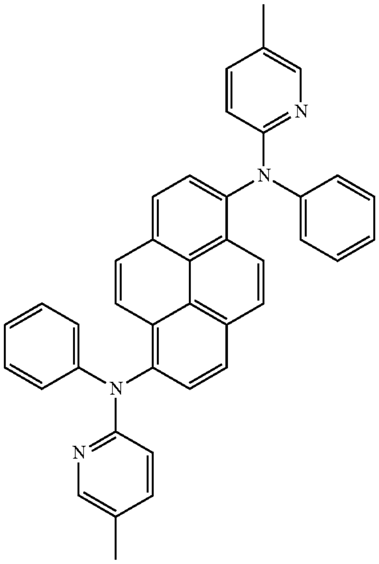
FD4
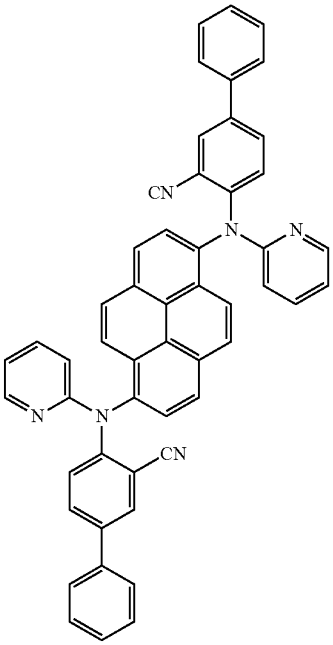
FD5
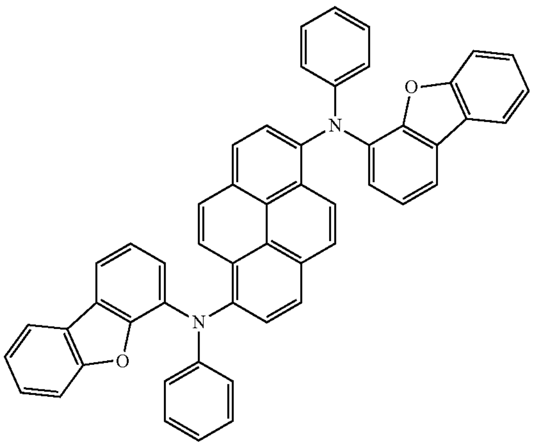
FD6
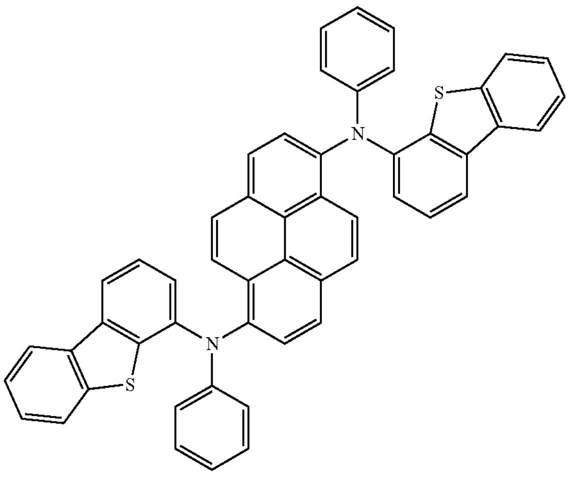

-continued
FD7
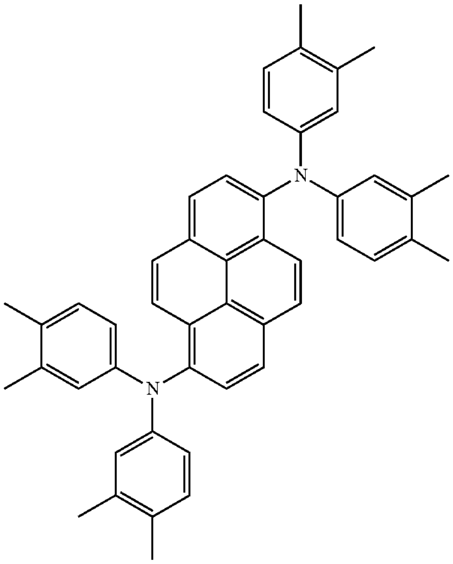
FD8
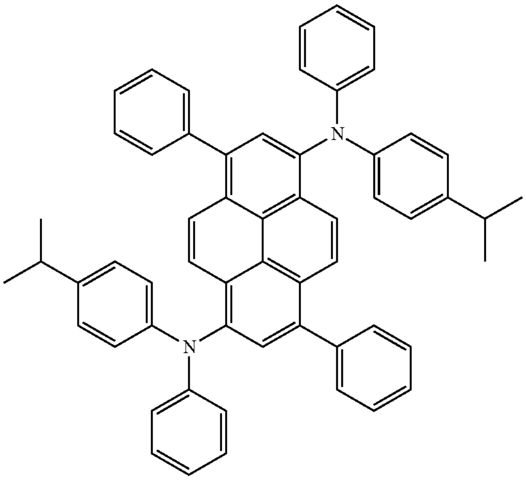
FD9
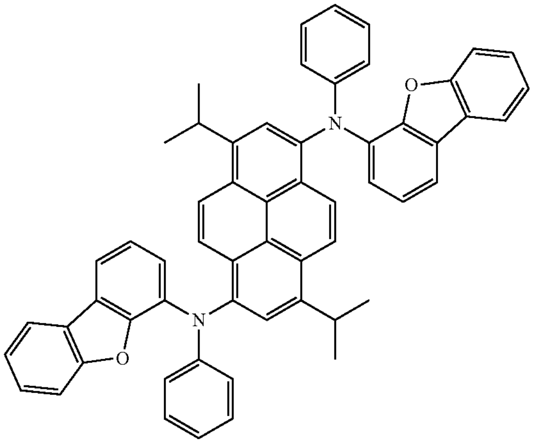
FD10
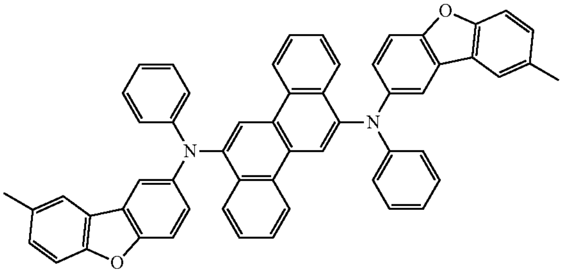
FD11
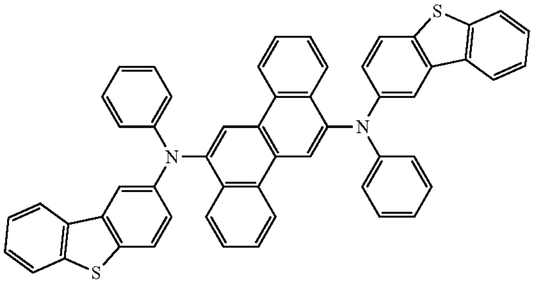
FD12
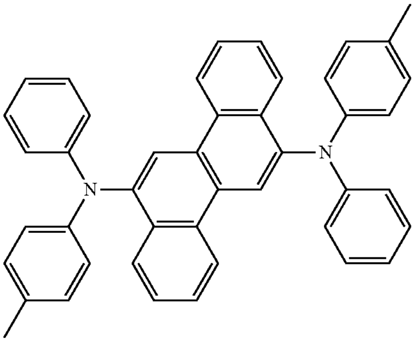

-continued
FD13
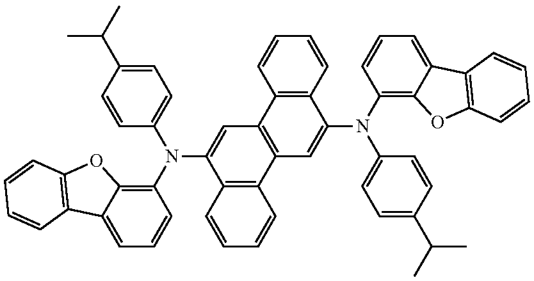
FD14
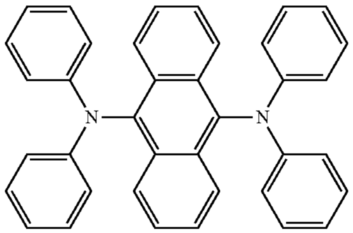
FD15
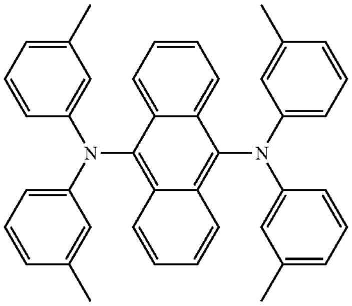
FD16
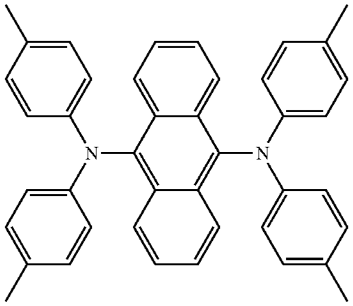
FD17
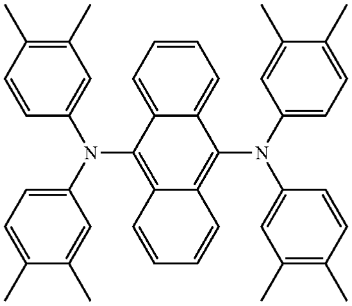
FD18
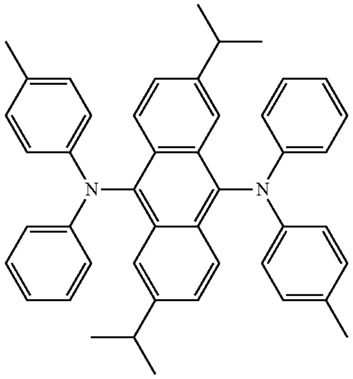
FD19
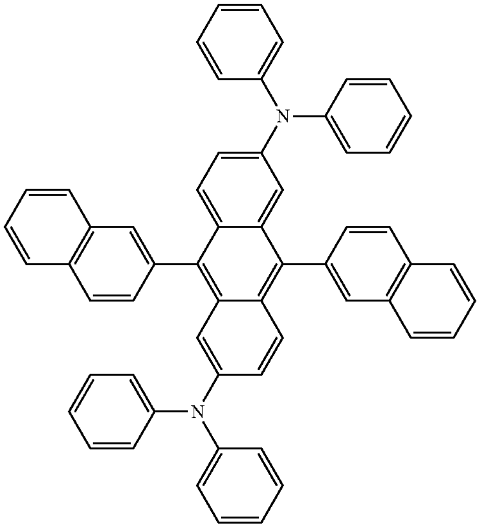
FD20
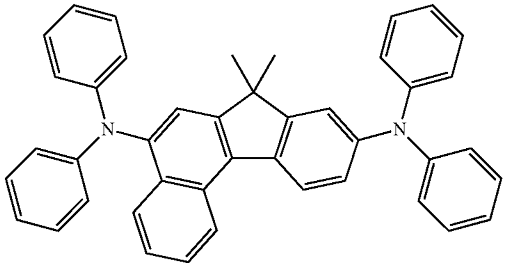

-continued
FD21
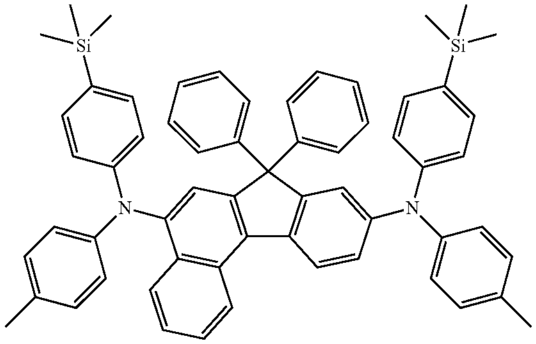
FD22
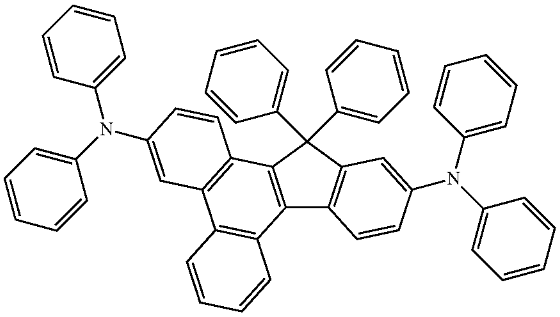
FD23
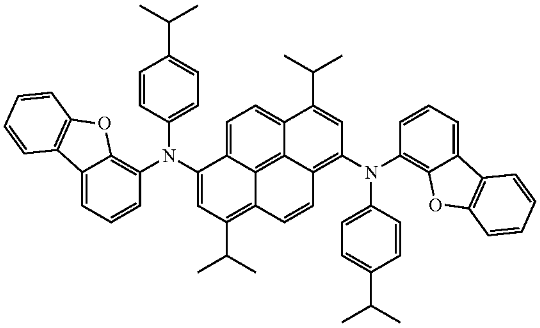
FD24
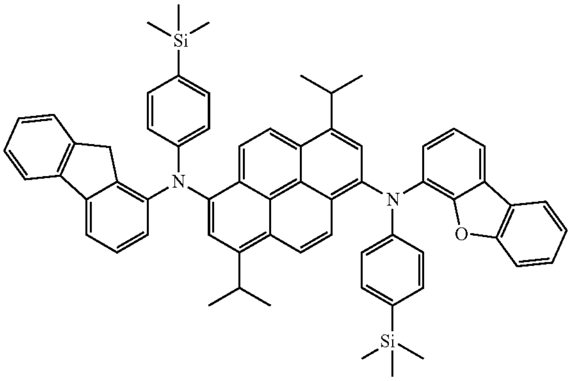
FD25
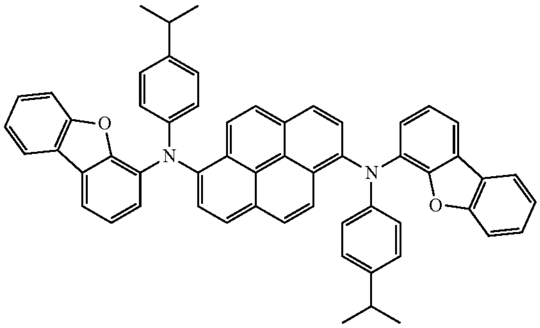
FD26
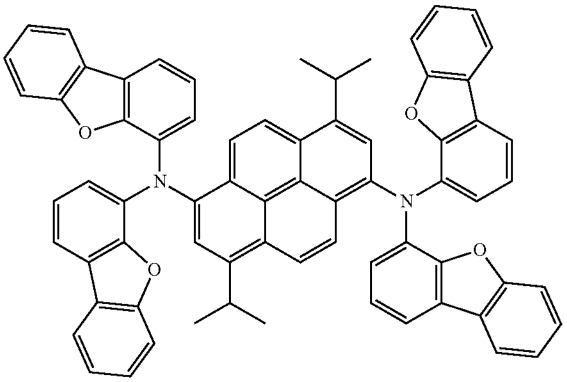
FD27
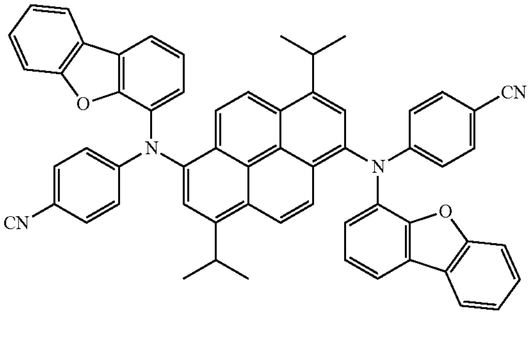
FD28
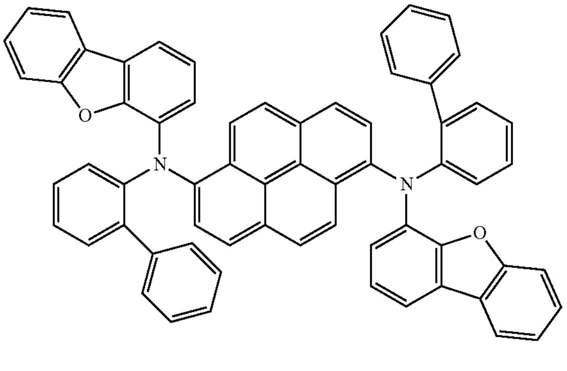

-continued
FD29
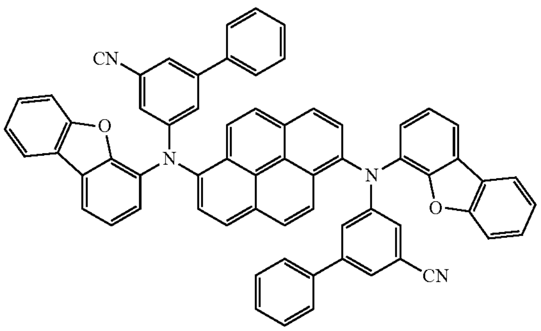
FD30
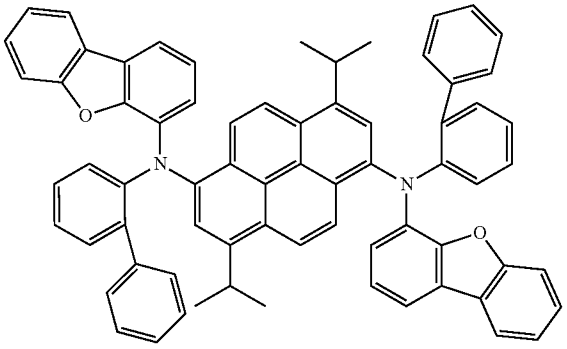
FD31
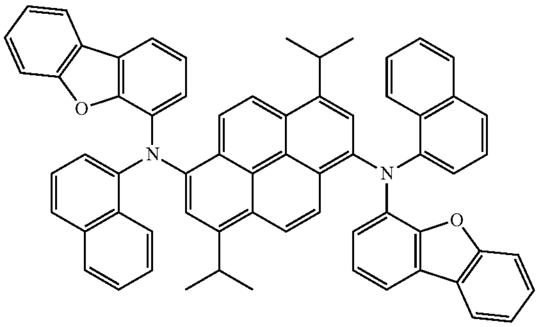
FD32
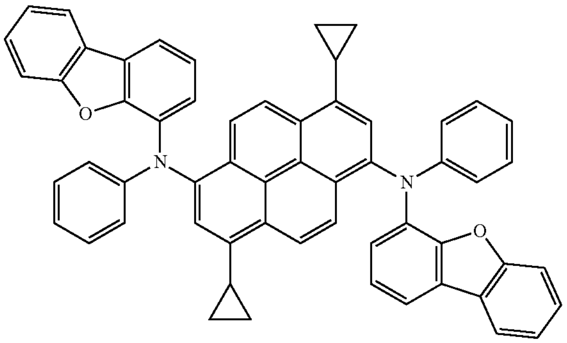
FD33
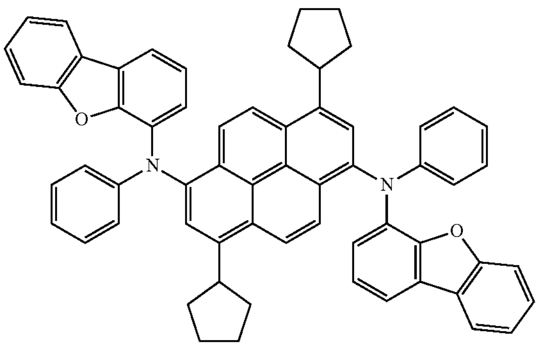
FD34
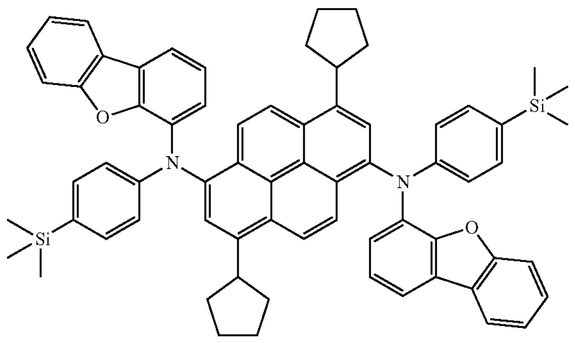
FD35
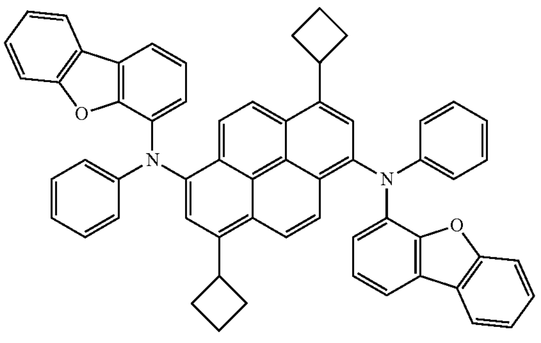
FD36
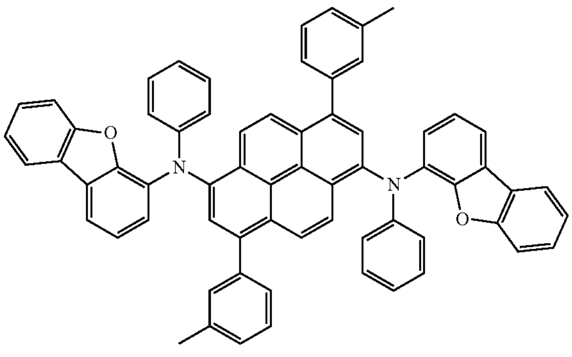

-continued

FD37

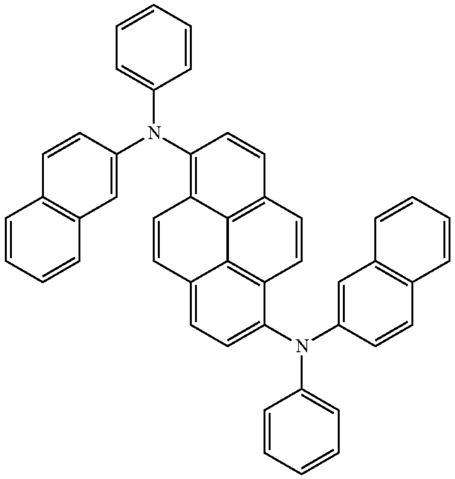

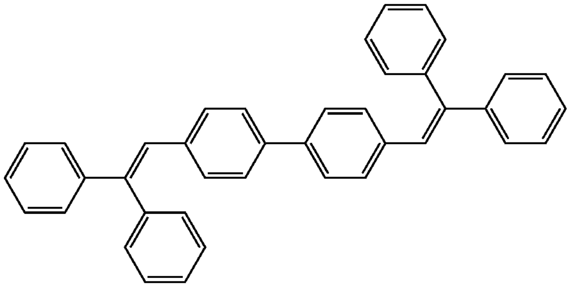

DPVBi

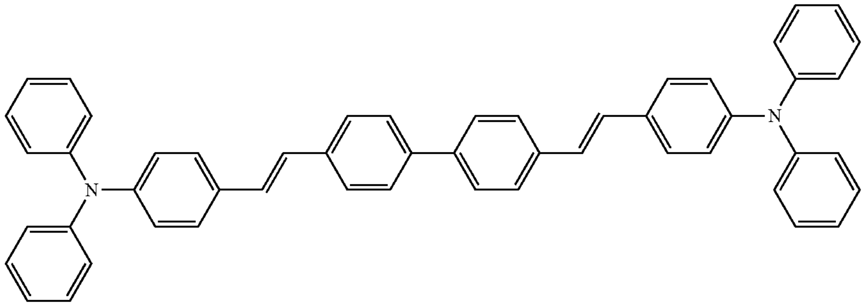

DPAVBi

[Delayed Fluorescence Material]

The emission layer 132 may include a delayed fluorescence material.

The delayed fluorescence material used herein may be any compound that is capable of emitting delayed fluorescence light based on a delayed fluorescence emission mechanism.

The delayed fluorescence material included in the emission layer 132 may act as a host or a dopant depending on the type of other materials included in the emission layer 132.

In an embodiment, the difference between the triplet energy level (eV) of the delayed fluorescence material and the singlet energy level (eV) of the delayed fluorescence material may be in a range of about 0 eV to about 0.5 eV. When the difference between the triplet energy level (eV) of the delayed fluorescence material and the singlet energy level (eV) of the delayed fluorescence material satisfies the above-described range, up-conversion in which the delayed fluorescence materials transfer from the triplet state to the singlet state may effectively occur, and thus, the luminescence efficiency of the light-emitting device 10 may be improved.

In an embodiment, the delayed fluorescence material may include i) a material that includes at least one electron donor (for example, a π electron-rich $C_3$-$C_{60}$ cyclic group, such as a carbazole group) and at least one electron acceptor (for example, a sulfoxide group, a cyano group, or a π electron-deficient nitrogen-containing $C_1$-$C_{60}$ cyclic group), or ii) a material including a $C_8$-$C_{60}$ polycyclic group in which two or more cyclic groups share boron (B) and are condensed with each other.

The delayed fluorescence material may include at least one of compounds DF1 to DF9:

DF1

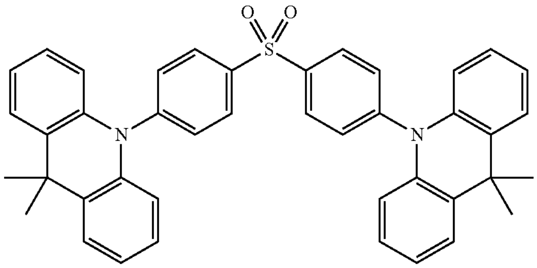

(DMAC-DPS)

-continued
DF2
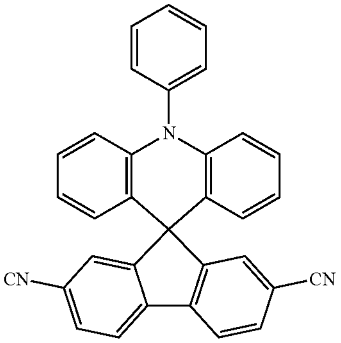
(ACRFLCN)
DF3
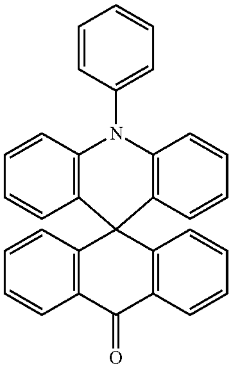
(ACRSA)
DF4
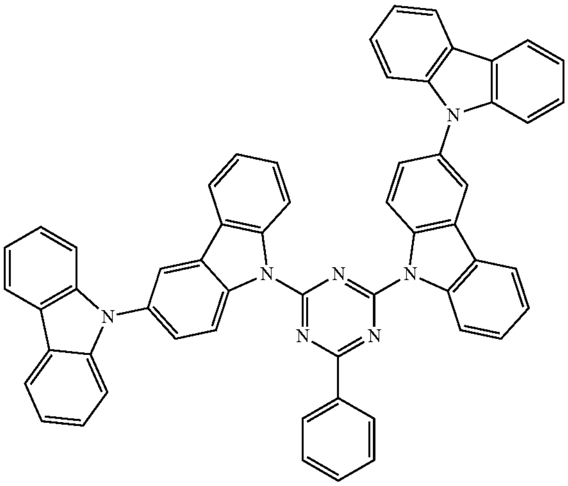
(CC2TA)
-continued
DF5
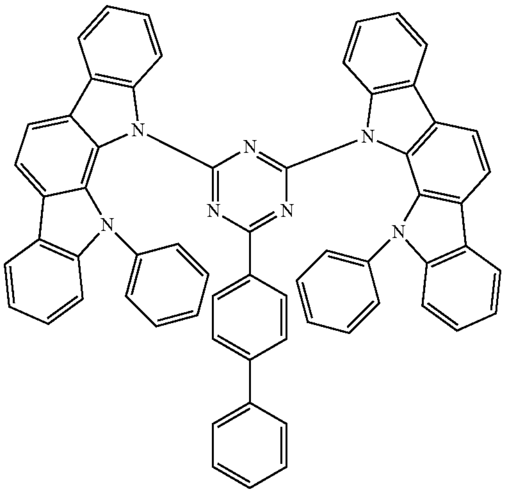
(PIC-TRZ)
DF6
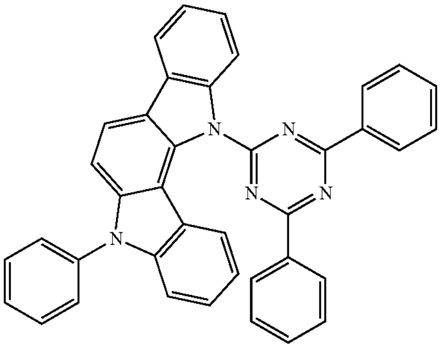
(PIC-TRZ2)
DF7
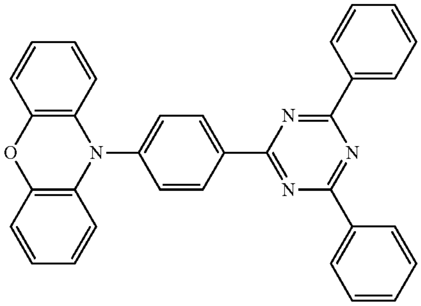
(PXZ-TRZ)
DF8
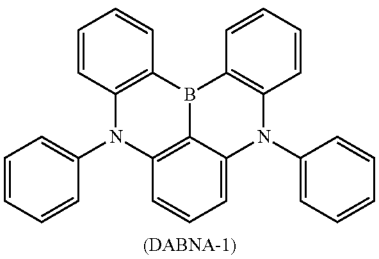
(DABNA-1)

-continued

DF9

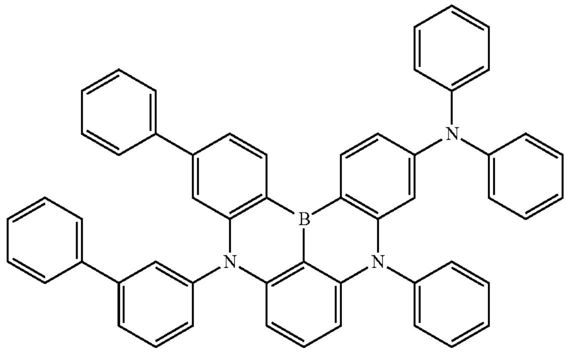

(DABNA-2)

[Quantum Dot]

In embodiments, the emission layer 132 may include a quantum dot.

The quantum dot used herein refers to the crystal of a semiconductor compound, and may include any material that is capable of emitting light of various emission wavelengths depending on the size of the crystal.

A diameter of the quantum dot may be, for example, in a range of about 1 nm to about 10 nm.

The quantum dot may be synthesized by a wet chemical process, an organometallic chemical vapor deposition process, a molecular beam epitaxy process, or a process that is similar to these processes.

The wet chemical process refers to a method in which an organic solvent and a precursor material are mixed, and a quantum dot particle crystal is grown. When the crystal grows, the organic solvent acts as a dispersant naturally coordinated on the surface of the quantum dot crystal and controls the growth of the crystal. Accordingly, by using a process that is easily performed at low costs compared to a vapor deposition process, such as a metal organic chemical vapor deposition (MOCVD) process and a molecular beam epitaxy (MBE) process, the growth of quantum dot particles may be controlled.

The quantum dot may include Groups II-VI semiconductor compounds, Groups III-V semiconductor compounds, Groups III-VI semiconductor compounds, Group semiconductor compounds, Groups IV-VI semiconductor compounds, a Group IV element or compound; or any combination thereof.

Examples of the Groups II-VI semiconductor compound are a binary compound, such as CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; and any combination thereof.

Examples of the Groups III-V semiconductor compounds are a binary compound, such as GaN, GaP, GaAs, GaSb, AlN, AlP, AlAs, AlSb, InN, InP, InAs, or InSb; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, or GaAlNP; a quaternary compound, such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; and any combination thereof. The Groups III-V semiconductor compounds may further include a Group II element. Examples of the Groups III-V semiconductor compounds further including a Group II element are InZnP, InGaZnP, and InAlZnP.

Examples of the Groups III-VI semiconductor compound are a binary compound, such as GaS, GaSe, $Ga_2Se_3$, GaTe, InS, InSe, $In_2S_3$, $In_2Se_3$, or InTe; a ternary compound, such as $InGaS_3$, or $InGaSe_3$; and any combination thereof.

Examples of the Groups I-III-VI semiconductor compounds are a ternary compound, such as AgInS, $AgInS_2$, CuInS, $CuInS_2$, $CuGaO_2$, $AgGaO_2$, or $AgAlO_2$; and any combination thereof.

Examples of the Group IV-VI semiconductor compounds are a binary compound, such as SnS, SnSe, SnTe, PbS, PbSe, or PbTe; a ternary compound, such as SnSeS, SnSeTe, SnSTe, PbSeS, PbSeTe, PbSTe, SnPbS, SnPbSe, or SnPbTe; a quaternary compound, such as SnPbSSe, SnPbSeTe, or SnPbSTe; and any combination thereof.

In an embodiment, the Group IV element or compound may include a single element compound, such as Si or Ge; a binary compound, such as SiC or SiGe; or any combination thereof.

Each element included in the multi-element compound such as the binary compound, a ternary compound, and a quaternary compound may be present, in a particle, at a uniform concentration or a non-uniform concentration.

The quantum dot may have a single structure having a uniform concentration of each element included in the corresponding quantum dot or a dual structure of a core-shell. In an embodiment, the material included in the core may be different from the material included in the shell.

The shell of the quantum dot may function as a protective layer for maintaining semiconductor characteristics by preventing chemical degeneration of the core and/or may function as a charging layer for imparting electrophoretic characteristics to the quantum dot. The shell may be a single layer or a multilayer. An interface between the core and the shell may have a concentration gradient in which the concentration of elements existing in the shell decreases toward the center.

Examples of the shell of the quantum dot may be an oxide of metal, metalloid, or non-metal, a semiconductor compound, and any combination thereof. Examples of the oxide of metal, metalloid, or non-metal are a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound, such as $MgAl_2O_4$, $CoFe_2O_4$, $NiFe_2O_4$, or $CoMn_2O_4$; and any combination thereof. Examples of the semiconductor compound are, as described herein, Groups II-VI semiconductor compounds; Groups III-V semiconductor compounds; Groups III-VI semiconductor compounds; Group semiconductor compounds; Groups IV-VI semiconductor compounds; and any combination thereof. In an embodiment, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of an emission wavelength spectrum of the quantum dot may be equal to or less than about 45 nm. For example, the FWHM of an emission wavelength spectrum of the quantum dot may be equal to or less than about 40 nm. For example, the FWHM of an emission wavelength spectrum of the quantum dot may be equal to or less than about 30 nm. When the FWHM of the emission wavelength spectrum of the quantum dot is within this range, color purity or color reproduction may be improved. Light emitted through such quantum dots may be irradiated omnidirectionally. Accordingly, a wide viewing angle may be increased.

The quantum dot may be a spherical, a pyramidal, a multi-arm, or a cubic nanoparticle, a nanotube, a nanowire, a nanofiber, or a nanoplate particle.

By adjusting the size of the quantum dot, the energy band gap may also be adjusted, thereby obtaining light of various wavelengths in the quantum dot emission layer. Therefore, by using quantum dots of different sizes, a light-emitting device that emits light of various wavelengths may be implemented. In an embodiment, the size of the quantum dot may be selected to emit red, green and/or blue light. The size of the quantum dot may be adjusted such that light of various colors are combined to emit white light.

[Electron Transport Region 133 in Interlayer 130]

The electron transport region 133 may have: i) a single-layered structure consisting of a single layer consisting of a single material, ii) a single-layered structure consisting of a single layer consisting of different materials, or iii) a multi-layered structure including multiple layers including different materials.

The electron transport region 133 may include a buffer layer, a hole blocking layer, an electron control layer, an electron transport layer, an electron injection layer, or any combination thereof.

In an embodiment, the electron transport region 133 may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein, for each structure, constituting layers are sequentially stacked from an emission layer.

The electron transport region (for example, the buffer layer, the hole blocking layer, the electron control layer, or the electron transport layer in the electron transport region) may include a metal-free compound including at least one π electron-deficient nitrogen-containing $C_1$-$C_{60}$ cyclic group.

In an embodiment, the electron transport region 133 may include a compound represented by Formula 601 below:

$[Ar_{601}]_{xe11}$-$[(L_{601})_{xe1}$-$R_{601}]_{xe21}$ [Formula 601]

wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(=O)($Q_{601}$), —S(=O)$_2$($Q_{601}$), or —P(=O)($Q_{601}$)($Q_{602}$), $Q_{601}$ to $Q_{603}$ are the same as described in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

In embodiments, when xe11 in Formula 601 is 2 or more, two or more of $Ar_{601}$(s) may be linked to each other via a single bond.

In an embodiment, $Ar_{601}$ in Formula 601 may be a substituted or unsubstituted anthracene group.

In an embodiment, the electron transport region 133 may include a compound represented by Formula 601-1:

[Formula 601-1]

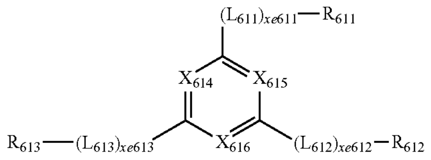

wherein, in Formula 601-1, $X_{614}$ may be N or C($R_{614}$), $X_{615}$ may be N or C($R_{615}$), $X_{616}$ may be N or C($R_{616}$), and at least one of $X_{614}$ to $X_{616}$ may be N, $L_{611}$ to $L_{613}$ may be understood by referring to the description presented in connection with $L_{601}$, xe611 to xe613 may be understood by referring to the description presented in connection with xe1, $R_{611}$ to $R_{613}$ may be understood by referring to the description presented in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In an embodiment, xe1 and xe611 to xe613 in Formulae 601 and 601-1 may each independently be 0, 1, or 2.

The electron transport region 133 may include one of Compounds ET1 to ET47, 2,9-dimethyl-4,7-diphenyl-1,10-phenanthroline (BCP), 4,7-diphenyl-1,10-phenanthroline (Bphen), $Alq_3$, BAlq, TAZ, NTAZ, or any combination thereof:

ET1

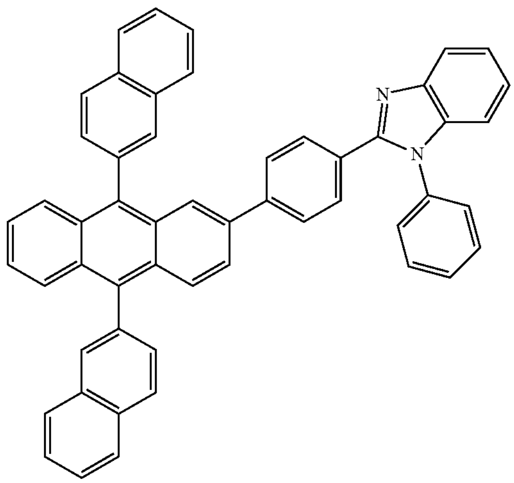

-continued
ET2
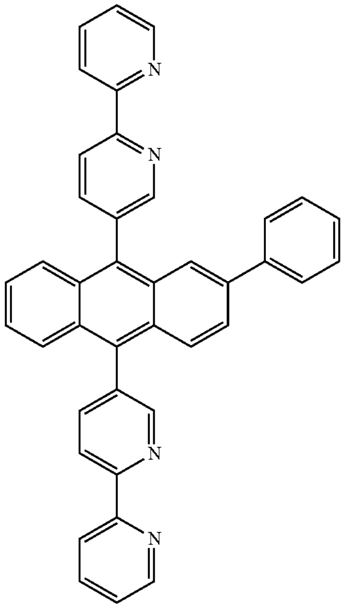
ET3
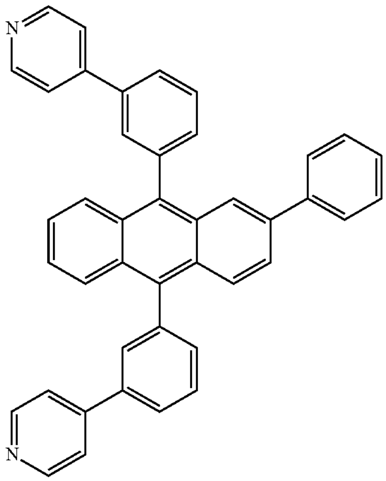
ET4
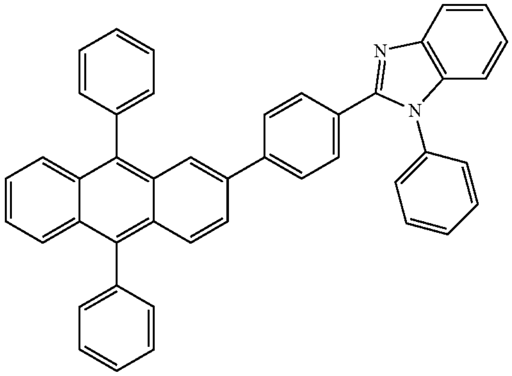
-continued
ET5
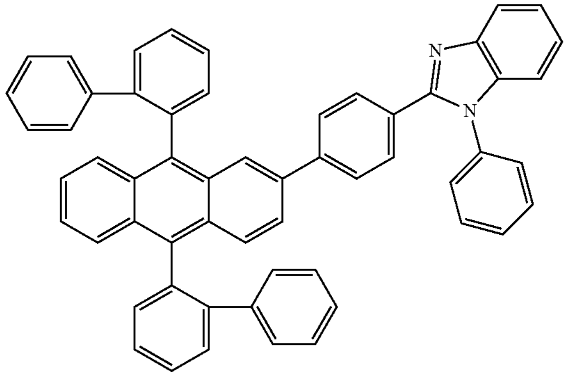
ET6
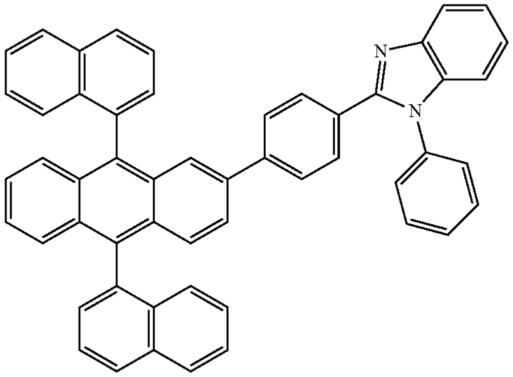
ET7
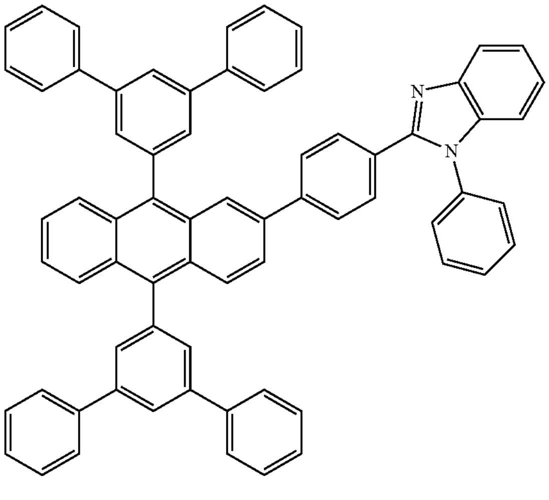

-continued
ET8
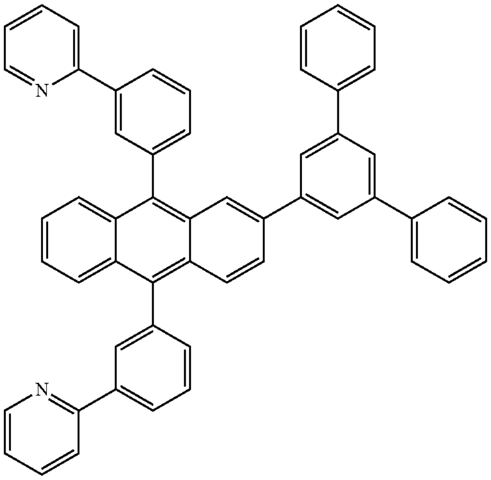
ET9
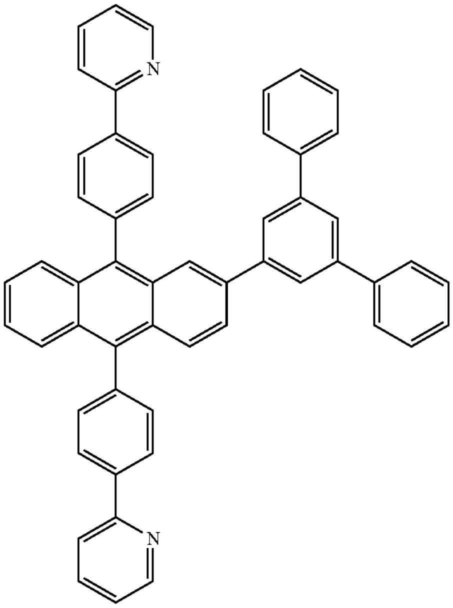
-continued
ET10
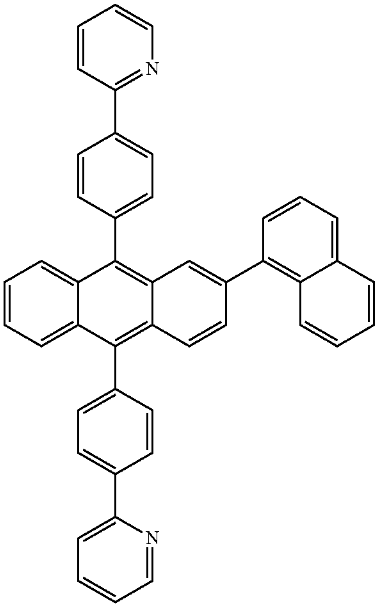
ET11
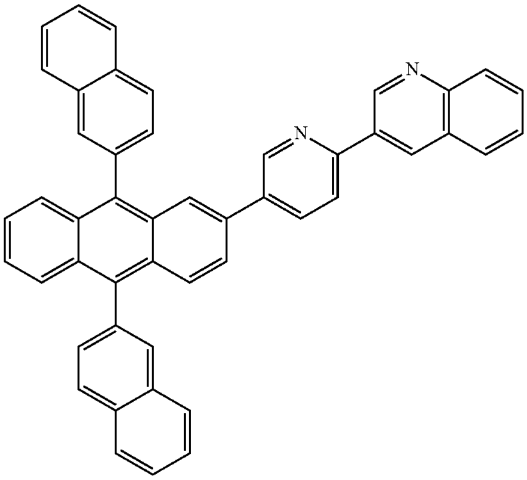
ET12
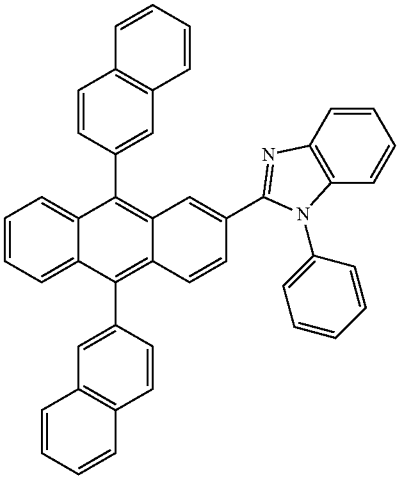

-continued
ET13
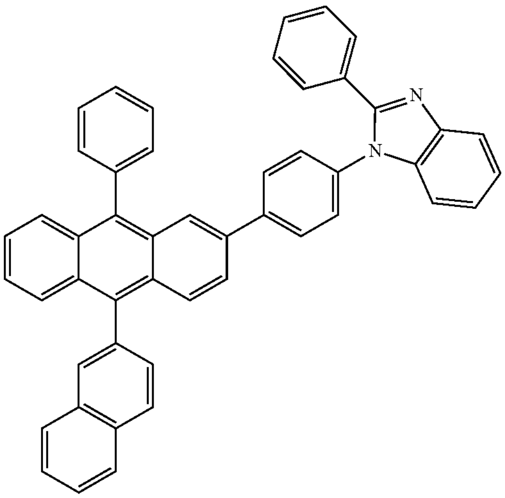
ET14
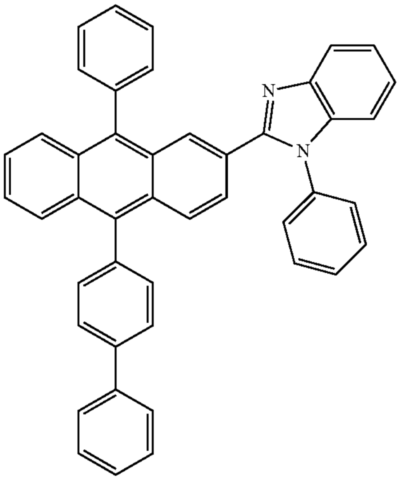
ET15
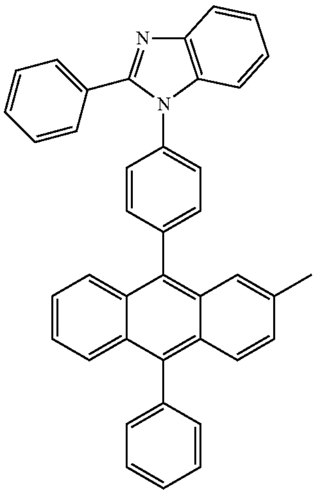
-continued
ET16
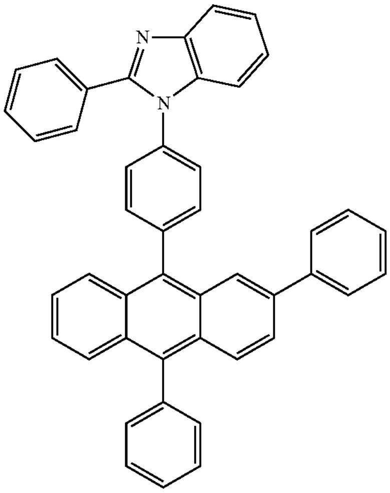
ET17
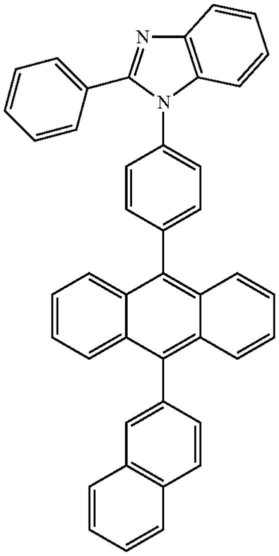
ET18
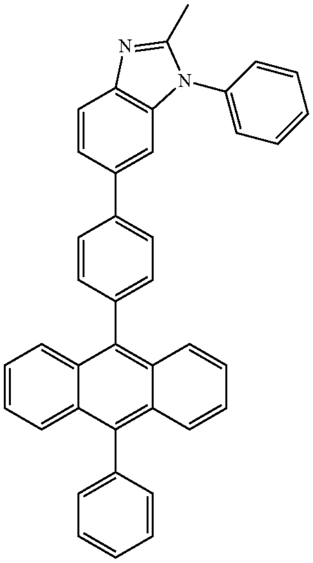

-continued
ET19
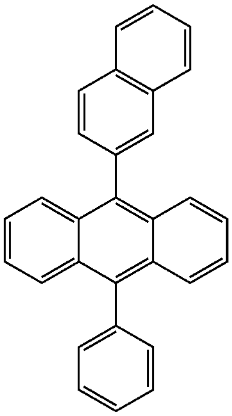
ET20
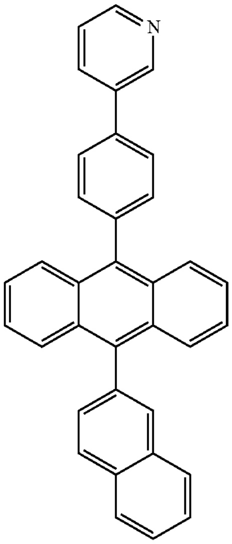
ET21
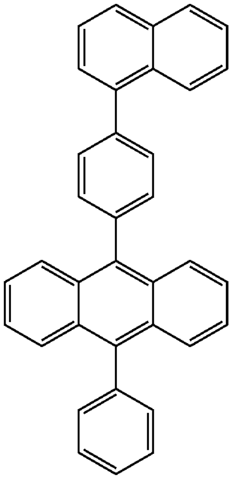
-continued
ET22
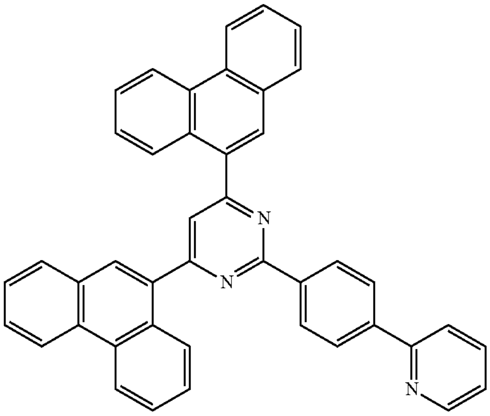
ET23
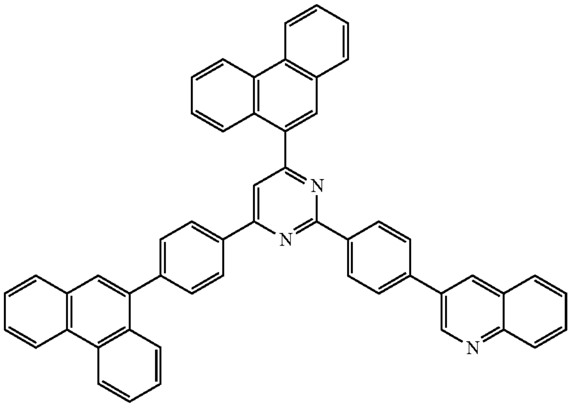
ET24
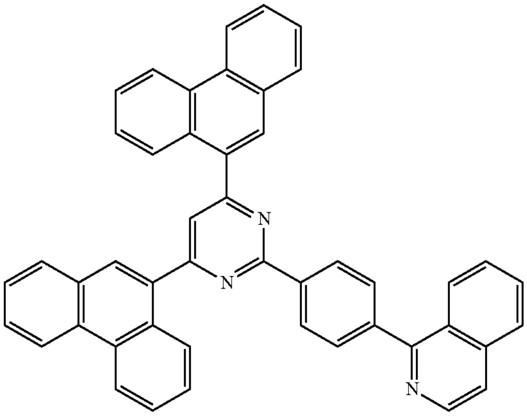

-continued
ET25
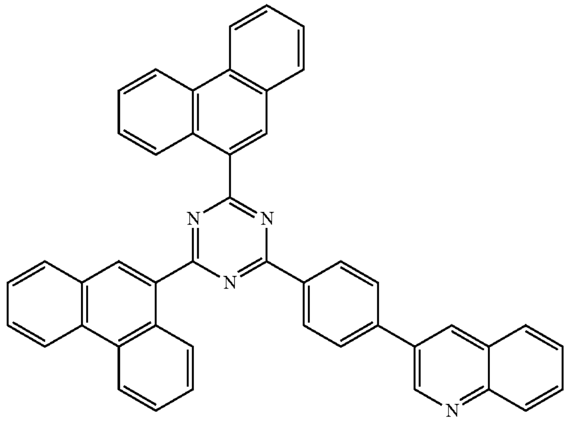
ET26
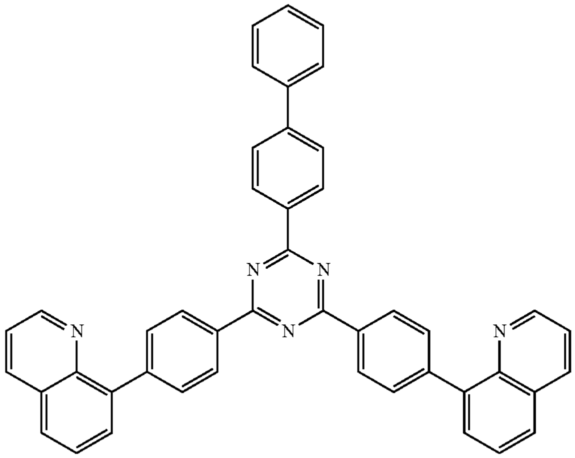
ET27
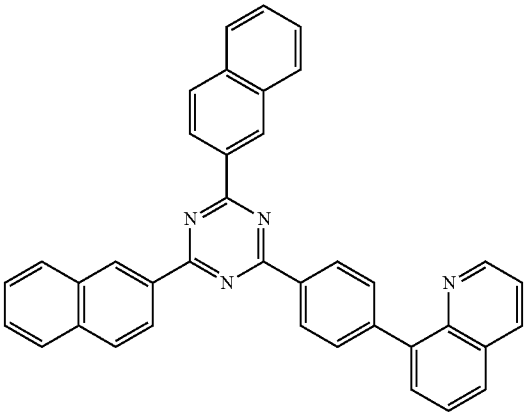
-continued
ET28
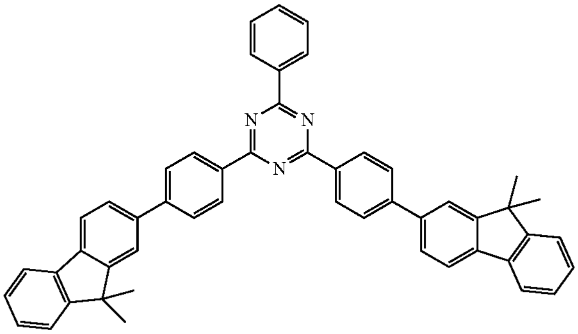
ET29
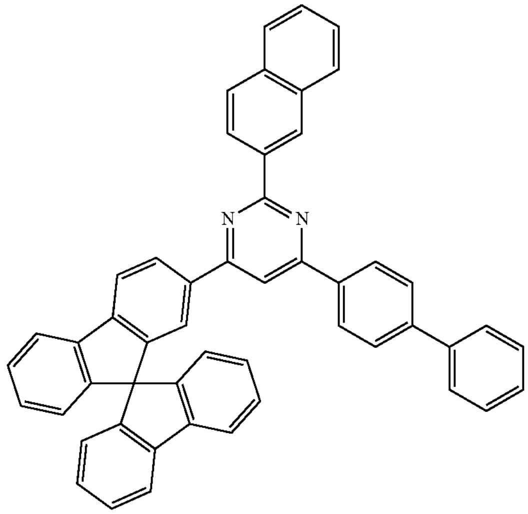
ET30
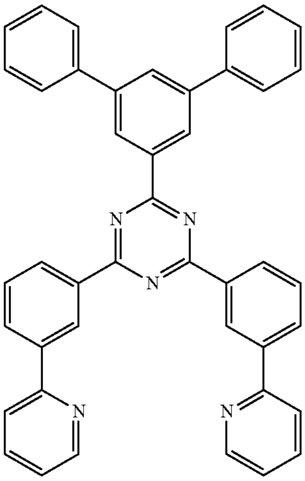

-continued
ET31
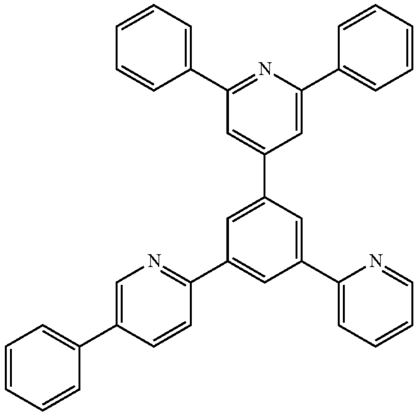
ET32
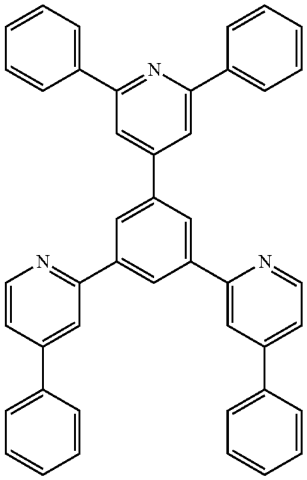
ET33
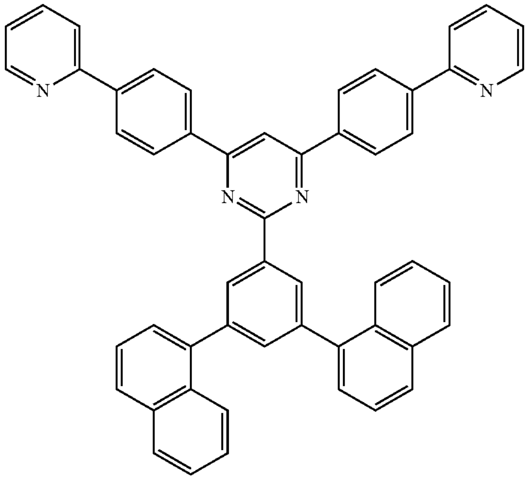
-continued
ET34
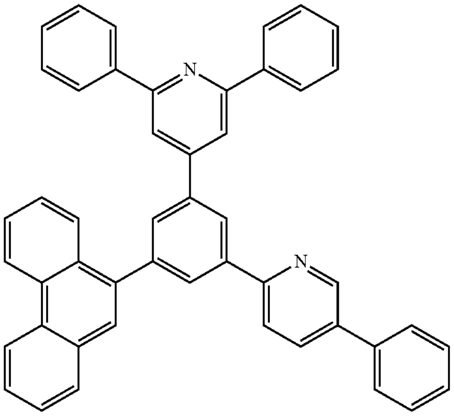
ET35
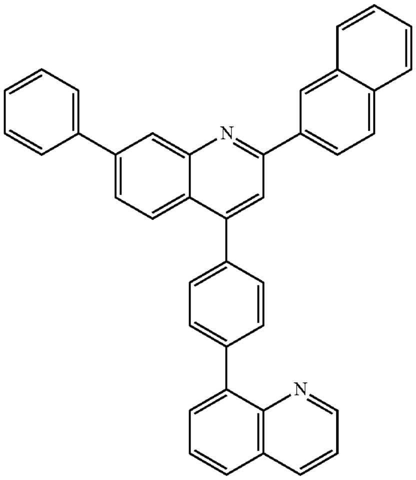
ET36
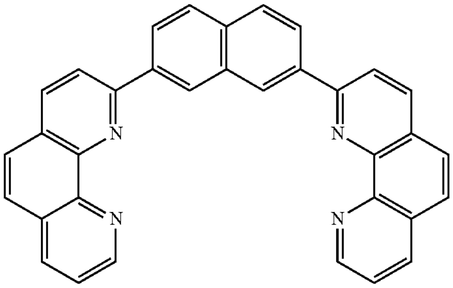
ET37
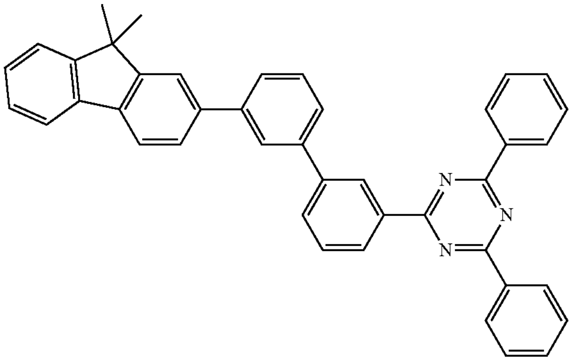

-continued
ET38
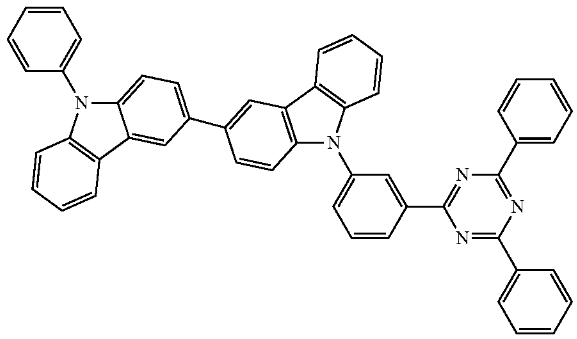
ET39
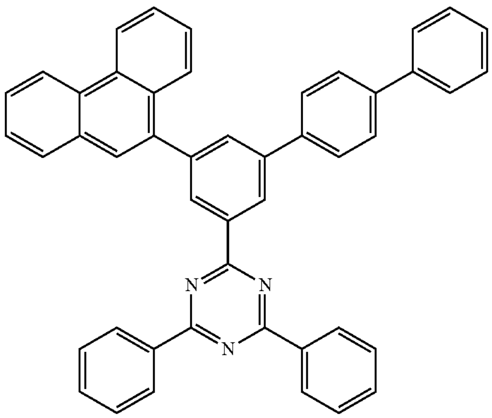
ET40
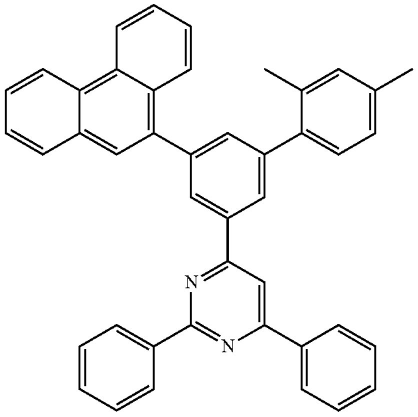
-continued
ET41
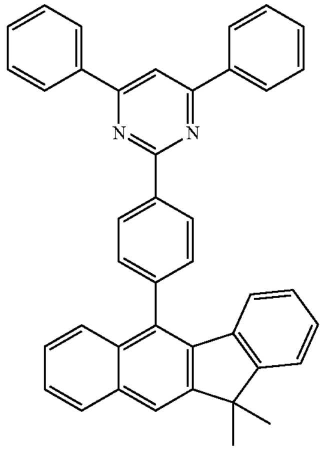
ET42
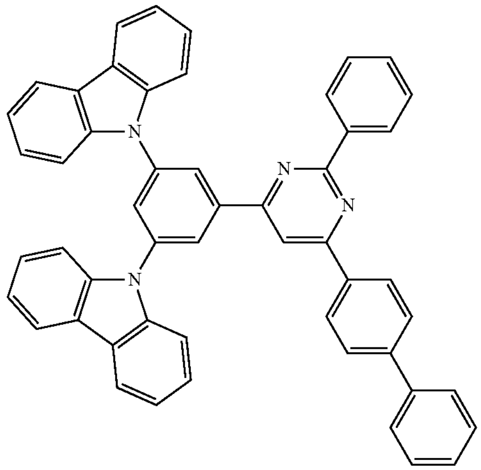
ET43
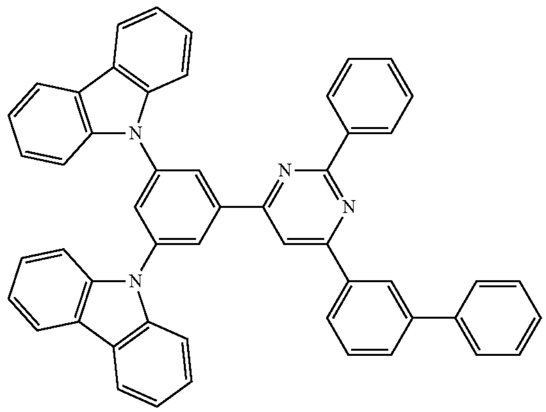

-continued

ET44

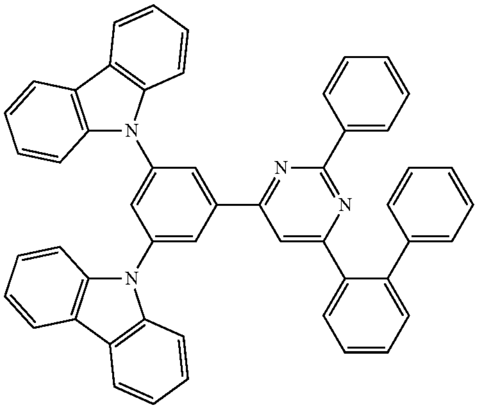

ET45

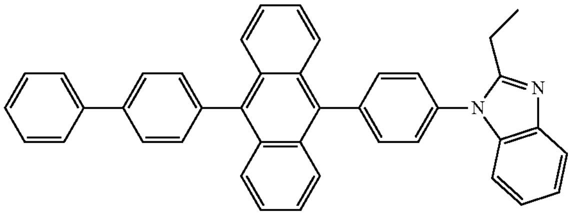

ET46

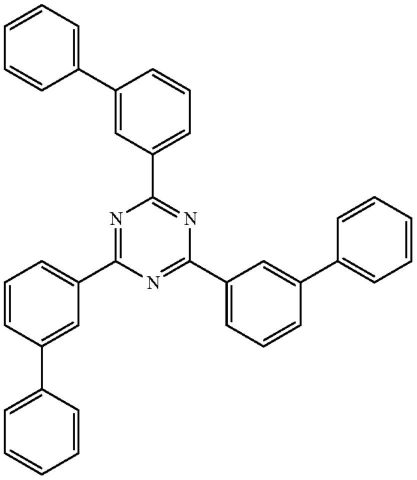

ET47

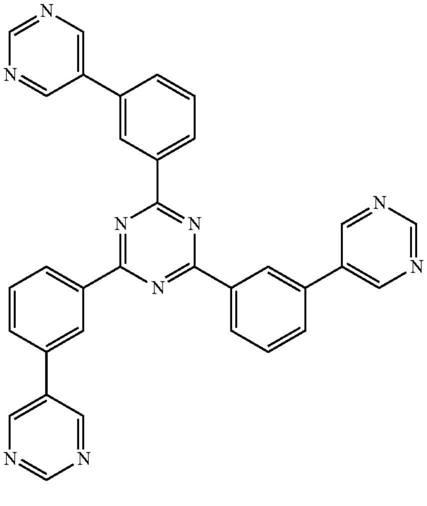

-continued

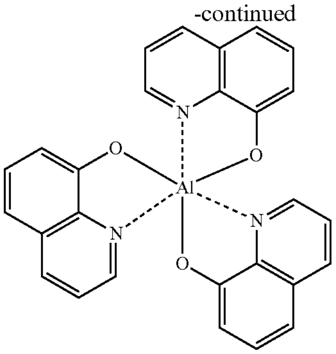

Alq3

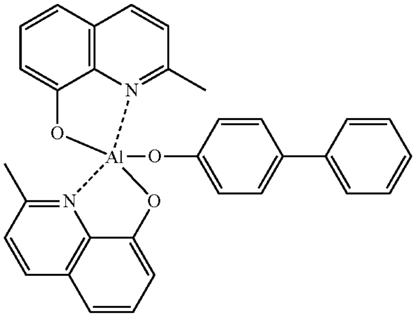

BAlq

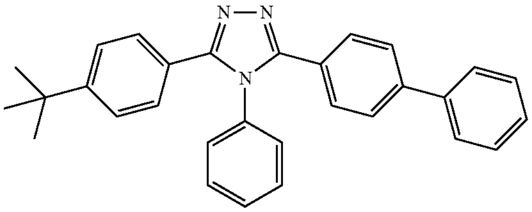

TAZ

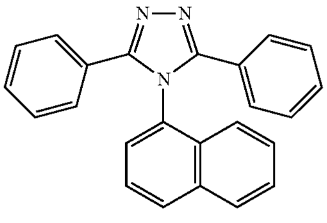

NTAZ

A thickness of the electron transport region 133 may be in a range of about 160 Å to about 5,000 Å. For example, the thickness of the electron transport region 133 may be in a range of about 100 Å to about 4,000 Å. When the electron transport region 133 includes a buffer layer, a hole blocking layer, an electron control layer, an electron transport layer, or any combination thereof, a thickness of the buffer layer, the hole blocking layer, or the electron control layer may each independently be in a range of about 20 Å to about 1000 Å, and a thickness of the electron transport layer may be in a range of about 100 Å to about 1000 Å. For example, the thickness of the buffer layer, the hole blocking layer, or the electron control layer may each independently be in a range of 30 Å to about 300 Å. For example, the thickness of the electron transport layer may be in a range of about 150 Å to about 500 Å. When the thickness of the buffer layer, the hole blocking layer, the electron control layer, the electron transport layer, and/or the electron transport layer are within these ranges, satisfactory hole transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth-metal complex, or any combination thereof. A metal ion of the alkali metal complex may be a Li ion, a Na ion, a K ion, a Rb ion, or a Cs ion, and a metal ion of the alkaline earth-metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

In an embodiment, the metal-containing material may include a Li complex. The Li complex may include, for example, Compound ET-D1 (LiQ) or ET-D2:

ET-D1

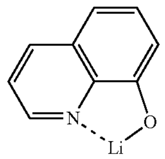

ET-D2

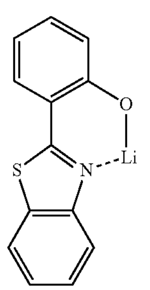

The electron transport region 133 may include an electron injection layer that facilitates the injection of electrons from the second electrode 150. The electron injection layer may directly contact the second electrode 150.

The electron injection layer may have: i) a single-layered structure consisting of a single layer consisting of a single material, ii) a single-layered structure consisting of a single layer consisting of different materials, or iii) a multi-layered structure including multiple layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combinations thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may include oxides and halides (for example, fluorides, chlorides, bromides, or iodides) of the alkali metal, the alkaline earth metal, and the rare earth metal, telluride, or any combination thereof.

The alkali metal-containing compound may be alkali metal oxides, such as $Li_2O$, $Cs_2O$, or $K_2O$, and alkali metal halides, such as LiF, NaF, CsF, KF, LiI, NaI, CsI, or KI, or any combination thereof. The alkaline earth metal-containing compound may include an alkaline earth metal compound, such as BaO, SrO, CaO, $Ba_xSr_{1-x}O$ (x is a real number that satisfies the condition of $0<x<1$), or $Ba_xCa_{1-x}O$ (x is a real number that satisfies the condition of $0<x<1$). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include lanthanide metal telluride. Examples of the lanthanide metal telluride are LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of ions of the alkali metal, the alkaline earth metal, and the rare earth metal and ii), as a ligand bonded to the metal ion, for example, hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenyl benzimidazole, hydroxyphenylbenzothiazole, bipyridine, phenanthroline, cyclopentadiene, or any combination thereof.

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof, or may further include an organic material (for example, a compound represented by Formula 601).

In an embodiment, the electron injection layer may consist of i) an alkali metal-containing compound (for example, an alkali metal halide), or ii) a) an alkali metal-containing compound (for example, an alkali metal halide); and b) alkali metal, alkaline earth metal, rare earth metal, or any combination thereof. In an embodiment, the electron injection layer may be a KI:Yb co-deposited layer or a RbI:Yb co-deposited layer.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be homogeneously or non-homogeneously dispersed in a matrix including the organic material.

A thickness of the electron injection layer may be in a range of about 1 Å to about 100 Å. For example, the thickness of the electron injection layer may be in a range of about 3 Å to about 90 Å. When the thickness of the electron injection layer is within the range described above, the electron injection layer may have satisfactory electron injection characteristics without a substantial increase in driving voltage.

[Second Electrode 150]

The second electrode 150 may be located on the interlayer 130 having such a structure. The second electrode 150 may be a cathode, which is an electron injection electrode, and as the material for the second electrode 150, a metal, an alloy, an electrically conductive compound, or any combination thereof, each having a low work function, may be used.

The second electrode 150 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or a combination thereof. The second electrode 150 may be a transmissive electrode, a semi-transmissive electrode, or a reflective electrode.

The second electrode 150 may have a single-layered structure or a multi-layered structure including two or more layers.

[Capping Layer]

A first capping layer may be disposed outside the first electrode 110, and/or a second capping layer may be disposed outside the second electrode 150. The light-emitting device 10 may have a structure in which the first capping layer, the first electrode 110, the interlayer 130, and the second electrode 150 are stacked in this stated order, a structure in which the first electrode 110, the interlayer 130, the second electrode 150, and the second capping layer are stacked in this stated order, or a structure in which the first capping layer, the first electrode 110, the interlayer 130, the second electrode 150, and the second capping layer are stacked in this stated order.

Light generated in an emission layer of the interlayer 130 of the light-emitting device 10 may be emitted toward the outside through the first electrode 110, which is a semi-transmissive electrode or a transmissive electrode, and the first capping layer, and light generated in an emission layer of the interlayer 130 of the light-emitting device 10 may be emitted toward the outside through the second electrode 150, which is a semi-transmissive electrode or a transmissive electrode, and the second capping layer.

The first capping layer and the second capping layer may increase external light emission efficiency according to the principle of constructive interference. Accordingly, the light emission efficiency of the light-emitting device 10 is increased, so that the light emission efficiency of the light-emitting device 10 may be improved.

Each of the first capping layer and the second capping layer may include a material having a refractive index of equal to or greater than about 1.6 (at a wavelength of 589 nm).

The first capping layer and the second capping layer may each independently be an organic capping layer including an organic material, an inorganic capping layer including an inorganic material, or a composite capping layer including an organic material and an inorganic material.

At least one selected from the first capping layer and the second capping layer may each independently include a carbocyclic compound, a heterocyclic compound, an amine group-containing compound, a porphyrine derivative, a phthalocyanine derivative, a naphthalocyanine derivative, an alkali metal complex, an alkaline earth-metal complex, or a combination thereof. The carbocyclic compound, the heterocyclic compound, and the amine group-containing compound may be optionally substituted with a substituent containing O, N, S, Se, Si, F, Cl, Br, I, or any combination thereof.

In an embodiment, at least one of the first capping layer and the second capping layer may each independently include an amine group-containing compound.

In an embodiment, at least one of the first capping layer and second capping layer may each independently include a compound represented by Formula 201, a compound represented by Formula 202, or any combination thereof.

In embodiments, at least one of the first capping layer and the second capping layer may each independently include one of Compounds HT28 to HT33, one of Compounds CP1 to CP6, β-NPB, or any combination thereof:

CP1

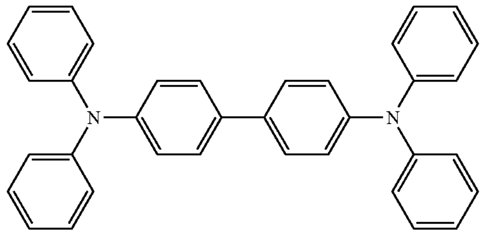

CP2

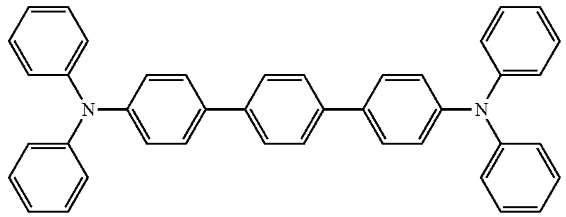

CP3

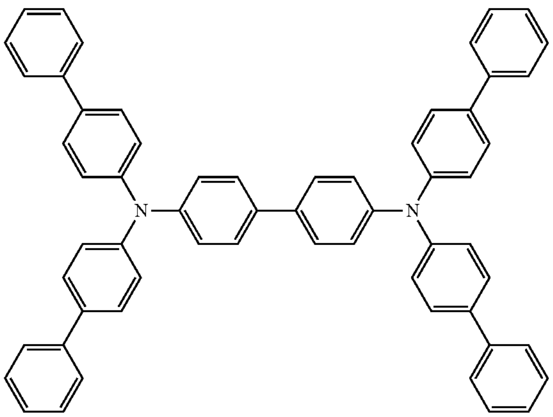

CP4

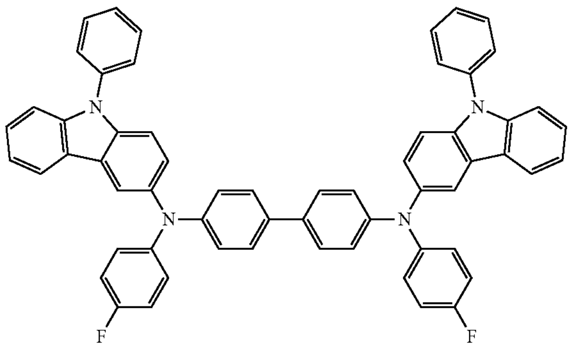

-continued

CP5

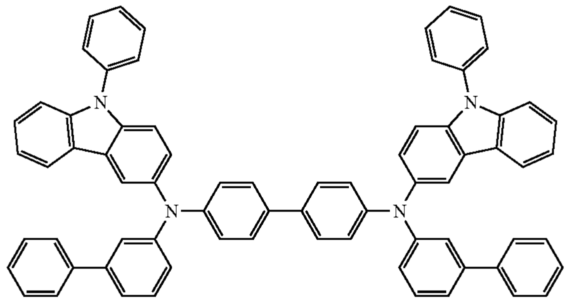

CP6

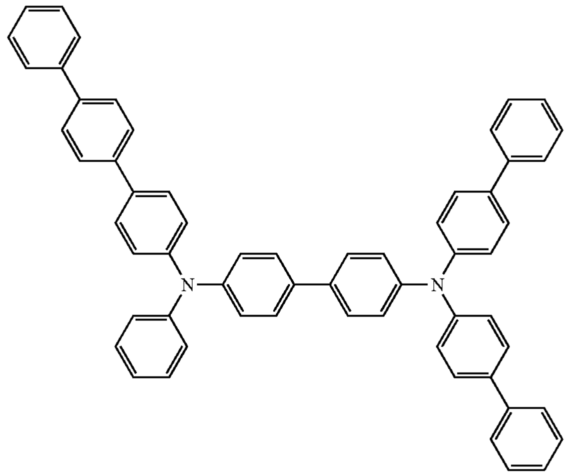

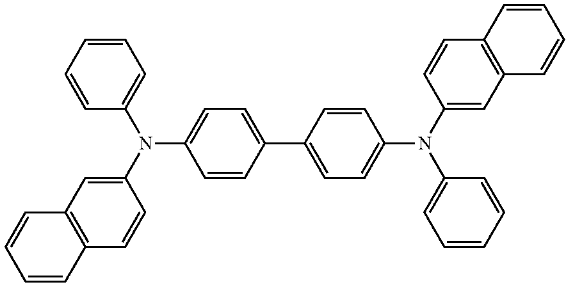

β-NPB

[Electronic Apparatus]

The light-emitting device may be included in various electronic apparatuses. In an embodiment, the electronic apparatus including the light-emitting device may be a light-emitting apparatus, an authentication apparatus, or the like.

The electronic apparatus (for example, light-emitting apparatus) may further include, in addition to the light-emitting device, i) a color filter, ii) a color conversion layer, or iii) a color filter and a color conversion layer. The color filter and/or the color conversion layer may be located in at least one traveling direction of light emitted from the light-emitting device. In an embodiment, light emitted from the light-emitting device may be blue light or white light. The light-emitting device may be the same as described above. In an embodiment, the color conversion layer may include quantum dots. The quantum dot may be, for example, a quantum dot as described herein.

The electronic apparatus may include a first substrate. The first substrate may include subpixels, the color filter may include color filter areas respectively corresponding to the subpixels, and the color conversion layer may include color conversion areas respectively corresponding to the subpixels.

A pixel-defining film may be located between the subpixels to define each of the subpixels.

The color filter may further include the color filter areas and a light-blocking pattern located between adjacent color filter areas of the color filter areas, and the color conversion layer may further include the color conversion areas and a light-blocking pattern located between adjacent color conversion areas of the color conversion areas.

The color filter areas (or color conversion areas) may include: a first area emitting first-color light; a second area emitting second-color light; and/or a third area emitting third-color light, and the first-color light, the second-color light and/or the third-color light may have different maximum luminescence wavelengths. In an embodiment, the first color light may be red light, the second color light may be green light, and the third color light may be blue light. In an embodiment, the color filter areas (or the color conversion areas) may include quantum dots. In detail, the first area may include a red quantum dot, the second area may include a green quantum dot, and the third area may not include a quantum dot. The quantum dot is the same as described in the specification. Each of the first area, the second area, and/or the third area may further include a scattering body.

In an embodiment, the light-emitting device may emit first light, the first area may absorb the first light to emit first first-color light, the second area may absorb the first light to emit second first-color light, and the third area may absorb the first light to emit third first-color light. In this regard, the first first-color light, the second first-color light, and the third first-color light may have different maximum emission wavelengths from one another. In detail, the first light may be blue light, the first first-color light may be red light, the second first-color light may be green light, and the third first-color light may be blue light.

The electronic apparatus may further include a thin-film transistor in addition to the light-emitting device 1 as described above. The thin-film transistor may include a source electrode, a drain electrode, and an active layer, wherein any one of the source electrode and the drain electrode may be electrically connected to any one of the first electrode and the second electrode of the light-emitting device.

The thin-film transistor may further include a gate electrode, a gate insulation layer, or the like.

The active layer may include crystalline silicon, amorphous silicon, organic semiconductor, oxide semiconductor, or the like.

The electronic apparatus may further include a sealing portion for sealing the light-emitting device. The sealing portion may be disposed between the color filter and/or the color conversion layer and the light-emitting device. The sealing portion allows light from the light-emitting device 10 to be emitted to the outside, while simultaneously preventing ambient air and moisture from penetrating into the light-emitting device 10. The sealing portion may be a sealing substrate including a transparent glass substrate or a plastic substrate. The sealing portion may be a thin film encapsulation layer including at least one layer of an organic layer and/or an inorganic layer. When the sealing portion is a thin film encapsulation layer, the electronic apparatus may be flexible.

On the sealing portion, in addition to the color filter and/or color conversion layer, various functional layers may be further disposed according to the use of the electronic device. The functional layers may include a touch screen layer, a polarizing layer, and the like. The touch screen layer may be a pressure-sensitive touch screen layer, a capacitive touch screen layer, or an infrared touch screen layer. The authentication apparatus may be, for example, a biometric authentication apparatus for authenticating an individual by using biometric information of a biometric body (for example, a fingertip, a pupil, or the like).

The authentication apparatus may further include, in addition to the light-emitting device, a biometric information collector.

The electronic apparatus may be applied to various displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement apparatuses, pulse wave measurement apparatuses, electrocardiogram displays, ultrasonic diagnostic apparatuses, or endoscope displays), fish finders, various measuring instruments, meters (for example, meters for a vehicle, an aircraft, and a vessel), projectors, and the like.

Figure 7:
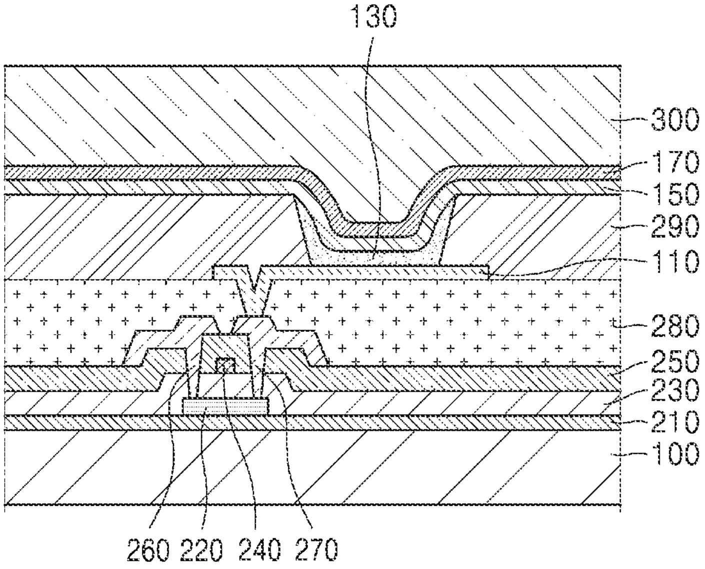
FIG. 7 shows a schematic cross-sectional view of a light-emitting apparatus according to an embodiment.
Figure 8:
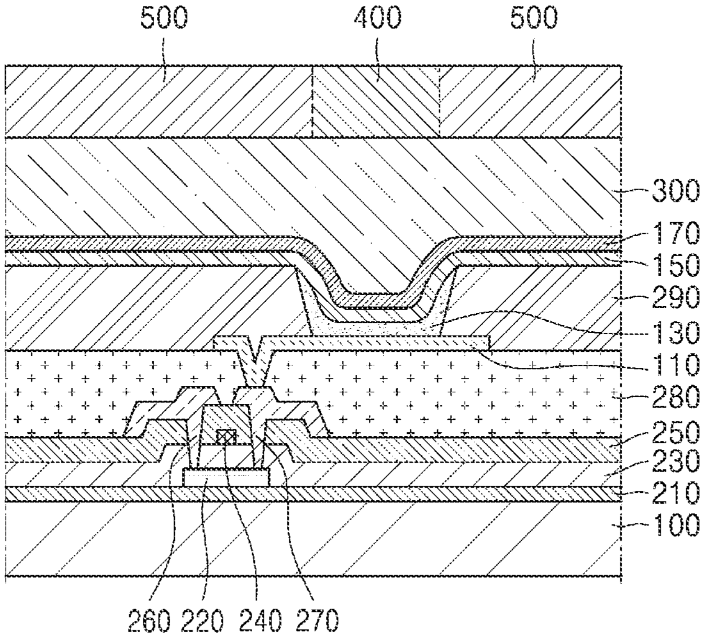
FIG. 8 shows a schematic cross-sectional view of a light-emitting apparatus according to an embodiment.

[Description of FIGS. 7 and 8]

FIG. 7 shows a schematic cross-sectional view showing a light-emitting apparatus according to an embodiment.

The light-emitting apparatus of FIG. 7 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be located on the substrate 100. The buffer layer 210 prevents the penetration of impurities through the substrate 100 and may provide a flat surface on the substrate 100.

A TFT may be located on the buffer layer 210. The TFT may include an active layer 220, a gate electrode 240, a source electrode 260, and a drain electrode 270.

The active layer 220 may include an inorganic semiconductor such as silicon or polysilicon, an organic semiconductor, or an oxide semiconductor, and may include a source region, a drain region, and a channel region.

A gate insulating film 230 for insulating the active layer 220 from the gate electrode 240 may be located on the active layer 220, and the gate electrode 240 may be located on the gate insulating film 230.

An interlayer insulating film 250 may be located on the gate electrode 240. The interlayer insulating film 250 is located between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the active layer 220, and the source electrode 260 and the drain electrode 270 may be disposed to contact the exposed portions of the source region and the drain region of the active layer 220.

The TFT may be electrically connected to a light-emitting device to drive the light-emitting device, and is covered by a passivation layer 280. The passivation layer 280 may include an inorganic insulating film, an organic insulating film, or a combination thereof. A light-emitting device is provided on the passivation layer 280. The light-emitting device includes the first electrode 110, the interlayer 130, and the second electrode 150.

The first electrode 110 may be located on the passivation layer 280. The passivation layer 280 does not completely cover the drain electrode 270 and exposes a portion of the drain electrode 270, and the first electrode 110 may be electrically connected to the exposed portion of the drain electrode 270.

A pixel defining layer 290 including an insulating material may be located on the first electrode 110. The pixel defining layer 290 may expose a certain region of the first electrode 110, and the interlayer 130 may be formed in the exposed region of the first electrode 110. The pixel defining layer 290 may be a polyimide or polyacryl-based organic film. Although not shown in FIG. 7, at least some layers of the interlayer 130 may extend beyond the upper portion of the pixel defining layer 290 to be disposed in the form of a common layer.

The second electrode 150 may be disposed on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device and protects the light-emitting device from moisture or oxygen. The encapsulation portion 300 may include: an inorganic film including silicon nitride (SiNx), silicon oxide (SiOx), indium tin oxide, indium zinc oxide, or a combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate or polyacrylic acid), an epoxy-based resin (for example, aliphatic glycidyl ether (AGE), or a combination thereof; or a combination of an inorganic film and an organic film.

FIG. 8 shows a schematic cross-sectional view showing a light-emitting apparatus according to an embodiment of the disclosure.

The light-emitting apparatus of FIG. 8 is the same as the light-emitting apparatus of FIG. 7, except that a light-blocking pattern 500 and a functional region 400 are additionally located on the encapsulation portion 300. The functional region 400 may be i) a color filter area, ii) a color conversion area, or iii) a combination of the color filter area and the color conversion area. In an embodiment, the light-emitting device included in the light-emitting apparatus of FIG. 8 may be a tandem light-emitting device.

[Preparation Method]

Layers constituting the hole transport region, an emission layer, and layers constituting the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, the emission layer, and layers constituting the electron transport region are formed by vacuum deposition, the deposition may be performed at a deposition temperature of about 100° C. to about 500° C., a vacuum degree of about $10^{-3}$ torr to about $10^{-3}$ torr, and a deposition speed of about 0.01 Å/sec to about 100 Å/sec by taking into account a material to be included in a layer to be formed and the structure of a layer to be formed.

[Definition of Terms]

The term "$C_3$-$C_{60}$ carbocyclic group" as used herein refers to a cyclic group that consists of carbon only and has three to sixty carbon atoms, and the term "$C_1$-$C_{60}$ heterocyclic group" as used herein refers to a cyclic group that has one to sixty carbon atoms and further includes, in addition to carbon, a heteroatom. The $C_3$-$C_{60}$ carbocyclic group and the $C_1$-$C_{60}$ heterocyclic group may each be a monocyclic group that consists of one ring or a polycyclic group in which two or more rings are condensed with each other. In an embodiment, the number of ring-forming atoms of the $C_1$-$C_{60}$ heterocyclic group may be from 3 to 61.

The term "cyclic group" as used herein includes the $C_3$-$C_{60}$ carbocyclic group and the $C_1$-$C_{60}$ heterocyclic group.

The term "π electron-rich $C_3$-$C_{60}$ cyclic group" as used herein refers to a cyclic group that has three to sixty carbon atoms and does not include *—N═*' as a ring-forming moiety, and the term "π electron-deficient nitrogen-containing $C_1$-$C_{60}$ cyclic group" as used herein refers to a heterocyclic group that has one to sixty carbon atoms and includes *—N═*' as a ring-forming moiety.

For example, the $C_3$-$C_{60}$ carbocyclic group may be i) a group T1 or ii) a condensed cyclic group in which two or more groups T1 are condensed with each other (for example, a cyclopentadiene group, an adamantane group, a norbornane group, a benzene group, a pentalene group, a naphthalene group, an azulene group, an indacene group, acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a group T2, ii) a condensed cyclic group in which two or more groups T2 are condensed with each other, or iii) a condensed cyclic group in which at least one group T2 and at least one group T1 are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothieno dibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, or an azadibenzofuran group), the π electron-rich $C_3$-$C_{60}$ cyclic group may be i) a group T1, ii) a condensed cyclic group in which two or more groups T1 are condensed with each other, iii) a group T3, iv) a condensed cyclic group in which two or more groups T3 are condensed with each other, or v) a condensed cyclic group in which at least one group T3 and at least one group T1 are condensed with each other (for example, a $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, or a benzothienodibenzothiophene group), the π electron-deficient nitrogen-containing $C_1$-$C_{60}$ cyclic group may be i) a group T4, ii) a condensed cyclic group in which two or more groups T4 are condensed with each other, iii) a condensed cyclic group in which at least one group T4 and at least one group T1 are condensed with each other, iv) a condensed cyclic group in which at least one group T4 and at least one group T3 are condensed with each other, or v) a condensed cyclic group in which at least one group T4, at least one group T1, and at least one group T3 are condensed with each other (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, or an azadibenzofuran group), the group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane group (or a bicyclo[2.2.1]heptane group), a norbornene group, a bicyclo[1.1.1]pentane group, a bicyclo[2.1.1]hexane group, a bicyclo[2.2.2]octane group, or a benzene group, the group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group, the group T3 may be a furan group, a thiophene group, a 1H-pyrrole group, a silole group, or a borole group, the group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group, the $C_3$-$C_{60}$ carbocyclic group, the $C_1$-$C_{60}$ heterocyclic group, the π electron-rich $C_3$-$C_{60}$ cyclic group, or the π electron-deficient nitrogen-containing $C_1$-$C_{60}$ cyclic group" as used herein refer to a group that is condensed with a cyclic group, a monovalent group, a polyvalent group (for example, a divalent group, a trivalent group, a tetravalent group, or the like), according to the structure of a formula described with corresponding terms. In an embodiment, "a benzene group" may be a benzo group, a phenyl group, a phenylene group, or the like, which may be easily understand by one of ordinary skill in the art according to the structure of a formula including the "benzene group."

In an embodiment, examples of the monovalent $C_3$-$C_{60}$ carbocyclic group and the monovalent $C_1$-$C_{60}$ heterocyclic group are a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of the divalent $C_3$-$C_{60}$ carbocyclic group and the monovalent $C_1$-$C_{60}$ heterocyclic group are a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein refers to a linear or branched aliphatic hydrocarbon monovalent group having 1 to 60 carbon atoms, and examples thereof are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a monovalent hydrocarbon group having at least one carbon-carbon double bond in the middle or at the terminus of a $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of a $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by $-OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof are a cyclopropyl group, a cyclobutyl group, a cyclopentyl group, a cyclohexyl group, a cycloheptyl group, a cycloctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group that further includes, in addition to a carbon atom, at least one heteroatom as a ring-forming atom and has 1 to 10 carbon atoms, and examples thereof are a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent cyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group that has, in addition to a carbon atom, at least one heteroatom as a ring-forming atom, 1 to 10 carbon atoms, and at least one carbon-carbon double bond in the cyclic structure thereof. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group are a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the two or more rings may be condensed to each other.

The term "$C_1$-$C_{60}$ heteroaryl group" as used herein refers to a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group" as used herein refers to a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group are a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the two or more rings may be condensed with each other.

The term "monovalent non-aromatic condensed polycyclic group" as used herein refers to a monovalent group (for example, having 8 to 60 carbon atoms) having two or more rings condensed with each other, only carbon atoms as ring-forming atoms, and no aromaticity in its entire molecular structure. Examples of the monovalent non-aromatic condensed polycyclic group are an indenyl group, a fluorenyl group, a spiro-bifluorenyl group, a benzofluorenyl group, an indenophenanthrenyl group, and an indenoanthracenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 1 to 60 carbon atoms) having two or more rings condensed to each other, at least one heteroatom other than carbon atoms, as a ring-forming atom, and no aromaticity in its entire molecular structure. Examples of the monovalent non-aromatic condensed heteropolycyclic group are a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein refers to a divalent group having the same structure as the monovalent non-aromatic condensed heteropolycyclic group.

The term "$C_6$-$C_{60}$ aryloxy group" as used herein refers to —$OA_{102}$ (wherein $A_{102}$ is the $C_6$-$C_{60}$ aryl group), and the term "$C_6$-$C_{60}$ arylthio group" as used herein refers to —$SA_{103}$ (wherein $A_{103}$ is the $C_6$-$C_{60}$ aryl group).

The term "$R_{10a}$" as used herein refers to:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

$Q_1$ to $Q_3$, $Q_{11}$ to $Q_{13}$, $Q_{21}$ to $Q_{23}$ and $Q_{31}$ to $Q_{33}$ used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "heteroatom" as used herein refers to any atom other than a carbon atom. Examples of the heteroatom are O, S, N, P, Si, B, Ge, Se, and any combination thereof.

The term "Ph" as used herein refers to a phenyl group, the term "Me" as used herein refers to a methyl group, the term "Et" as used herein refers to an ethyl group, the term "ter-Bu" or "$Bu^t$" as used herein refers to a tert-butyl group, and the term "OMe" as used herein refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

* and *' as used herein, unless defined otherwise, each refer to a binding site to a neighboring atom in a corresponding formula.

Hereinafter, a light-emitting device according to embodiments will be described in detail with reference to Examples.

EXAMPLES

Comparative Example 1-1

As a substrate and an anode, a first glass substrate with Corning 15 $\Omega cm^2$ (100 Å) ITO formed thereon, a second glass substrate with (1000 Å) Ag formed thereon, and a third glass with Corning 15 $\Omega/cm^2$ (100 Å) ITO formed thereon were each cut to a size of 50 mm×50 mm×0.7 mm, which was sonicated with isopropyl alcohol and pure water, each for 5 minutes, followed by irradiation with ultraviolet light for 30 minutes and exposure to ozone. The first glass substrate, the second glass substrate, and the third glass substrate were sequentially stacked on a vacuum deposition apparatus.

HAT-CN was deposited on the anode to form a hole injection layer having a thickness of 50 Å to form a hole injection layer, and NPB was deposited on the hole injection layer to form a hole transport layer having a thickness of 600 Å.

Compound B and FD37 were co-deposited as a host at the weight ratio of 95:5 on the hole transport layer to form an emission layer having a thickness of 200 Å, and ET46 (50 Å) was deposited thereon to form a buffer layer, and ET47 and LiQ were co-deposited on the buffer layer at the ratio of 5:5 to form an electron transport layer having a thickness of 300 Å.

Yb (10 Å) was deposited on the electron transport layer to form an electron injection layer, Ag and Mg were co-deposited at the weight ratio of 9:1 on the electron injection layer to form a cathode having a thickness of 100 Å, and CP1 (700 Å) was deposited on the cathode, thereby completing the manufacture of a light-emitting device.

B

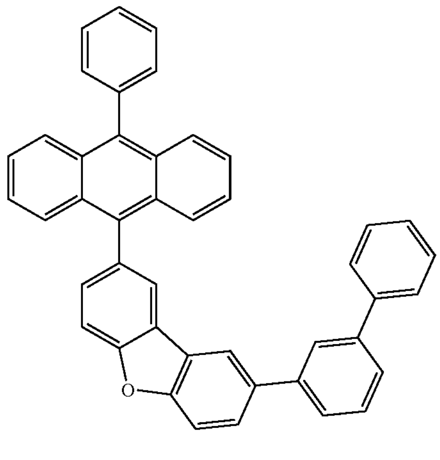

-continued

FD37

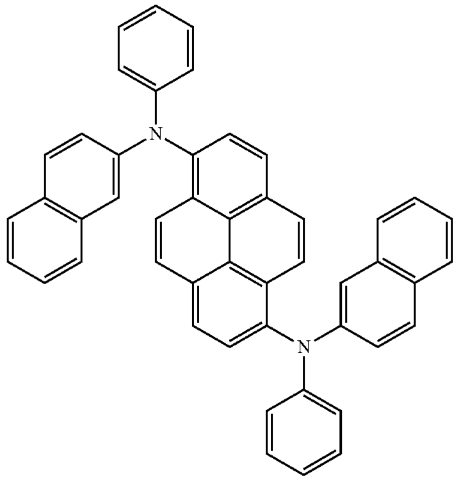

ET46

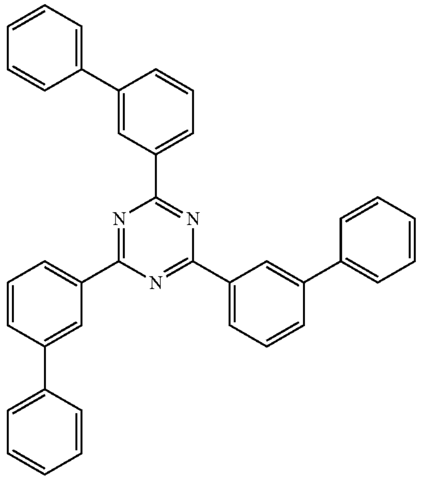

ET47

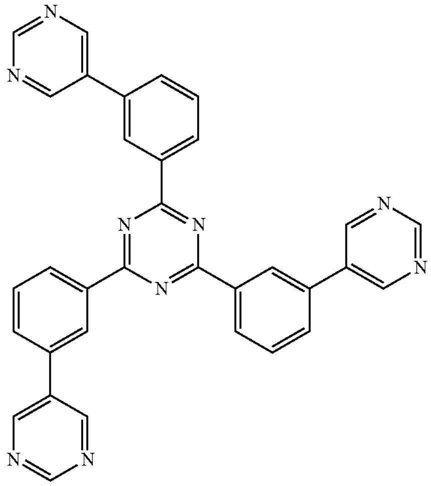

Comparative Example 1-2

A light-emitting device was manufactured in the same manner as in Comparative Example 1-1, except that, as a host, Compound 2 was used instead of Compound B.

2

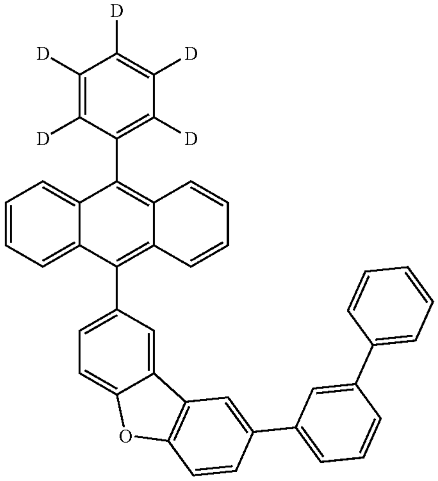

Comparative Example 1-3

A light-emitting device was manufactured in the same manner as in Comparative Example 1-1, except that, as a host, Compound A was used instead of Compound B.

A

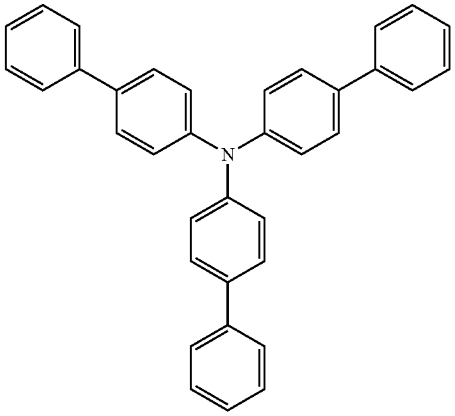

Comparative Example 1-4

A light-emitting device was manufactured in the same manner as in Comparative Example 1-1, except that, as a host, Compound 1 was used instead of Compound B.

Example 1-1

A light-emitting device was manufactured in the same manner as used in Comparative Example 1-1, except that, on the hole transport layer, Compound B and FD37 were co-deposited at the weight ratio of 95:5 to form a lower emission layer having a thickness of 100 Å, Compound 1 and FD37 were co-deposited at the weight ratio of 95:5 on the lower emission layer to form an upper emission layer having a thickness of 100 Å, and the buffer layer was formed on the upper emission layer.

Example 1-2

A light-emitting device was manufactured in the same manner as used in Example 1-1, except that Compound 1 was used instead of Compound B to form a lower emission layer and Compound B was used instead of Compound 1 to form an upper emission layer.

Comparative Example 1-5

A light-emitting device was manufactured in the same manner as used in Example 1-1, except that Compound A was used instead of Compound B to form a lower emission layer and Compound B was used instead of Compound 1 to form an upper emission layer.

Comparative Example 1-6

A light-emitting device was manufactured in the same manner as used in Example 1-1, except that Compound A was used instead of Compound 1 to form an upper emission layer.

Comparative Example 1-7

A light-emitting device was manufactured in the same manner as used in Example 1-1, except that Compound 1 was used instead of Compound B to form a lower emission layer and Compound 2 was used instead of Compound 1 to form an upper emission layer.

Comparative Example 1-8

A light-emitting device was manufactured in the same manner as used in Example 1-1, except that Compound 2 was used instead of Compound B to form a lower emission layer.

Example 1-3

A light-emitting device was manufactured in the same manner as used in Example 1-1, except that Compound A was used instead of Compound B to form a lower emission layer.

Example 1-4

A light-emitting device was manufactured in the same manner as used in Example 1-1, except that Compound 1 was used instead of Compound B to form a lower emission layer and Compound A was used instead of Compound 1 to form an upper emission layer.

Example 1-5

A light-emitting device was manufactured in the same manner as used in Example 1-1, except that Compound 2 was used instead of Compound 1 to form an upper emission layer.

Example 1-6

A light-emitting device was manufactured in the same manner as used in Example 1-1, except that Compound 2 was used instead of Compound B to form a lower emission layer and Compound B was used instead of Compound 1 to form an upper emission layer.

Evaluation Example 1

With respect to the light-emitting devices manufactured according to Examples 1-1 to 1-6 and Comparative Examples 1-1 to 1-8, the driving voltage (V) at 1500 nit of luminance, efficiency (Cd/A/y), and lifespan ($T_{97}$) were measured by using a color luminance meter, a Keithley source meter apparatus, and a fixed current room-temperature lifespan apparatus. Results thereof are shown in Table 1.

The driving voltage, efficiency, and lifespan of the light-emitting devices of Examples 1-1 to 1-6 and Comparative Examples 1-1 to 1-8 were evaluated based on 100% of the driving voltage, efficiency, and lifespan of the light-emitting device of Comparative Example 1-1, respectively.

TABLE 1

| | Emission layer host | | | | | | |
|---|---|---|---|---|---|---|---|
| | lower emission layer | upper emission layer | Driving voltage (V) | Efficiency (cd/A) | Lifespan ($T_{97}$) | Luminance (nit) | Remarks |
| Comparative Example 1-1 | Compound B | | 100% | 100% | 100% | 1500 | Single emission layer |
| Comparative Example 1-2 | Compound 2 | | 115% | 90% | 120% | 1500 | Single emission layer |
| Comparative Example 1-3 | Compound A | | 100% | 105% | 90% | 1500 | Single emission layer |
| Comparative Example 1-4 | Compound 1 | | 110% | 90% | 125% | 1500 | Single emission layer |
| Example 1-1 | Compound B | Compound 1 | 105% | 125% | 230% | 1500 | |
| Example 1-2 | Compound 1 | Compound B | 105% | 130% | 250% | 1500 | |
| Comparative Example 1-5 | Compound A | Compound B | 110% | 125% | 85% | 1500 | |
| Comparative Example 1-6 | Compound B | Compound A | 105% | 120% | 80% | 1500 | |
| Comparative Example 1-7 | Compound 1 | Compound 2 | 110% | 110% | 130% | 1500 | |
| Comparative Example 1-8 | Compound 2 | Compound 1 | 110% | 105% | 125% | 1500 | |
| Example 1-3 | Compound A | Compound 1 | 110% | 125% | 190% | 1500 | |
| Example 1-4 | Compound 1 | Compound A | 110% | 130% | 180% | 1500 | |
| Example 1-5 | Compound B | Compound 2 | 110% | 125% | 190% | 1500 | |
| Example 1-6 | Compound 2 | Compound B | 110% | 125% | 185% | 1500 | |

Referring to Table 1, compared to the light-emitting devices of Comparative Examples 1-1 to 1-4, which have a single emission layer, the light-emitting devices of Example 1-1 to 1-6 are equivalent or lower driving voltage, and remarkably high efficiency and lifespan characteristics.

In the case of the light-emitting devices of Comparative Examples 1-5 to 1-8, which do not have, as the structure of an emission layer, the double-layered emission layer including an emission layer including a deuterium-substituted host and an emission layer including a deuterium-unsubstituted host, the characteristics of the driving voltage, efficiency, and lifespan were not substantially better than the light-emitting devices of Examples 1-1 to 1-6.

Comparative Example 2-1

As a substrate and an anode, a first glass substrate with Corning 15 $\Omega/cm^2$ (100 Å) ITO formed thereon, a second glass substrate with (1000 Å) Ag formed thereon, and a third glass with Corning 15 $\Omega/cm^2$ (100 Å) ITO formed thereon were each cut to a size of 50 mm×50 mm×0.7 mm, which was sonicated with isopropyl alcohol and pure water, each for 5 minutes, followed by irradiation with ultraviolet light for 30 minutes and exposure to ozone. The first glass substrate, the second glass substrate, and the third glass substrate were sequentially stacked on a vacuum deposition apparatus.

HAT-CN was deposited on the anode to form a hole injection layer having a thickness of 50 Å to form a hole injection layer, and NPB was deposited on the hole injection layer to form a hole transport layer having a thickness of 600 Å.

Compound B, which is a host, and FD37, which is a dopant, were co-deposited at the weight ratio of 95:5 on the hole transport layer to form a first emission layer having a thickness of 200 Å, and ET46 (50 Å) was deposited thereon to form a first buffer layer, and ET47 and LiQ were co-deposited on the first buffer layer at the ratio of 5:5 to form a first electron transport layer having a thickness of 300 Å, thereby forming a first emitting unit.

On the first emitting unit, BCP and Li (the amount of Li was 1 wt %) were co-deposited to form an n-type charge generation layer having a thickness of 100 Å, and HAT-CN was deposited to form a p-type charge generation layer having a thickness of 50 Å, thereby forming a first charge generation layer.

On the first charge generation layer, NPB (600 Å) was deposited to form a second hole transport (HT)-auxiliary layer, Compound B, which is a host, and FD37, which is a dopant, were deposited at the weight ratio of 95:5 to form a second emission layer having a thickness of 200 Å, ET46 (50 Å) was deposited to form a second buffer layer, and, on the second buffer layer, ET47 and LiQ were co-deposited at the ratio of 5:5 to form a second electron transport layer having a thickness of 300 Å, thereby completing the manufacture of a second emitting unit.

On the second emitting unit, BCP and Li (the amount of Li was 1 wt %) were co-deposited to form an n-type charge generation layer having a thickness of 100 Å, and HAT-CN was deposited to form a p-type charge generation layer having a thickness of 50 Å, thereby forming a second charge generation layer.

On the second charge generation layer, NPB (600 Å) was deposited to form a third hole transport (HT)-auxiliary layer, Compound B, which is a host, and FD37, which is a dopant, were deposited at the weight ratio of 95:5 to form a third emission layer having a thickness of 200 Å, ET46 (50 Å) was deposited to form a third buffer layer, and, on the third buffer layer, ET47 and LiQ were co-deposited at the ratio of 5:5 to form a third electron transport layer having a thickness of 300 Å, thereby completing the manufacture of a third emitting unit.

Yb (10 Å) was deposited on the third emitting unit to form an electron injection layer, Ag and Mg were co-deposited at the weight ratio of 9:1 on the electron injection layer to form a cathode having a thickness of 100 Å, and CP1 (700 Å) was deposited on the cathode, thereby completing the manufacture of a light-emitting device.

Comparative Example 2-2

A light-emitting device was manufactured in the same manner as in Comparative Example 2-1, except that Compound 2 was used as a host instead of Compound B.

Comparative Example 2-3

A light-emitting device was manufactured in the same manner as in Comparative Example 2-1, except that Compound A was used as a host instead of Compound B.

Comparative Example 2-4

A light-emitting device was manufactured in the same manner as in Comparative Example 2-1, except that Compound 1 was used as a host instead of Compound B.

Example 2-1

A light-emitting device was manufactured in the same manner as used in Comparative Example 2-1, except that, on the hole transport layer, Compound B and FD37 were co-deposited at the weight ratio of 95:5 to form a lower emission layer having a thickness of 100 Å and Compound 1 and FD37 were co-deposited at the weight ratio of 95:5 on the lower emission layer to form an upper emission layer having a thickness of 100 Å, thereby forming a first emission layer, and the first buffer layer was formed on the first emission layer.

Example 2-2

A light-emitting device was manufactured in the same manner as used in Example 2-1, except that Compound 1 was used instead of Compound B to form a lower emission layer and Compound B was used instead of Compound 1 to form an upper emission layer.

Example 2-3

A light-emitting device was manufactured in the same manner as used in Comparative Example 2-1, except that, on the second hole transport (HT)-auxiliary layer, Compound B and FD37 were co-deposited at the weight ratio of 95:5 to form a lower emission layer having a thickness of 100 Å and Compound 1 and FD37 were co-deposited at the weight ratio of 95:5 on the lower emission layer to form an upper emission layer having a thickness of 100 Å, thereby forming a second emission layer, and the second buffer layer was formed on the second emission layer.

Example 2-4

A light-emitting device was manufactured in the same manner as used in Example 2-3, except that Compound 1 was used instead of Compound B to form a lower emission layer and Compound B was used instead of Compound 1 to form an upper emission layer.

Example 2-5

A light-emitting device was manufactured in the same manner as used in Comparative Example 2-1, except that, on the third hole transport (HT)-auxiliary layer, Compound B and FD37 were co-deposited at the weight ratio of 95:5 to form a lower emission layer having a thickness of 100 Å and Compound 1 and FD37 were co-deposited at the weight ratio of 95:5 on the lower emission layer to form an upper emission layer having a thickness of 100 Å, thereby forming a third emission layer, and the third buffer layer was formed on the third emission layer.

Example 2-6

A light-emitting device was manufactured in the same manner as used in Example 2-5, except that Compound 1 was used instead of Compound B to form a lower emission layer and Compound B was used instead of Compound 1 to form an upper emission layer.

Example 2-7

A light-emitting device was manufactured in the same manner as used in Comparative Example 2-1, except that, on the hole transport layer, Compound B and FD37 were co-deposited at the weight ratio of 95:5 to form a lower emission layer having a thickness of 100 Å and Compound 1 and FD37 were co-deposited at the weight ratio of 95:5 on the lower emission layer to form an upper emission layer having a thickness of 100 Å, thereby forming a first emission layer, and the first buffer layer was formed on the first emission layer, on the second hole transport (HT)-auxiliary layer, Compound B and FD37 were co-deposited at the weight ratio of 95:5 to form a lower emission layer having a thickness of 100 Å and Compound 1 and FD37 were co-deposited at the weight ratio of 95:5 on the lower emission layer to form an upper emission layer having a thickness of 100 Å, thereby forming a second emission layer, and the second buffer layer was formed on the second emission layer, and on the third hole transport (HT)-auxiliary layer, Compound B and FD37 were co-deposited at the weight ratio of 95:5 to form a lower emission layer having a thickness of 100 Å and Compound 1 and FD37 were co-deposited at the weight ratio of 95:5 on the lower emission layer to form an upper emission layer having a thickness of 100 Å, thereby forming a third emission layer, and the third buffer layer was formed on the third emission layer.

Example 2-8

A light-emitting device was manufactured in the same manner as used in Example 2-7, except that Compound 1 was used instead of Compound B to form a lower emission layer and Compound B was used instead of Compound 1 to form an upper emission layer, thereby forming a first emission layer, a second emission layer, and a third emission layer.

Comparative Example 2-5

A light-emitting device was manufactured in the same manner as used in Comparative Example 2-7, except that Compound A was used instead of Compound B to form a lower emission layer and Compound B was used instead of Compound 1 to form an upper emission layer.

Comparative Example 2-6

A light-emitting device was manufactured in the same manner as used in Example 2-7, except that Compound A was used instead of Compound 1 to form an upper emission layer.

Comparative Example 2-7

A light-emitting device was manufactured in the same manner as used in Example 2-7, except that Compound 1 was used instead of Compound B to form a lower emission layer and Compound 2 was used instead of Compound 1 to form an upper emission layer.

Comparative Example 2-8

A light-emitting device was manufactured in the same manner as used in Example 2-7, except that Compound 2 was used instead of Compound B to form a lower emission layer.

Evaluation Example 2

With respect to the light-emitting devices manufactured according to Examples 2-1 to 2-8 and Comparative Examples 2-1 to 2-8, the driving voltage (V) at 1500 nit of luminance, efficiency (Cd/A/y), and lifespan ($T_{97}$) were measured by using a color luminance meter, a Keithley source meter apparatus, and a fixed current room-temperature lifespan apparatus. Results thereof are shown in Table 2.

The driving voltage, efficiency, and lifespan of the light-emitting devices of Examples 2-1 to 2-8 and Comparative Examples 2-1 to 2-8 were evaluated based on 100% of the driving voltage, efficiency, and lifespan of the light-emitting device of Comparative Example 2-1, respectively.

TABLE 2

| | Emission layer host | | | | | | |
|---|---|---|---|---|---|---|---|
| | lower emission layer | upper emission layer | Driving voltage (V) | Efficiency (cd/A) | Lifespan ($T_{97}$) | Luminance (nit) | Remarks |
| Comparative Example 2-1 | Compound B | | 100% | 100% | 100% | 1500 | Single emission layer |

TABLE 2-continued

| | Emission layer host | | | | | | |
|---|---|---|---|---|---|---|---|
| | lower emission layer | upper emission layer | Driving voltage (V) | Efficiency (cd/A) | Lifespan ($T_{97}$) | Luminance (nit) | Remarks |
| Comparative Example 2-2 | Compound 2 | | 115% | 90% | 130% | 1500 | Single emission layer |
| Comparative Example 2-3 | Compound A | | 100% | 105% | 85% | 1500 | Single emission layer |
| Comparative Example 2-4 | Compound 1 | | 120% | 90% | 120% | 1500 | Single emission layer |
| Example 2-1 | Compound B | Compound 1 | 105% | 105% | 150% | 1500 | First emission layer |
| Example 2-2 | Compound 1 | Compound B | 105% | 105% | 160% | 1500 | First emission layer |
| Example 2-3 | Compound B | Compound 1 | 105% | 125% | 200% | 1500 | Second emission layer |
| Example 2-4 | Compound 1 | Compound B | 105% | 125% | 250% | 1500 | Second emission layer |
| Example 2-5 | Compound B | Compound 1 | 105% | 105% | 150% | 1500 | Third emission layer |
| Example 2-6 | Compound 1 | Compound B | 105% | 105% | 170% | 1500 | Third emission layer |
| Example 2-7 | Compound B | Compound 1 | 105% | 130% | 250% | 1500 | All emission layers |
| Example 2-8 | Compound 1 | Compound B | 105% | 135% | 300% | 1500 | All emission layers |
| Comparative Example 2-5 | Compound A | Compound B | 105% | 120% | 80% | 1500 | All emission layers |
| Comparative Example 2-6 | Compound B | Compound A | 105% | 120% | 75% | 1500 | All emission layers |
| Comparative Example 2-7 | Compound 1 | Compound 2 | 105% | 105% | 120% | 1500 | All emission layers |
| Comparative Example 2-8 | Compound 2 | Compound 1 | 105% | 105% | 120% | 1500 | All emission layers |

Referring to Table 2, compared to the light-emitting devices of Comparative Examples 2-1 to 2-4, which have a single emission layer, the light-emitting devices of Examples 2-1 to 2-8 are equivalent or lower driving voltage, and remarkably high efficiency and lifespan characteristics.

In the case of the light-emitting devices of Comparative Examples 2-5 to 2-8, which do not have, as the structure of an emission layer, the double-layered emission layer including an emission layer including a deuterium-substituted host and an emission layer including a deuterium-unsubstituted host, the characteristics of the driving voltage, efficiency, and lifespan were not substantially better than the light-emitting devices of Examples 2-1 to 2-8.

Compared to a case in which a double-layered emission layer structure having the structure of an emission layer in which an emission layer includes a deuterium-substituted host and an emission layer includes a deuterium-unsubstituted host, is formed in an emitting unit close to an anode (Examples 2-1 and 2-2), a case in which the double-layered emission layer is formed in other emission layers (Examples 2-3 to 2-6), higher efficiency and longer lifespan characteristics were obtained. When all the emission layers have the double-layered emission layer (Examples 2-7 and 2-8), the efficiency and lifespan characteristics were remarkably improved without a large increase in driving voltage.

Comparative Example 3-1

A light-emitting device was manufactured in the same manner as used in Comparative Example 2-1, except that, on the third emitting unit, BCP and Li (the amount of Li was 1 wt %) were co-deposited to form an n-type charge generation layer having a thickness of 100 Å, and HAT-CN was deposited to form a p-type charge generation layer having a thickness of 50 Å, thereby forming a third charge generation layer, on the third charge generation layer, NPB (600 Å) was deposited to form a fourth hole transport (HT)-auxiliary layer, TCTA (50 Å) was deposited to form an electron blocking layer, TPBi and PD13 were co-deposited at the weight ratio of 95:5 to form a fourth emission layer having a thickness of 200 Å, and ET47 and LiQ were co-deposited at the ratio of 5:5 to form a fourth electron transport layer having a thickness of 300 Å, thereby completing a fourth emitting unit, and on the fourth emitting unit, Yb (10 Å) was deposited to form an electron injection layer.

Comparative Example 3-2

A light-emitting device was manufactured in the same manner as in Comparative Example 3-1, except that, as a host, Compound 2 was used instead of Compound B.

Comparative Example 3-3

A light-emitting device was manufactured in the same manner as in Comparative Example 3-1, except that Compound A was used as a host instead of Compound B.

Comparative Example 3-4

A light-emitting device was manufactured in the same manner as in Comparative Example 3-1, except that, as a host, Compound 1 was used instead of Compound B.

Example 3-1

A light-emitting device was manufactured in the same manner as used in Comparative Example 3-1, except that, on the hole transport layer, Compound B and FD37 were co-deposited at the weight ratio of 95:5 to form a lower emission layer having a thickness of 100 Å and Compound 1 and FD37 were co-deposited at the weight ratio of 95:5 on the lower emission layer to form an upper emission layer having a thickness of 100 Å, thereby forming a first emission layer, and the first buffer layer was formed on the first emission layer.

Example 3-2

A light-emitting device was manufactured in the same manner as used in Example 3-1, except that Compound 1 was used instead of Compound B to form a lower emission layer and Compound B was used instead of Compound 1 to form an upper emission layer.

Example 3-3

A light-emitting device was manufactured in the same manner as used in Comparative Example 3-1, except that, on the second hole transport (HT)-auxiliary layer, Compound B and FD37 were co-deposited at the weight ratio of 95:5 to form a lower emission layer having a thickness of 100 Å and Compound 1 and FD37 were co-deposited at the weight ratio of 95:5 on the lower emission layer to form an upper emission layer having a thickness of 100 Å, thereby forming a second emission layer, and the second buffer layer was formed on the second emission layer.

Example 3-4

A light-emitting device was manufactured in the same manner as used in Example 3-3, except that Compound 1 was used instead of Compound B to form a lower emission layer and Compound B was used instead of Compound 1 to form an upper emission layer.

Example 3-5

A light-emitting device was manufactured in the same manner as used in Comparative Example 3-1, except that, on the third hole transport (HT)-auxiliary layer, Compound B and FD37 were co-deposited at the weight ratio of 95:5 to form a lower emission layer having a thickness of 100 Å and Compound 1 and FD37 were co-deposited at the weight ratio of 95:5 on the lower emission layer to form an upper emission layer having a thickness of 100 Å, thereby forming a third emission layer, and the third buffer layer was formed on the third emission layer.

Example 3-6

A light-emitting device was manufactured in the same manner as used in Example 3-5, except that Compound 1 was used instead of Compound B to form a lower emission layer and Compound B was used instead of Compound 1 to form an upper emission layer.

Example 3-7

A light-emitting device was manufactured in the same manner as used in Comparative Example 2-1, except that, on the hole transport layer, Compound B and FD37 were co-deposited at the weight ratio of 95:5 to form a lower emission layer having a thickness of 100 Å and Compound 1 and FD37 were co-deposited at the weight ratio of 95:5 on the lower emission layer to form an upper emission layer having a thickness of 100 Å, thereby forming a first emission layer, and the first buffer layer was formed on the first emission layer, on the second hole transport (HT)-auxiliary layer, Compound B and FD37 were co-deposited at the weight ratio of 95:5 to form a lower emission layer having a thickness of 100 Å and Compound 1 and FD37 were co-deposited at the weight ratio of 95:5 on the lower emission layer to form an upper emission layer having a thickness of 100 Å, thereby forming a second emission layer, and the second buffer layer was formed on the second emission layer, and A light-emitting device was manufactured in the same manner as used in Comparative Example 3-1, except that, on the third hole transport (HT)-auxiliary layer, Compound B and FD37 were co-deposited at the weight ratio of 95:5 to form a lower emission layer having a thickness of 100 Å and Compound 1 and FD37 were co-deposited at the weight ratio of 95:5 on the lower emission layer to form an upper emission layer having a thickness of 100 Å, thereby forming a third emission layer, and the third buffer layer was formed on the third emission layer.

Example 3-8

A light-emitting device was manufactured in the same manner as used in Example 3-7, except that Compound 1 was used instead of Compound B to form a lower emission layer and Compound B was used instead of Compound 1 to form an upper emission layer, thereby forming a first emission layer, a second emission layer, and a third emission layer.

Comparative Example 3-5

A light-emitting device was manufactured in the same manner as used in Example 3-8, except that Compound A was used instead of Compound 1 to form a lower emission layer.

Comparative Example 3-6

A light-emitting device was manufactured in the same manner as used in Example 3-8, except that Compound B was used instead of Compound 1 to form a lower emission layer and Compound A was used instead of Compound B to form an upper emission layer.

Comparative Example 3-7

A light-emitting device was manufactured in the same manner as used in Example 3-8, except that Compound 2 was used instead of Compound B to form an upper emission layer.

Comparative Example 3-8

A light-emitting device was manufactured in the same manner as used in Example 3-8, except that Compound 2 was used instead of Compound 1 to form a lower emission layer and Compound 1 was used instead of Compound B to form an upper emission layer.

Evaluation Example 3

With respect to the light-emitting devices manufactured according to Examples 3-1 to 3-8 and Comparative Examples 3-1 to 3-8, the driving voltage (V) at 1500 nit of luminance, efficiency (Cd/A/y), and lifespan ($T_{97}$) were measured by using a color luminance meter, a Keithley source meter apparatus, and a fixed current room-temperature lifespan apparatus. Results thereof are shown in Table 3.

The driving voltage, efficiency, and lifespan of the light-emitting devices of Examples 3-1 to 3-8 and Comparative Examples 3-1 to 3-8 were evaluated based on 100% of the driving voltage, efficiency, and lifespan of the light-emitting device of Comparative Example 3-1, respectively.

TABLE 3

| | Emission layer host | | | | | | |
|---|---|---|---|---|---|---|---|
| | lower emission layer | upper emission layer | Driving voltage (V) | Efficiency (cd/A) | Lifespan ($T_{97}$) | Luminance (nit) | Remarks |
| Comparative Example 3-1 | Compound B | | 100% | 100% | 100% | 1500 | Single emission layer |
| Comparative Example 3-2 | Compound 2 | | 120% | 90% | 130% | 1500 | Single emission layer |
| Comparative Example 3-3 | Compound A | | 100% | 100% | 90% | 1500 | Single emission layer |
| Comparative Example 3-4 | Compound 1 | | 115% | 90% | 120% | 1500 | Single emission layer |
| Example 3-1 | Compound B | Compound 1 | 105% | 105% | 140% | 1500 | First emission layer |
| Example 3-2 | Compound 1 | Compound B | 105% | 105% | 155% | 1500 | First emission layer |
| Example 3-3 | Compound B | Compound 1 | 105% | 125% | 210% | 1500 | Second emission layer |
| Example 3-4 | Compound 1 | Compound B | 105% | 125% | 240% | 1500 | Second emission layer |
| Example 3-5 | Compound B | Compound 1 | 105% | 125% | 230% | 1500 | Third emission layer |
| Example 3-6 | Compound 1 | Compound B | 105% | 125% | 250% | 1500 | Third emission layer |
| Example 3-7 | Compound B | Compound 1 | 105% | 140% | 300% | 1500 | All emission layers |
| Example 3-8 | Compound 1 | Compound B | 105% | 145% | 350% | 1500 | All emission layers |

TABLE 3-continued

| | Emission layer host | | | | | | |
|---|---|---|---|---|---|---|---|
| | lower emission layer | upper emission layer | Driving voltage (V) | Efficiency (cd/A) | Lifespan ($T_{97}$) | Luminance (nit) | Remarks |
| Comparative Example 3-5 | Compound A | Compound B | 100% | 110% | 140% | 1500 | All emission layers |
| Comparative Example 3-6 | Compound B | Compound A | 100% | 115% | 135% | 1500 | All emission layers |
| Comparative Example 3-7 | Compound 1 | Compound 2 | 115% | 90% | 150% | 1500 | All emission layers |
| Comparative Example 3-8 | Compound 2 | Compound 1 | 125% | 90% | 145% | 1500 | All emission layers |

Referring to Table 3, compared to the light-emitting devices of Comparative Examples 3-1 to 3-4, which have a single emission layer, the light-emitting devices of Examples 3-1 to 3-8 are equivalent or lower driving voltage, and remarkably high efficiency and lifespan characteristics.

In the case of the light-emitting devices of Comparative Examples 3-5 to 3-8, which do not have, as the structure of an emission layer, the double-layered emission layer including an emission layer including a deuterium-substituted host and an emission layer including a deuterium-unsubstituted host, the characteristics of the driving voltage, efficiency, or lifespan were not substantially better than the light-emitting devices of Examples 3-1 to 3-8.

Compared to a case in which a double-layered emission layer structure having the structure of an emission layer in which an emission layer includes a deuterium-substituted host and an emission layer includes a deuterium-unsubstituted host, is formed in an emitting unit close to an anode (Examples 3-1 and 3-2), a case in which the double-layered emission layer is formed in other emission layers (Examples 3-3 to 3-6), higher efficiency and longer lifespan characteristics were obtained. When all the emission layers have the double-layered emission layer (Examples 3-7 and 3-8), the efficiency and lifespan characteristics were remarkably improved without a large increase in driving voltage.

Comparative Example 4-1

A light-emitting device was manufactured in the same manner as used in Comparative Example 2-1.

Comparative Example 4-2

A light-emitting device was manufactured in the same manner as used in Comparative Example 2-3.

Example 4-1

A light-emitting device was manufactured in the same manner as used in Comparative Example 4-1, except that, on the hole transport layer, Compound A and FD37 were co-deposited at the weight ratio of 95:5 to form a lower emission layer having a thickness of 100 Å and Compound 8 and FD37 were co-deposited at the weight ratio of 95:5 on the lower emission layer to form an upper emission layer having a thickness of 100 Å, thereby forming a first emission layer, and the first buffer layer was formed on the first emission layer, on the second hole transport (HT)-auxiliary layer, Compound A and FD37 were co-deposited at the weight ratio of 95:5 to form a lower emission layer having a thickness of 100 Å and Compound 8 and FD37 were co-deposited at the weight ratio of 95:5 on the lower emission layer to form an upper emission layer having a thickness of 100 Å, thereby forming a second emission layer, and the second buffer layer was formed on the second emission layer, and on the third hole transport (HT)-auxiliary layer, Compound A and FD37 were co-deposited at the weight ratio of 95:5 to form a lower emission layer having a thickness of 100 Å and Compound 8 and FD37 were co-deposited at the weight ratio of 95:5 on the lower emission layer to form an upper emission layer having a thickness of 100 Å, thereby forming a third emission layer, and the third buffer layer was formed on the third emission layer.

Example 4-2 to Example 4-16

Light-emitting devices were manufactured in the same manner as used in Example 4-1, except that the hosts of the lower emission layer and the upper emission layer shown in Table 4 were used.

Evaluation Example 4

With respect to the light-emitting devices manufactured according to Examples 4-1 to 4-16 and Comparative Examples 4-1 and 4-2, the driving voltage (V) at 1500 nit of luminance, efficiency (Cd/A/y), and lifespan ($T_{97}$) were measured by using a color luminance meter, a Keithley source meter apparatus, and a fixed current room-temperature lifespan apparatus. Results thereof are shown in Table 4.

The driving voltage, efficiency, and lifespan of the light-emitting devices of Examples 4-1 to 4-16 and Comparative Examples 4-1 and 4-2 were evaluated based on 100% of the driving voltage, efficiency, and lifespan of the light-emitting device of Comparative Example 1-1, respectively.

TABLE 4

| | Emission layer host | | | | | | |
|---|---|---|---|---|---|---|---|
| | lower emission layer | upper emission layer | Driving voltage (V) | Efficiency (cd/A) | Lifespan ($T_{97}$) | Luminance (nit) | Remarks |
| Comparative Example 4-1 | Compound B | | 100% | 100% | 100% | 1500 | Single emission layer |
| Comparative Example 4-2 | Compound A | | 100% | 105% | 85% | 1500 | Single emission layer |
| Example 4-1 | Compound A | Compound 8 | 105% | 130% | 250% | 1500 | All emission layers |
| Example 4-2 | | Compound 9 | 100% | 130% | 250% | 1500 | All emission layers |
| Example 4-3 | | Compound 10 | 105% | 135% | 190% | 1500 | All emission layers |
| Example 4-4 | | Compound 3 | 105% | 140% | 185% | 1500 | All emission layers |
| Example 4-5 | | Compound 4 | 100% | 135% | 210% | 1500 | All emission layers |
| Example 4-6 | | Compound 5 | 105% | 140% | 180% | 1500 | All emission layers |
| Example 4-7 | | Compound 6 | 100% | 130% | 200% | 1500 | All emission layers |
| Example 4-8 | | Compound 7 | 105% | 135% | 250% | 1500 | All emission layers |
| Example 4-9 | Compound B | Compound 8 | 100% | 120% | 210% | 1500 | All emission layers |
| Example 4-10 | | Compound 9 | 105% | 130% | 200% | 1500 | All emission layers |
| Example 4-11 | | Compound 10 | 110% | 125% | 200% | 1500 | All emission layers |
| Example 4-12 | | Compound 3 | 105% | 135% | 220% | 1500 | All emission layers |
| Example 4-13 | | Compound 4 | 105% | 140% | 200% | 1500 | All emission layers |
| Example 4-14 | | Compound 5 | 110% | 140% | 190% | 1500 | All emission layers |
| Example 4-15 | | Compound 6 | 105% | 135% | 190% | 1500 | All emission layers |
| Example 4-16 | | Compound 7 | 100% | 135% | 240% | 1500 | All emission layers |

Referring to Table 4, it can be seen that, compared to the light-emitting devices of Comparative Examples 4-1 and 4-2, which have a single emission layer, the light-emitting devices of Example 4-1 to 4-6 have remarkably high efficiency and lifespan characteristics, while retaining equivalent driving voltage.

The light-emitting devices according to embodiments of the disclosure have low driving voltage, high efficiency, and long lifespan.

It should be understood that embodiments described herein should be considered in a descriptive sense only and not for purposes of limitation. Descriptions of features or aspects within each embodiment should typically be considered as available for other similar features or aspects in other embodiments. While embodiments have been described with reference to the figures, it will be understood by those of ordinary skill in the art that various changes in form and details may be made therein without departing from the spirit and scope as defined by the following claims.

What is claimed is:

1. A light-emitting device comprising:

a first electrode;

a second electrode facing the first electrode;

m emitting units disposed between the first electrode and the second electrode; and m−1 charge generation layers disposed between two neighboring ones of the m emitting units and including an n-type charge generation layer and a p-type charge generation layer, wherein m is an integer of 3 or more, the m emitting units each include a hole transport region, an emission layer, and an electron transport region, at least one emission layer of the m emitting units includes:

a first emission layer including a first compound; and a second emission layer including a second compound, the first emission layer and the second emission layer directly contact each other, the first compound comprises at least one deuterium (D), and the second compound does not comprise deuterium.

2. The light-emitting device of claim 1, wherein two or more emission layers of the m emitting units each include a first emission layer and a second emission layer, and the two or more emission layers each independently include:

a first emission layer and a second emission layer disposed between the first emission layer and the second electrode, or a first emission layer and a second emission layer disposed between the first electrode and the first emission layer.

3. The light-emitting device of claim 1, wherein the first emission layer comprises a first dopant, the second emission layer comprises a second dopant, and the first dopant and the second dopant are identical to or different from each other.

4. The light-emitting device of claim 3, wherein the first dopant comprises a phosphorescent dopant, a fluorescent dopant, a delayed fluorescence material, or a combination thereof, and the second dopant comprises a phosphorescent dopant, a fluorescent dopant, a delayed fluorescence material, or a combination thereof.

5. The light-emitting device of claim 4, wherein the first dopant and the second dopant satisfy one selected from (a) to (i):

(a) the first dopant is a fluorescent dopant and the second dopant is a fluorescent dopant, (b) the first dopant is a phosphorescent dopant and the second dopant is a phosphorescent dopant, (c) the first dopant is a phosphorescent dopant and the second dopant is a fluorescent dopant, (d) the first dopant is a phosphorescent dopant and the second dopant is a delayed fluorescence material, (e) the first dopant is a fluorescent dopant and the second dopant is a phosphorescent dopant, (f) the first dopant is a fluorescent dopant and the second dopant is a delayed fluorescence material, (g) the first dopant is a delayed fluorescence material and the second dopant is a phosphorescent dopant, (h) the first dopant is a delayed fluorescence material and the second dopant is a fluorescent dopant, (i) the first dopant is a delayed fluorescence material and the second dopant is a delayed fluorescence material.

6. The light-emitting device of claim 1, wherein a maximum luminescence wavelength of light emitted from at least one emitting unit of the m emitting units is different from a maximum emission wavelength of light emitted from at least one emitting unit of the remaining emitting units.

7. The light-emitting device of claim 1, wherein light emitted from each of the m emitting units have a same maximum luminescence wavelength.

8. The light-emitting device of claim 1, wherein the at least one emission layer of the m emitting units including the first emission layer and the second emission layer emits blue light having a maximum luminescence wavelength in a range of about 440 nm to about 510 nm.

9. The light-emitting device of claim 1, wherein the light-emitting device further includes at least one of:

a first capping layer disposed outside the first electrode; and a second capping layer disposed outside the second electrode, and at least one of the first capping layer and the second capping layer includes a material having a refractive index equal to or greater than about 1.6 at a wavelength of 589 nm.

10. The light-emitting device of claim 1, wherein the first compound is represented by Formula 1:

$$[Ar_1]_{b1}\text{-}[(L_1)_{a1}\text{-}R_1]_{c1} \qquad \text{[Formula 1]}$$

wherein in Formula 1, $Ar_1$ and $L_1$ are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, b1 is 1, 2, or 3, a1 is an integer from 0 to 5, $R_1$ is hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, c1 is an integer from 1 to 5, $R_{10a}$ is:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or a combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or a combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl ; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof, and Formula 1 includes at least one deuterium.

11. The light-emitting device of claim 1, wherein the second compound is represented by Formula 2:

$$[Ar_2]_{b2}\text{-}[(L_2)_{a2}\text{-}R_2]_{c2} \qquad \text{[Formula 2]}$$

wherein in Formula 2, $Ar_2$ and $L_2$ are each independently a $C_3$-$C_{60}$ carbocyclic group unsubstituted or substituted with at least one $R_{20a}$ or a $C_1$-$C_0$ heterocyclic group unsubstituted or substituted with at least one $R_{20a}$, b2 is 1, 2, or 3, a2 is an integer from 0 to 5, $R_2$ is hydrogen, —F, —Cl, —Br, —I, a hydroxyl group, a cyano group, a nitro group, a $C_1$-$C_{60}$ alkyl group unsubstituted or substituted with at least one $R_{20a}$, a $C_2$-$C_{60}$ alkenyl group unsubstituted or substituted with at least one $R_{20a}$, a $C_2$-$C_{60}$ alkynyl group unsubstituted or substituted with at least one $R_{20a}$, a $C_1$-$C_{60}$ alkoxy group unsubstituted or substituted with at least one $R_{20a}$, a $C_3$-$C_{60}$ carbocyclic group unsubstituted or substituted with at least one $R_{20a}$, a $C_1$-$C_{60}$ heterocyclic group unsubstituted or substituted with at least one $R_{20a}$, —Si($Q_{41}$)($Q_{42}$)($Q_{43}$), —N($Q_{41}$)($Q_{42}$), —B($Q_{41}$)($Q_{42}$), —C(═O)($Q_{41}$), —S(═O)$_2$($Q_{41}$), or —P(═O)($Q_{41}$)($Q_{42}$), c2 is an integer from 1 to 5, $R_{20a}$ is:

—F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or $C_1$-$C_{60}$ alkoxy group, each unsubstituted or substituted with —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{51}$)($Q_{52}$)($Q_{53}$), —N($Q_{51}$)($Q_{52}$), —B($Q_{51}$)($Q_{52}$), —C(═O)($Q_{51}$), —S(═O)$_2$($Q_{51}$), —P(═O)($Q_{51}$)($Q_{52}$), or a combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{61}$)($Q_{62}$)($Q_{63}$), —N($Q_{61}$)($Q_{62}$), —B($Q_{61}$)($Q_{62}$), —C(═O)($Q_{61}$), —S(═O)$_2$($Q_{61}$), —P(═O)($Q_{61}$)($Q_{62}$), or a combination thereof; or —Si($Q_{71}$)($Q_{72}$)($Q_{73}$), —N($Q_{71}$)($Q_{72}$), —B($Q_{71}$)($Q_{72}$), —C(═O)($Q_{71}$), —S(═O)$_2$($Q_{71}$), or —P(═O)($Q_{71}$)($Q_{72}$), wherein $Q_{41}$ to $Q_{43}$, $Q_{51}$ to $Q_{53}$, $Q_{61}$ to $Q_{63}$, and $Q_{71}$ to $Q_{73}$ are each independently: hydrogen; —F; —Cl ; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, unsubstituted or substituted with —F, a cyano group, a $C_1$-$C_{60}$ alkyl group, a $C_1$-$C_{60}$ alkoxy group, a phenyl group, a biphenyl group, or a combination thereof, and Formula 2 does not include deuterium.

12. The light-emitting device of claim 1, wherein the hole transport region comprises a hole injection layer, a hole transport layer, or a combination thereof, the hole transport layer contacts the emission layer, and a highest occupied molecular orbital (HOMO) energy level of the hole transport layer is in a range of about −5.5 eV to about −5.25 eV.

13. An electronic apparatus, comprising the light-emitting device of claim 1.

14. The electronic apparatus of claim 13, wherein the electronic apparatus further comprises:

a substrate;

a buffer layer disposed on the substrate;

a thin-film transistor (TFT) disposed on the buffer layer, the thin-film transistor comprising an active layer, a gate electrode, a source electrode, and a drain electrode;

a passivation layer disposed on the thin-film transistor (TFT);

the light-emitting device disposed on the passivation layer; and a sealing portion disposed on the light-emitting device.

15. The electronic apparatus of claim 14, further comprising:

a functional layer including a touch screen layer, a polarizing layer, a color filter, a color conversion layer, or a combination thereof.

16. The electronic apparatus of claim 14, further comprising:

a quantum dot or an optical member including the quantum dot, wherein the quantum dot or the optical member including the quantum dot is disposed on at least one traveling direction of light emitted from the light-emitting device.

17. A light-emitting device comprising:

a first electrode;

a second electrode facing the first electrode; and an interlayer disposed between the first electrode and the second electrode and including an emission layer and a hole transport region between the first electrode and the emission layer, wherein the emission layer includes:

a first emission layer including a first compound; and a second emission layer including a second compound, the first emission layer and the second emission layer directly contact each other, the first compound comprises at least one deuterium (D), the second compound does not comprise deuterium, the hole transport region includes a hole transport layer that contacts the emission layer, and a highest occupied molecular orbital (HOMO) energy level of the hole transport layer is in a range of about −5.5 eV to about −5.25 eV.

18. An electronic apparatus, comprising the light-emitting device of claim 17.

19. The electronic apparatus of claim 18, wherein the electronic apparatus further includes:

a substrate;

a buffer layer disposed on the substrate;

a thin-film transistor (TFT) disposed on the buffer layer, the thin-film transistor including an active layer, a gate electrode, a source electrode, and a drain electrode;

a passivation layer disposed on the thin-film transistor (TFT);

the light-emitting device disposed on the passivation layer; and a sealing portion disposed on the light-emitting device.

20. The electronic apparatus of claim 19, further comprising:

a functional layer including a touch screen layer, a polarizing layer, a color filter, a color conversion layer, or a combination thereof.

* * * * *